(12) United States Patent
Ishikawa et al.

(10) Patent No.: US 7,112,760 B2
(45) Date of Patent: Sep. 26, 2006

(54) LASER ANNEALER AND LASER THIN-FILM FORMING APPARATUS

(75) Inventors: Hiromi Ishikawa, Kanagawa (JP); Akinori Harada, Kanagawa (JP); Kazuhiko Nagano, Kanagawa (JP); Yoji Okazaki, Kanagawa (JP); Takeshi Fujii, Kanagawa (JP); Hideo Yamanaka, Kanagawa (JP); Hiromitsu Yamakawa, Saitama-ken (JP)

(73) Assignees: Fuji Photo Film Co., Ltd., Kanagawa (JP); Fujinon Corporation, Saitama (JP)

( * ) Notice: Subject to any disclaimer, the term of this patent is extended or adjusted under 35 U.S.C. 154(b) by 0 days.

(21) Appl. No.: 10/456,741

(22) Filed: Jun. 9, 2003

(65) Prior Publication Data

US 2003/0226834 A1 Dec. 11, 2003

(30) Foreign Application Priority Data

| Jun. 7, 2002 | (JP) | ............... 2002-167279 |
| Jun. 7, 2002 | (JP) | ............... 2002-167280 |
| Jun. 7, 2002 | (JP) | ............... 2002-167281 |
| Jul. 8, 2002 | (JP) | ............... 2002-198248 |

(51) Int. Cl.
*B23K 26/00* (2006.01)

(52) U.S. Cl. ..................... 219/121.76; 372/6

(58) Field of Classification Search .......... 219/121.76, 219/121.78, 121.79, 121.8; 372/6
See application file for complete search history.

(56) References Cited

U.S. PATENT DOCUMENTS

| 6,362,919 B1 * | 3/2002 | Flanders .................. 359/497 |
| 6,606,180 B1 * | 8/2003 | Harada .................... 359/204 |
| 6,717,106 B1 * | 4/2004 | Nagano et al. ......... 219/121.83 |
| 6,718,088 B1 * | 4/2004 | Okazaki et al. ............... 385/27 |
| 6,750,423 B1 * | 6/2004 | Tanaka et al. ......... 219/121.73 |
| 6,754,007 B1 * | 6/2004 | Yamakawa et al. ......... 359/668 |
| 6,756,563 B1 * | 6/2004 | Gross et al. ............. 219/121.7 |
| 6,809,290 B1 * | 10/2004 | Gross et al. ........... 219/121.73 |
| 6,838,638 B1 * | 1/2005 | Satou et al. ........... 219/121.73 |
| 2002/0090172 A1 | 7/2002 | Okazaki et al. |

FOREIGN PATENT DOCUMENTS

| JP | 2002-202442 A | 7/2002 |
| JP | 2003-84221 A | 3/2003 |

OTHER PUBLICATIONS

Akito Hara, etA al.,/ Selective Single-Crystalline-Silicon Growth at the Pre-Defined Active Regions ofTFT's on a Glass by a Scanning DPSS CW Laser Irradiation./(Technical Report of IEICE) ED Oct. 2001 pp. 21-27.
Junichi Shida, et al./Poly-Silicon TFT Annealing with XeCl Excimer Laser/Laser Review Jan. 2000.

* cited by examiner

*Primary Examiner*—Jonathan Johnson
(74) *Attorney, Agent, or Firm*—Sughrue Mion, PLLC

(57) ABSTRACT

A laser annealer has a laser light source with at least one GaN-type semiconductor laser and is configured so as to form emission points that emit laser beams having a wavelength of 350 to 450 nm, and a scanning device for scanning an annealing surface with the laser beams. The laser annealer may have a spatial light modulator for modulating the laser beams, and in which pixel portions whose light modulating states change in accordance with control signals are arranged on a substrate. The invention is applied to a laser thin-film forming apparatus. The apparatus has a laser source that has at least one semiconductor laser and is configured so as to form emission points, and an optical system for focusing laser beams into a single beam in the width direction of a substrate.

14 Claims, 47 Drawing Sheets

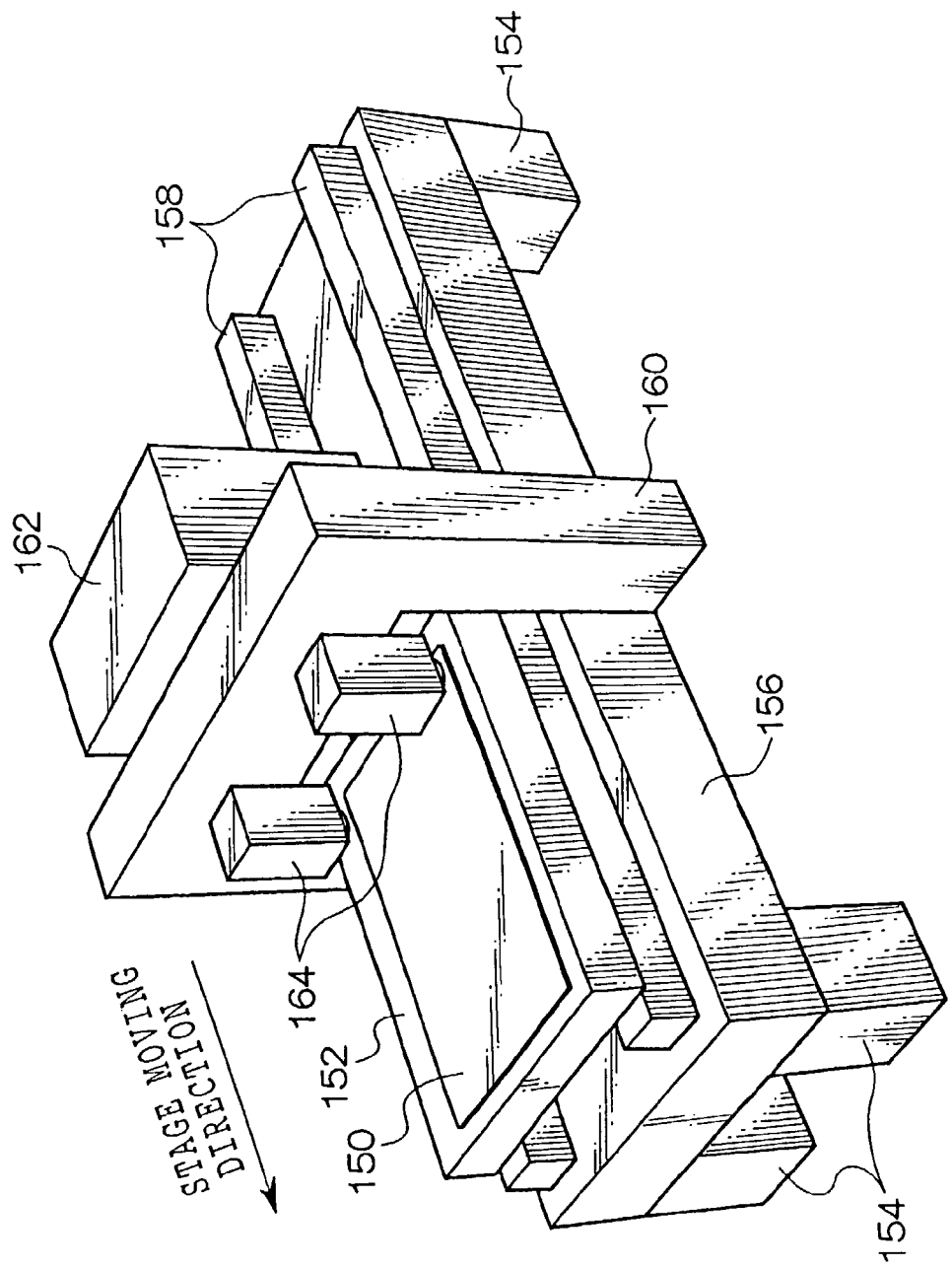

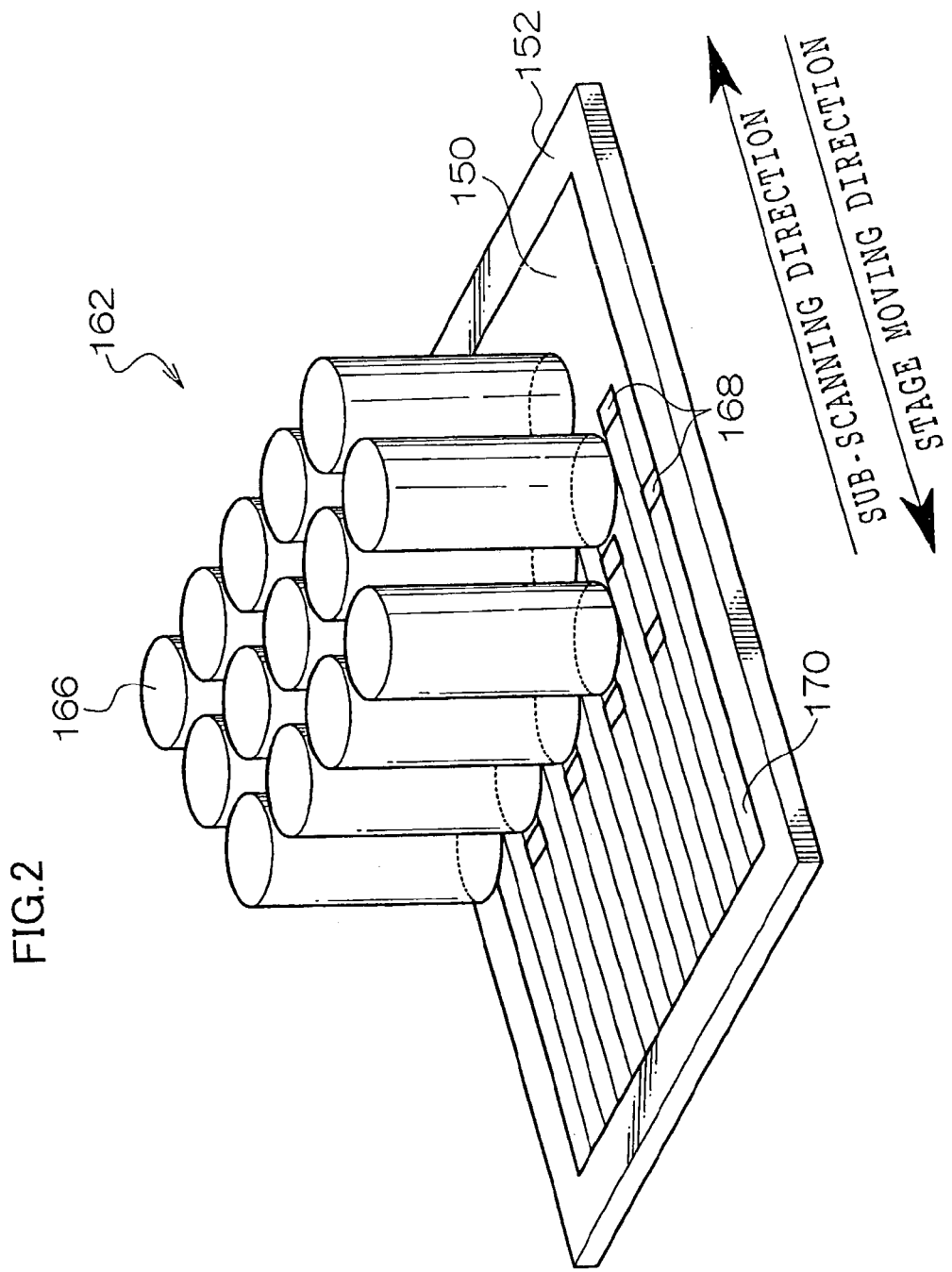

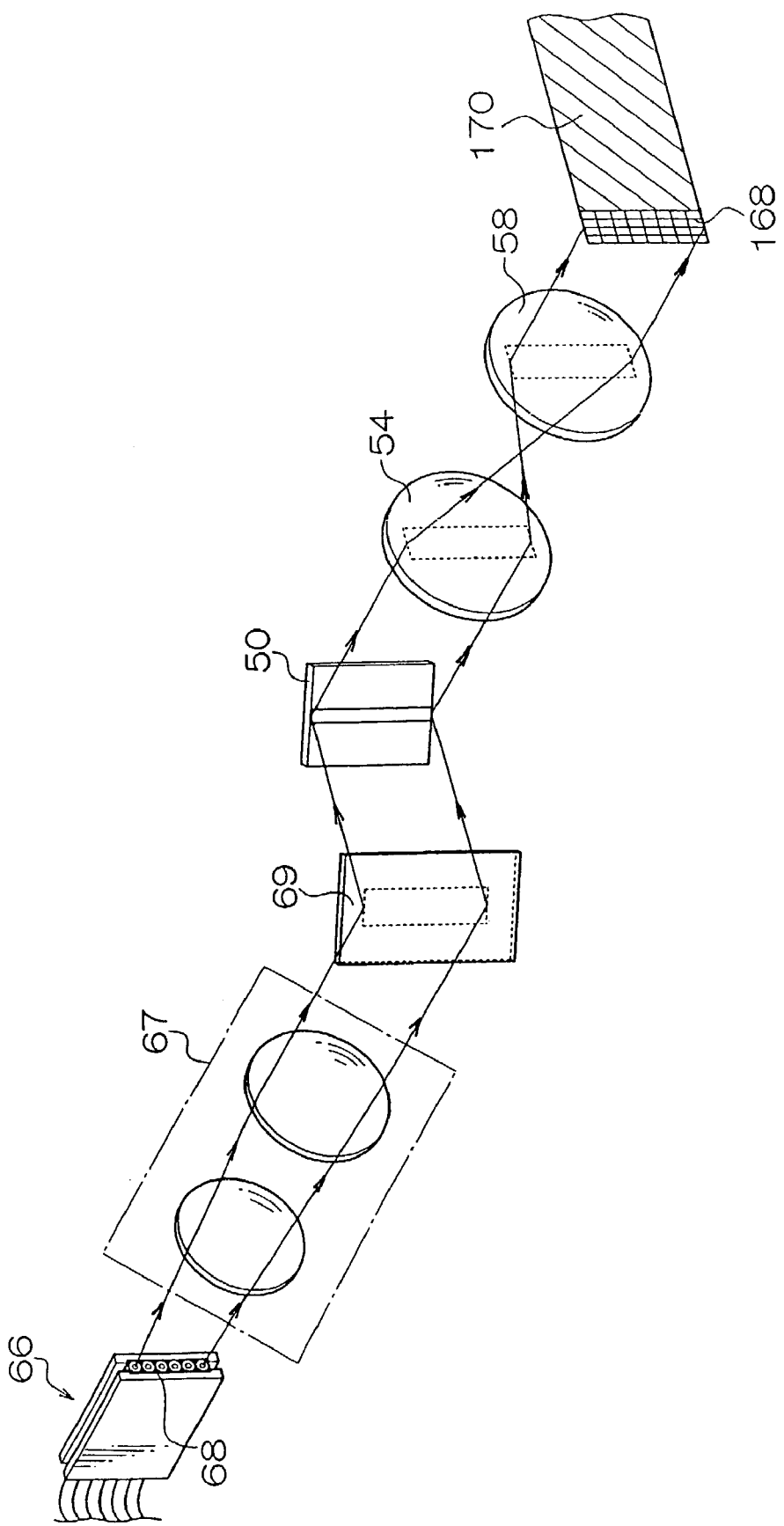

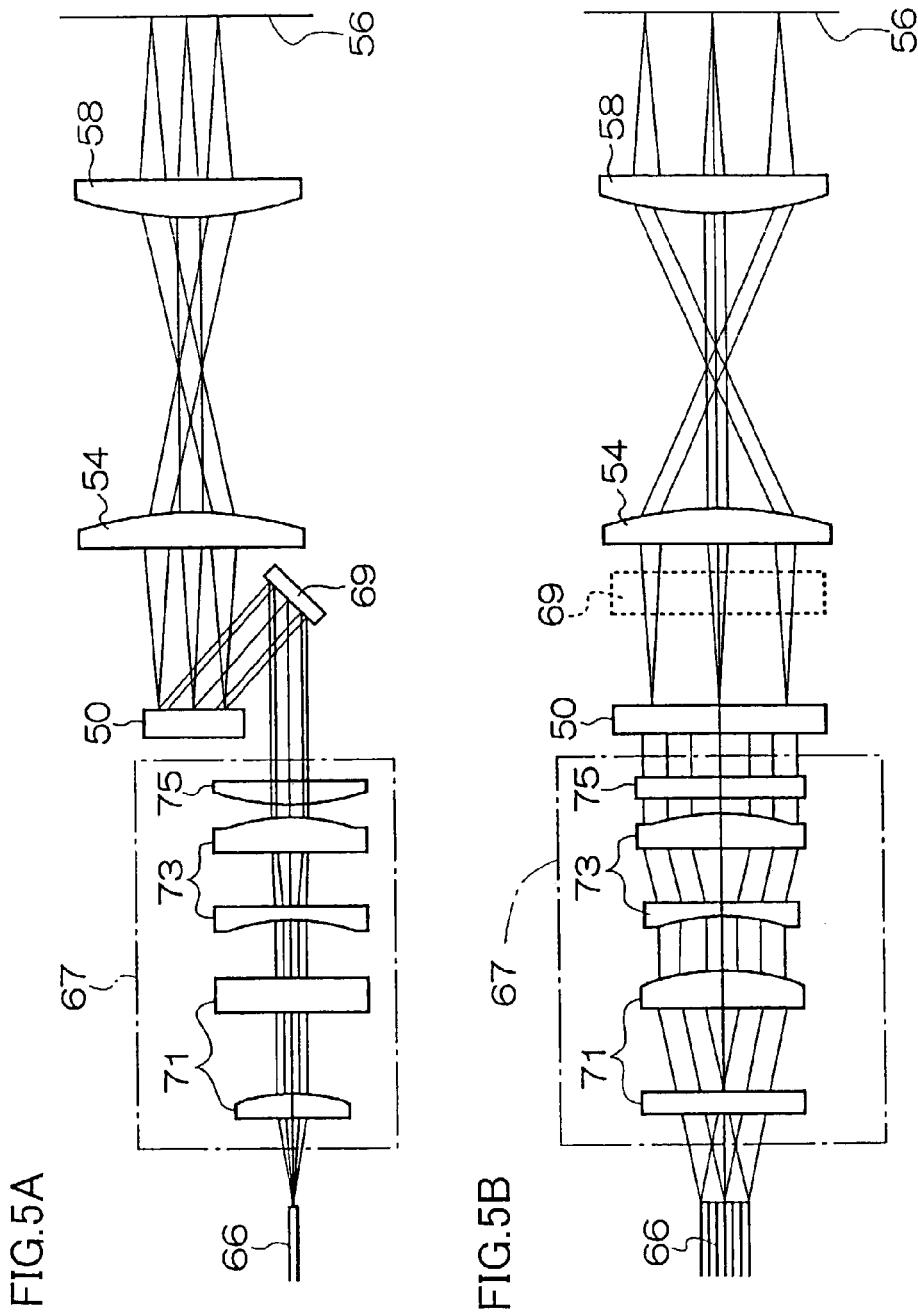

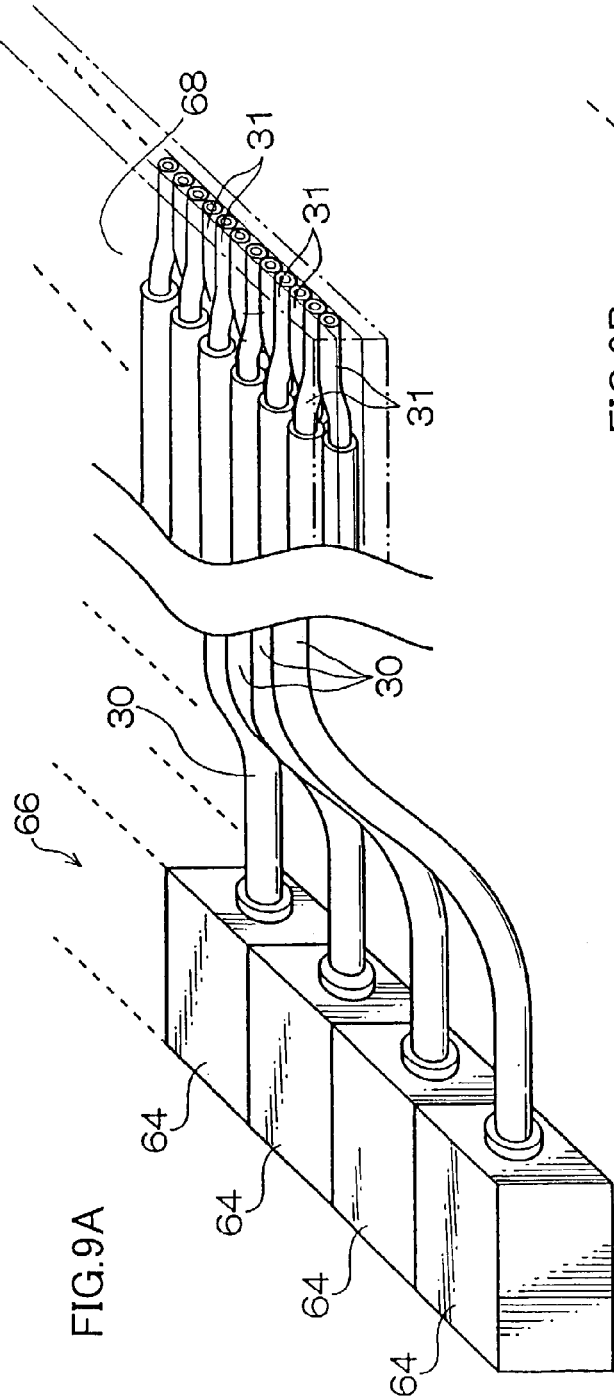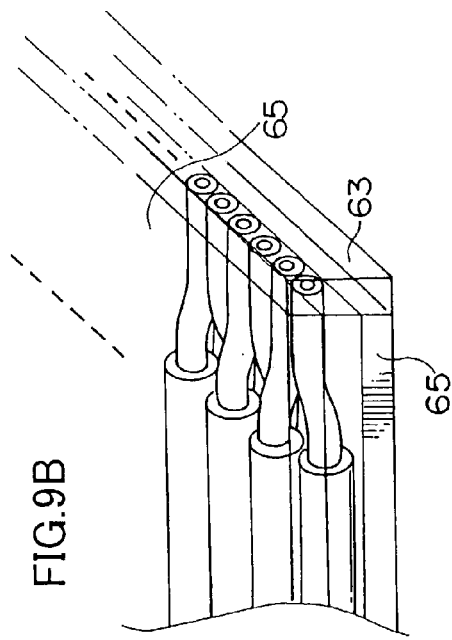

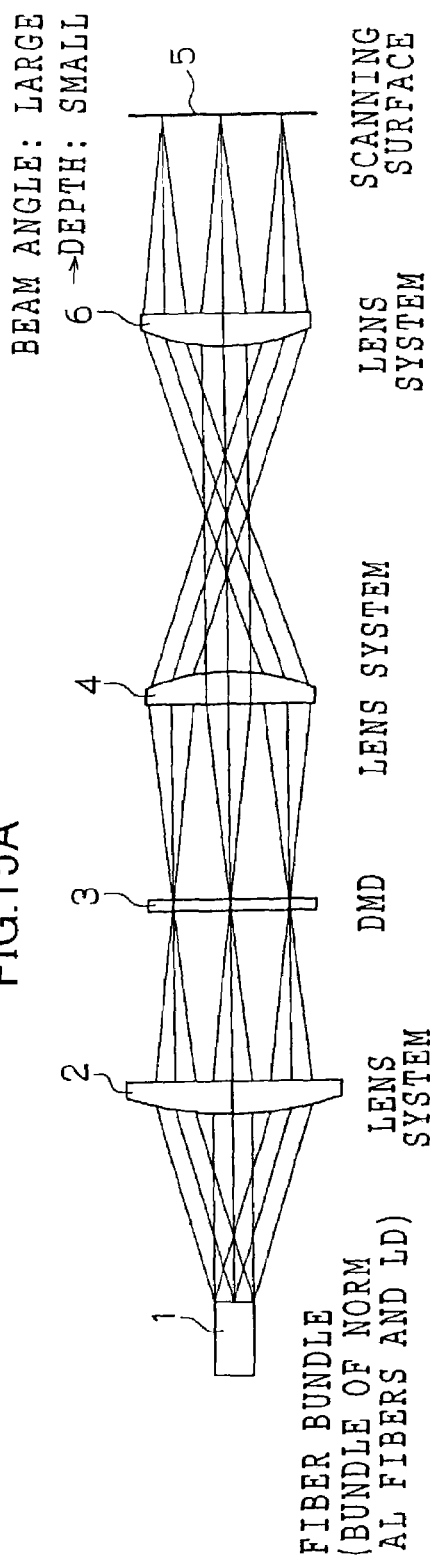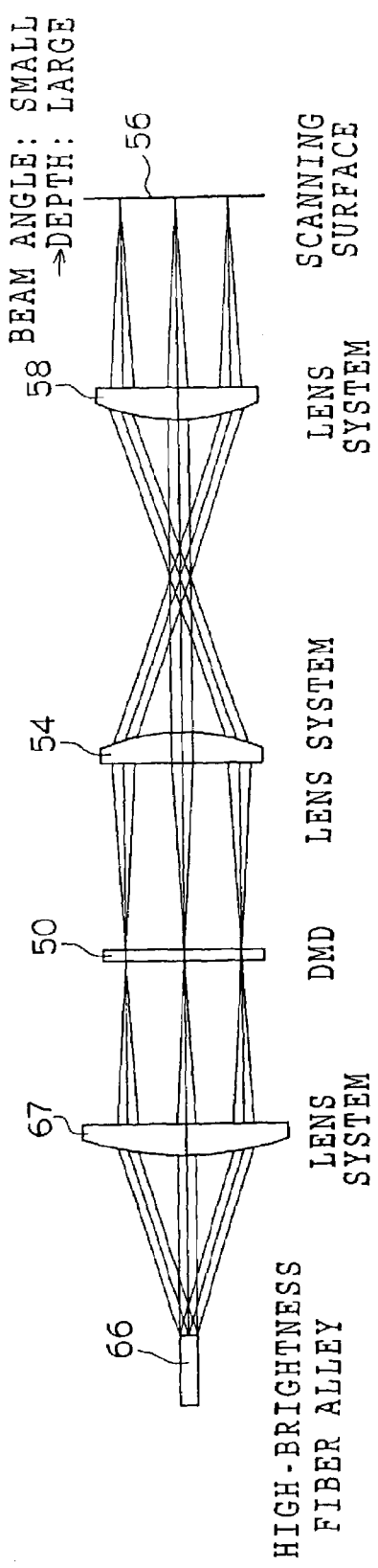

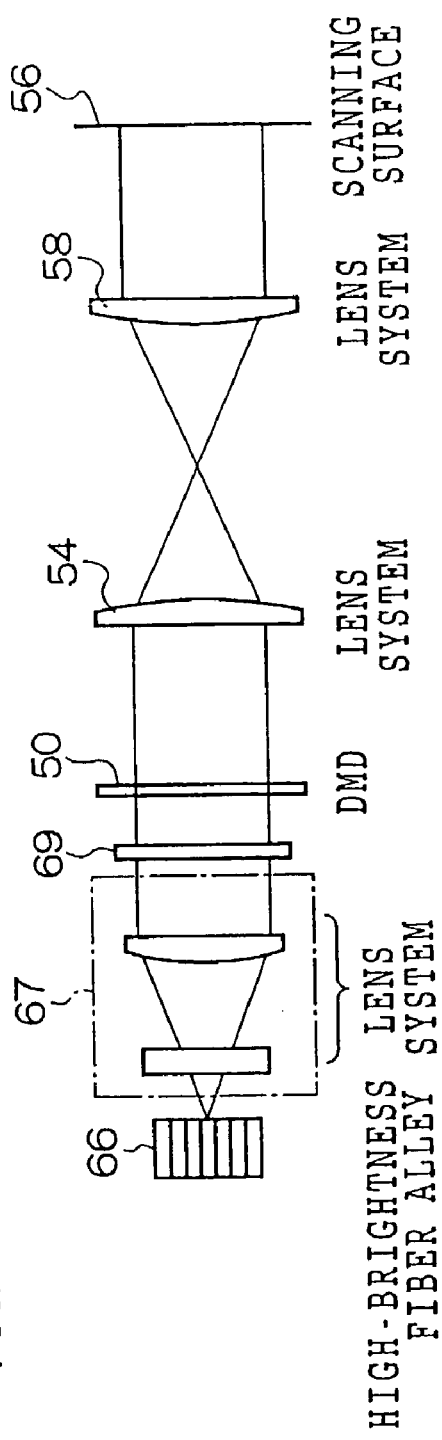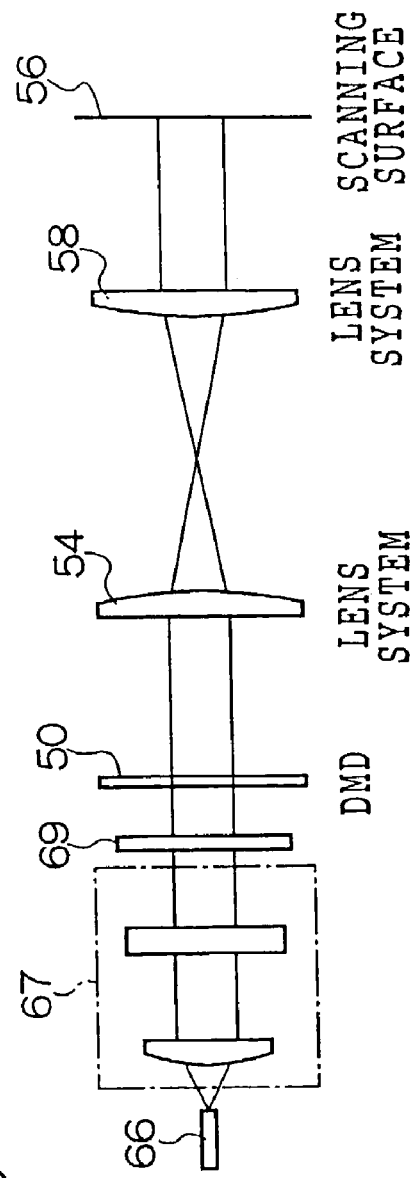
FIG.17A
FIG.17B

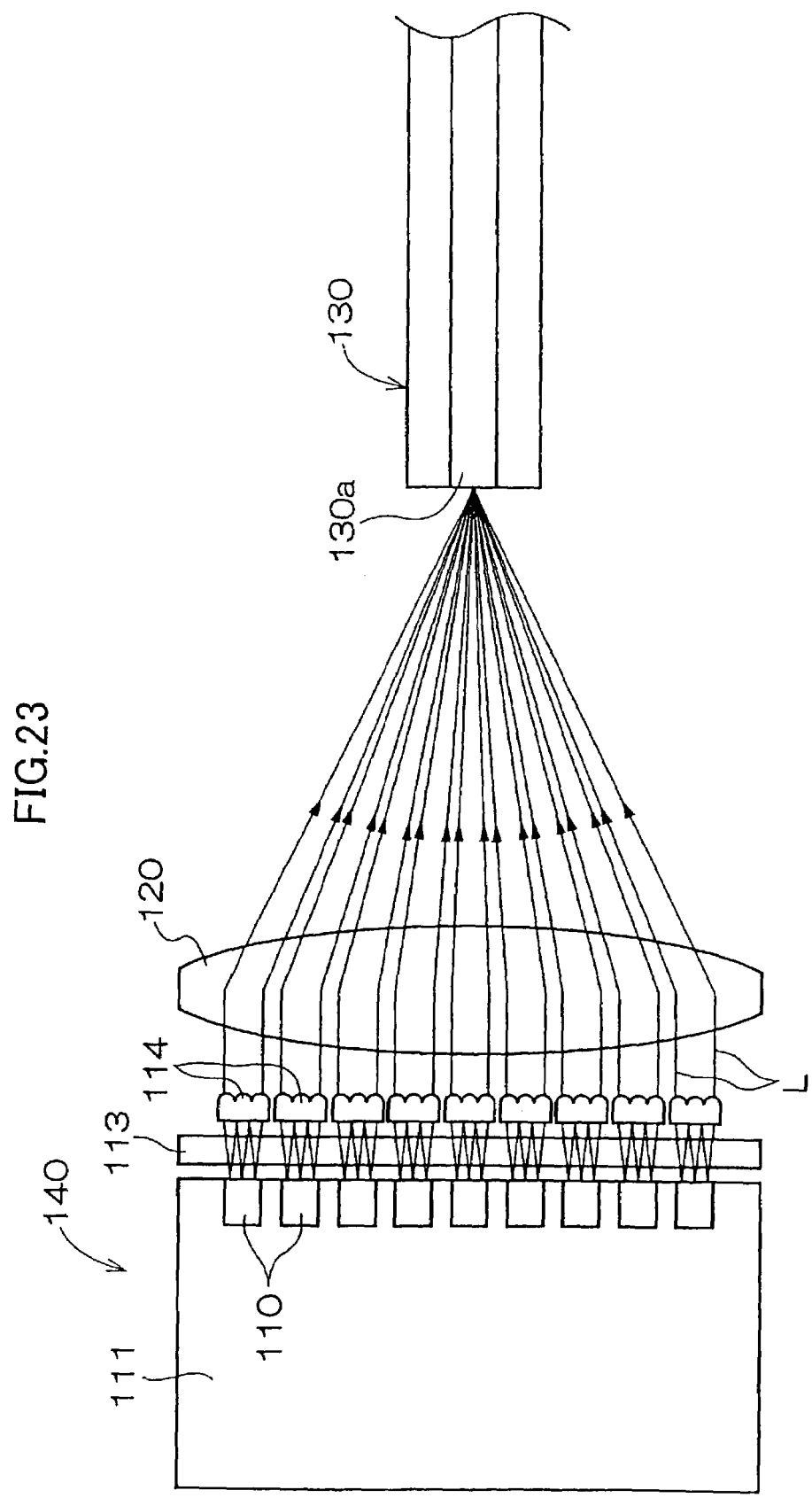

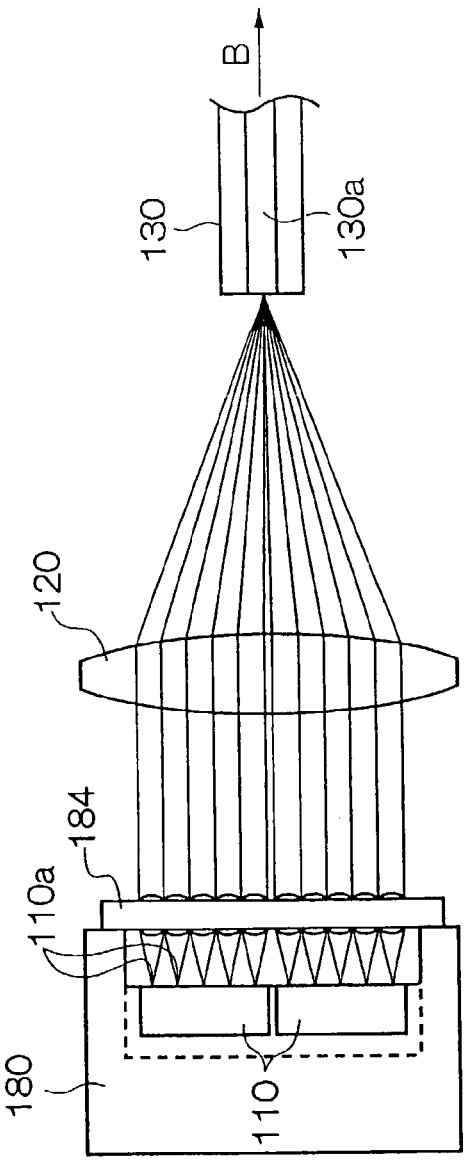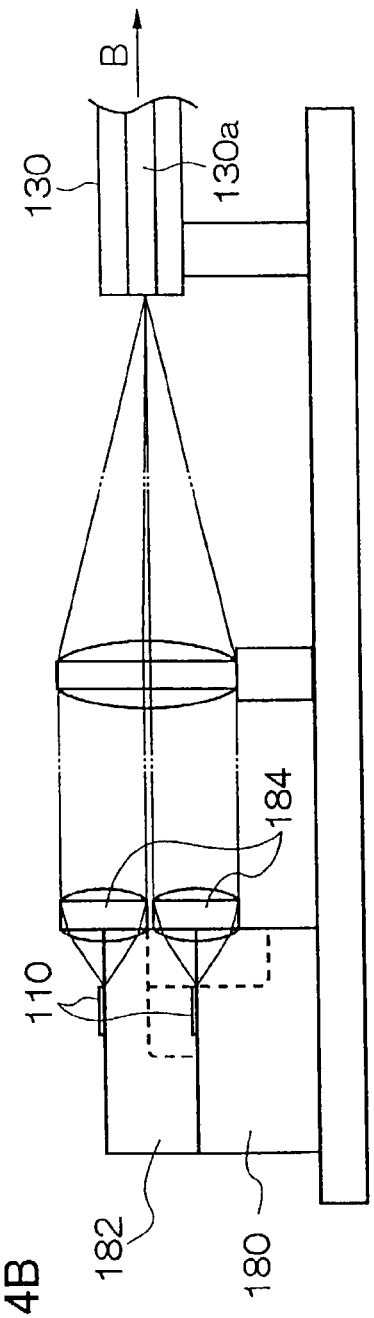
FIG.24A
FIG.24B

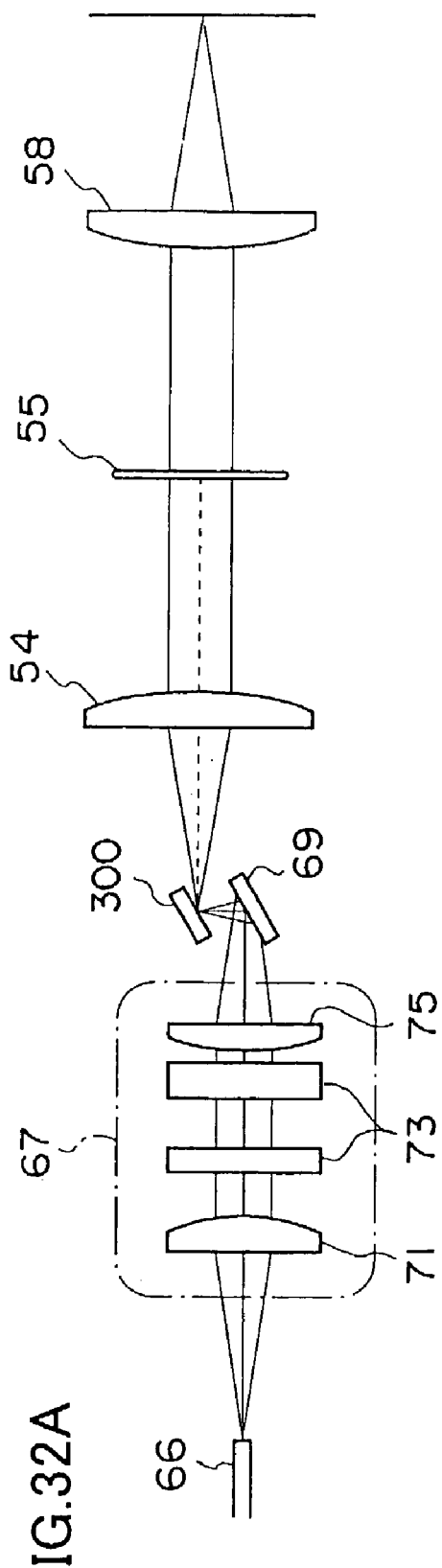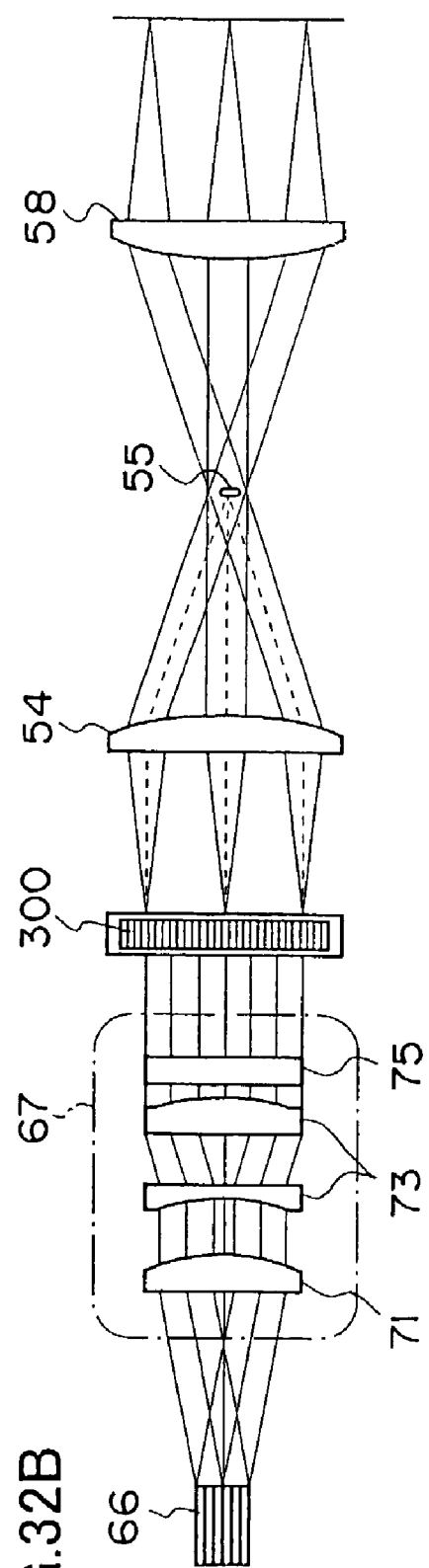

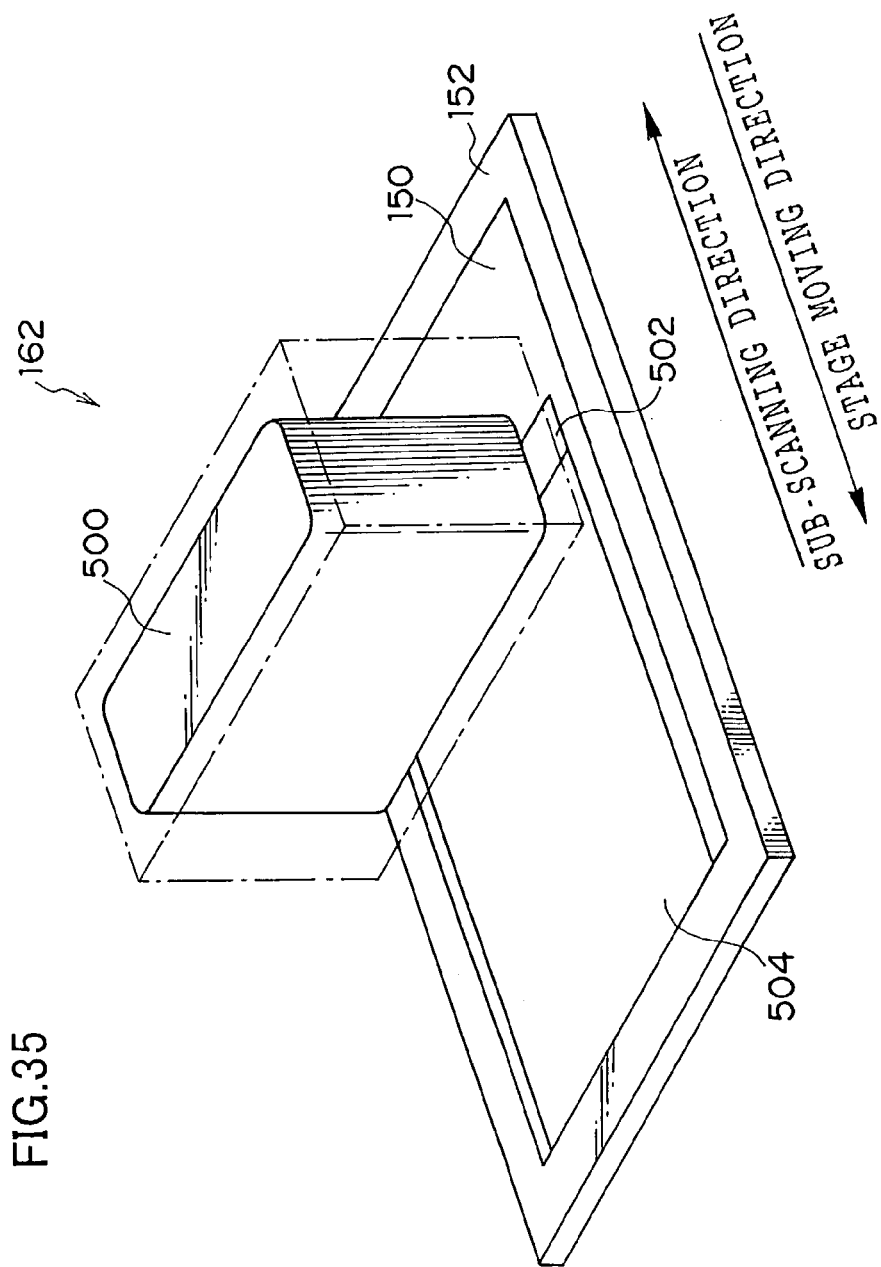

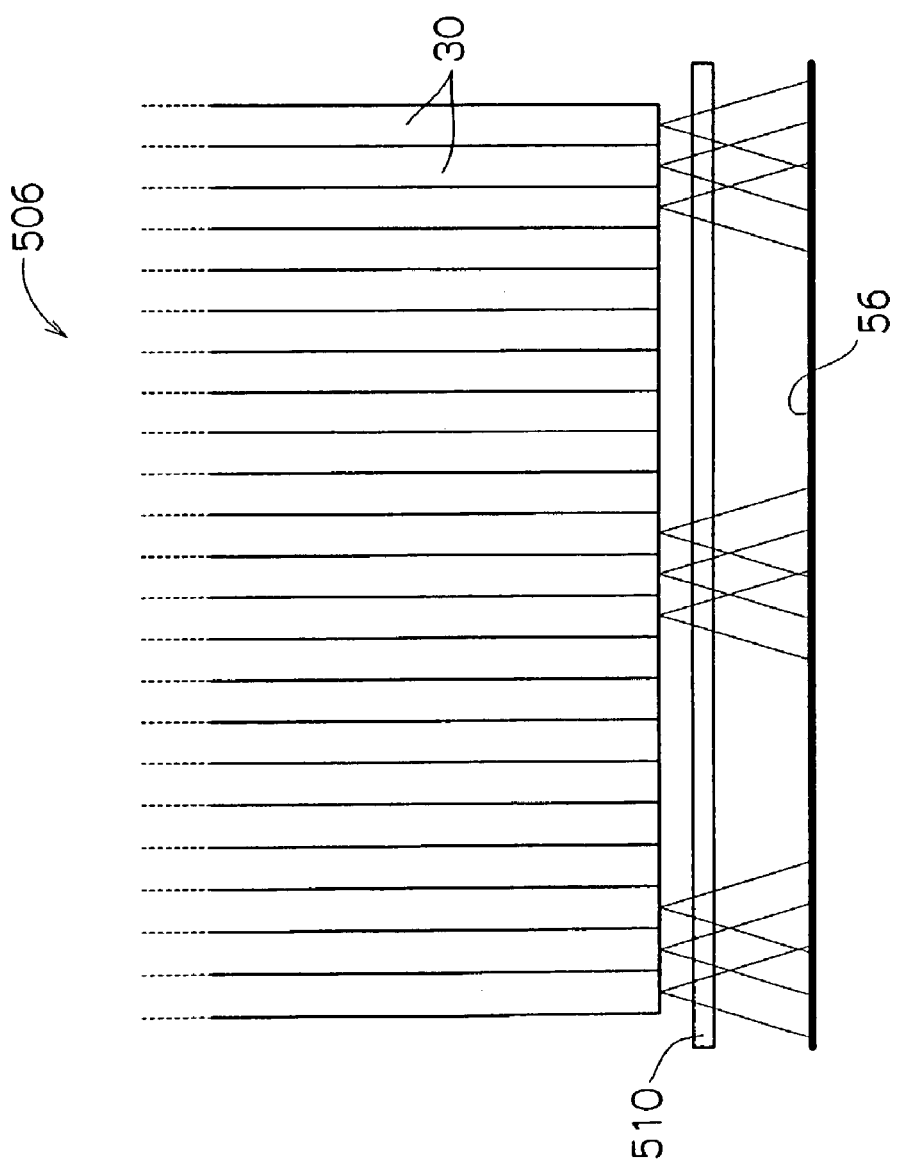

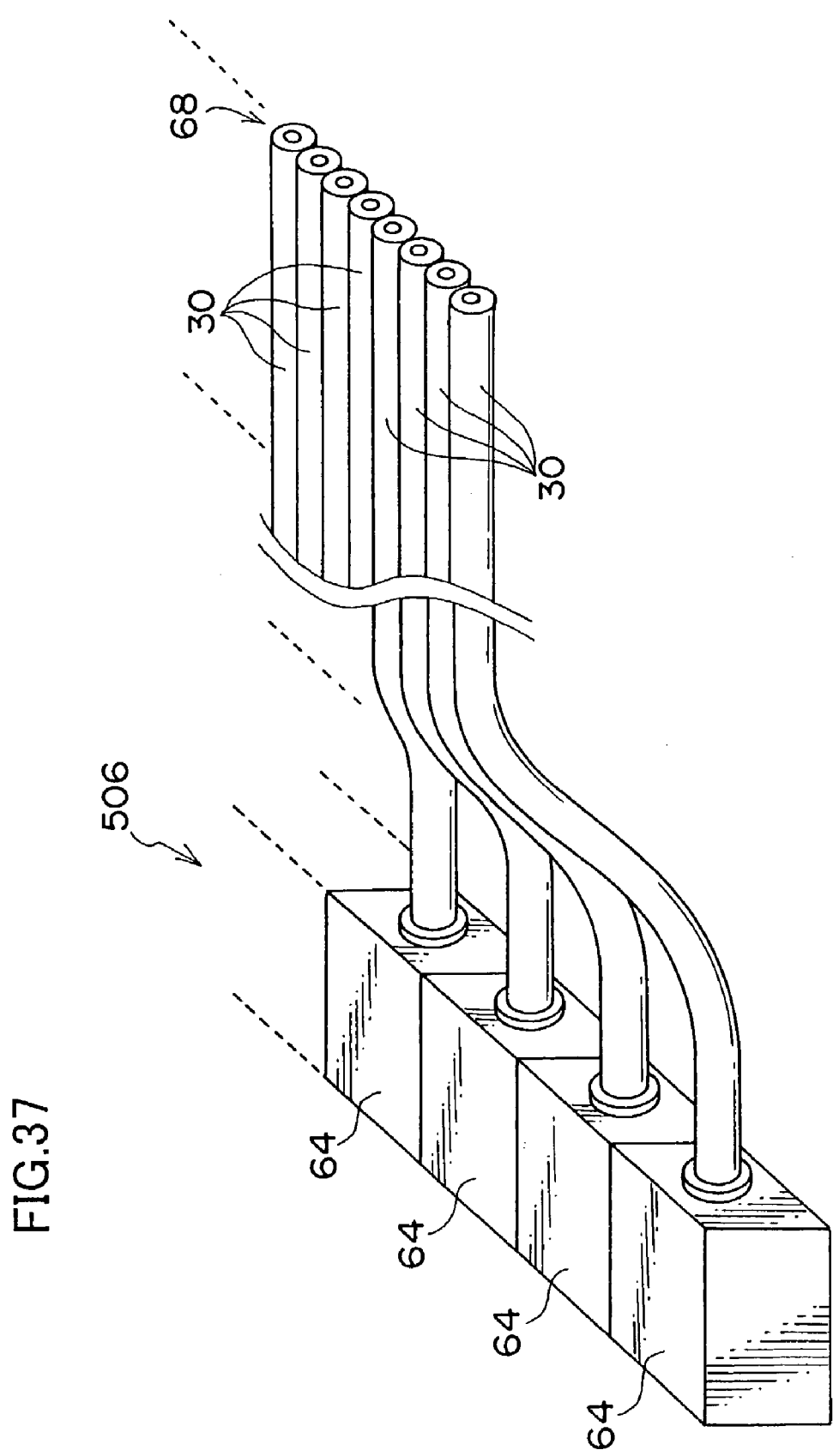

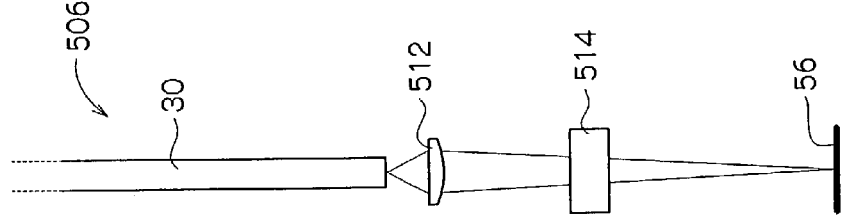
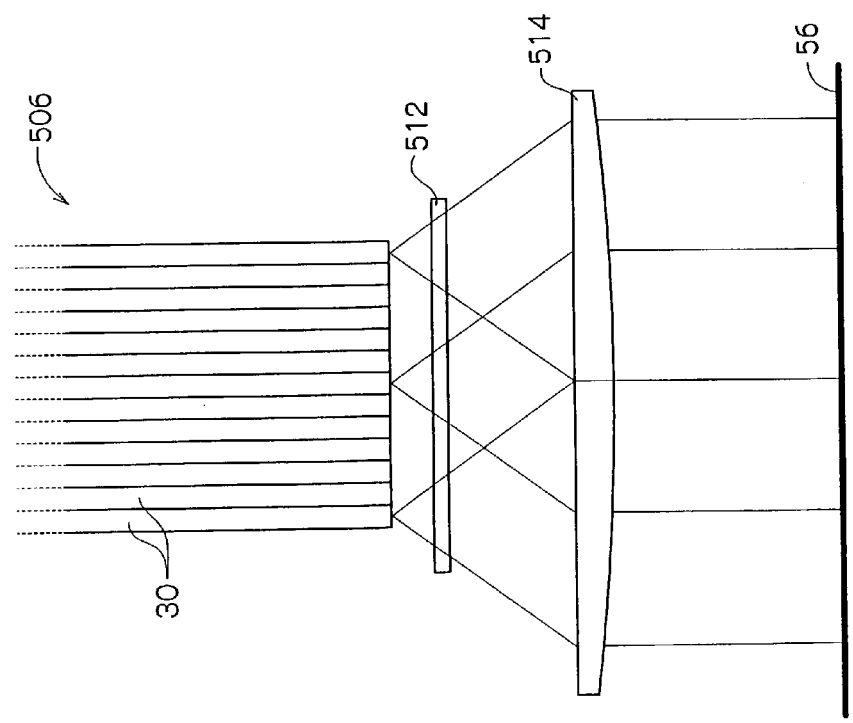

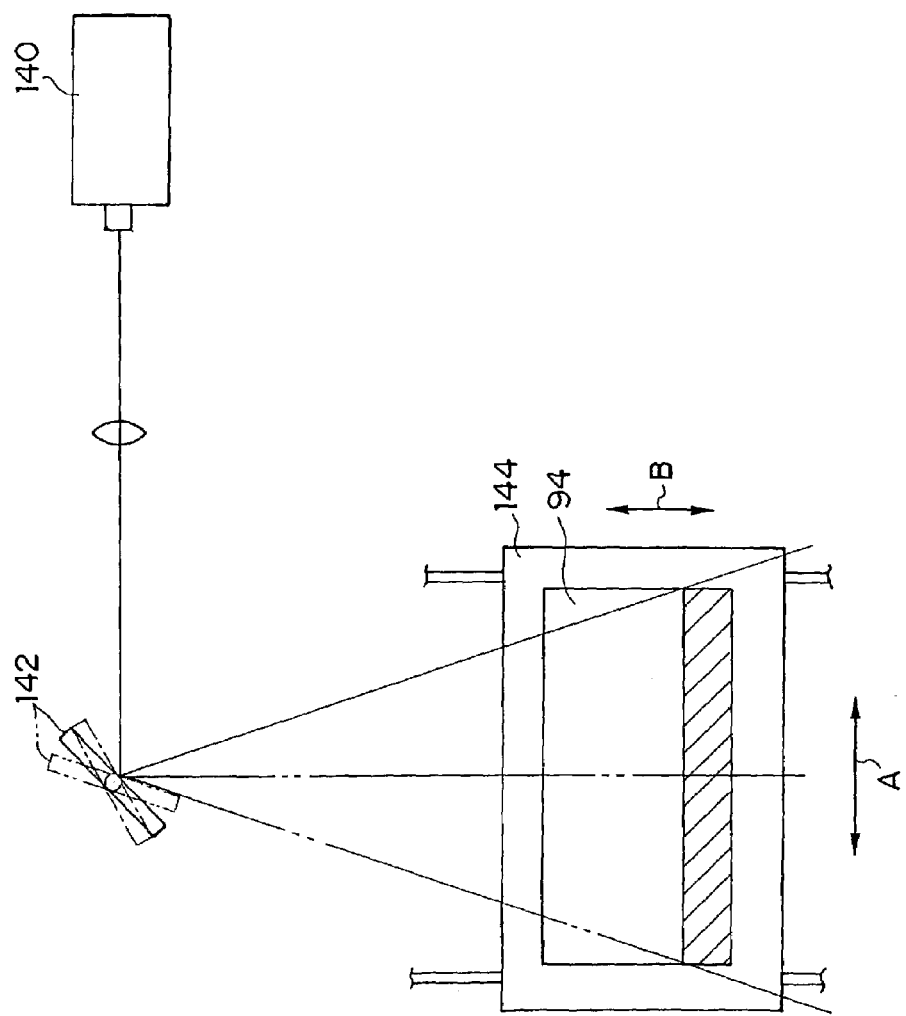

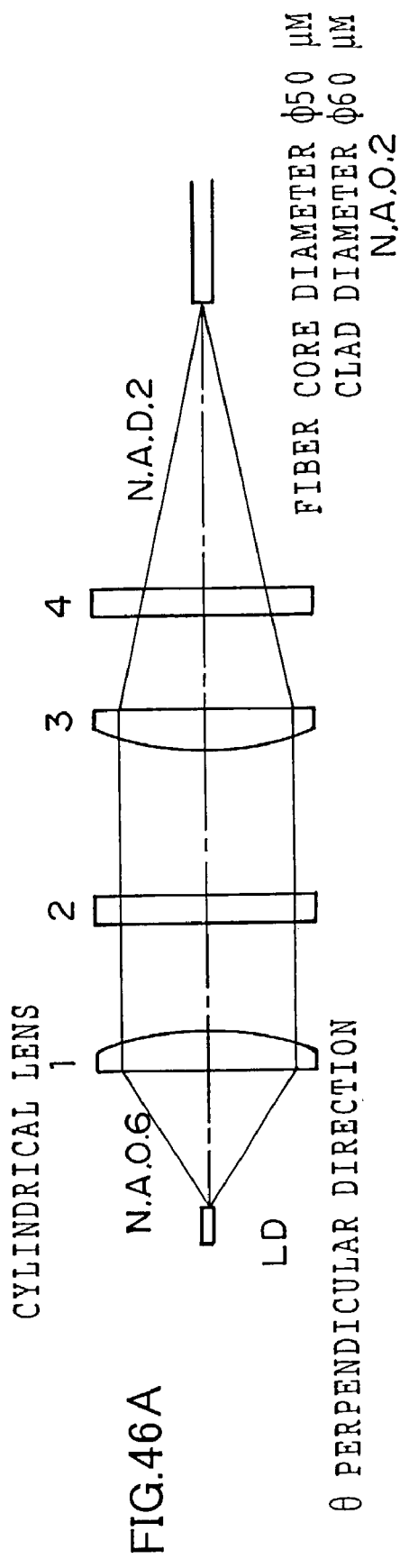
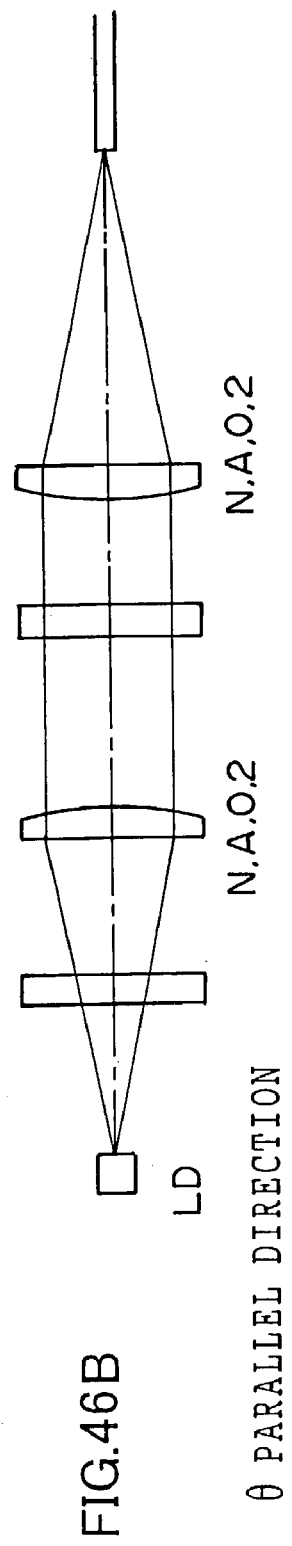
FIG.46A
FIG.46B

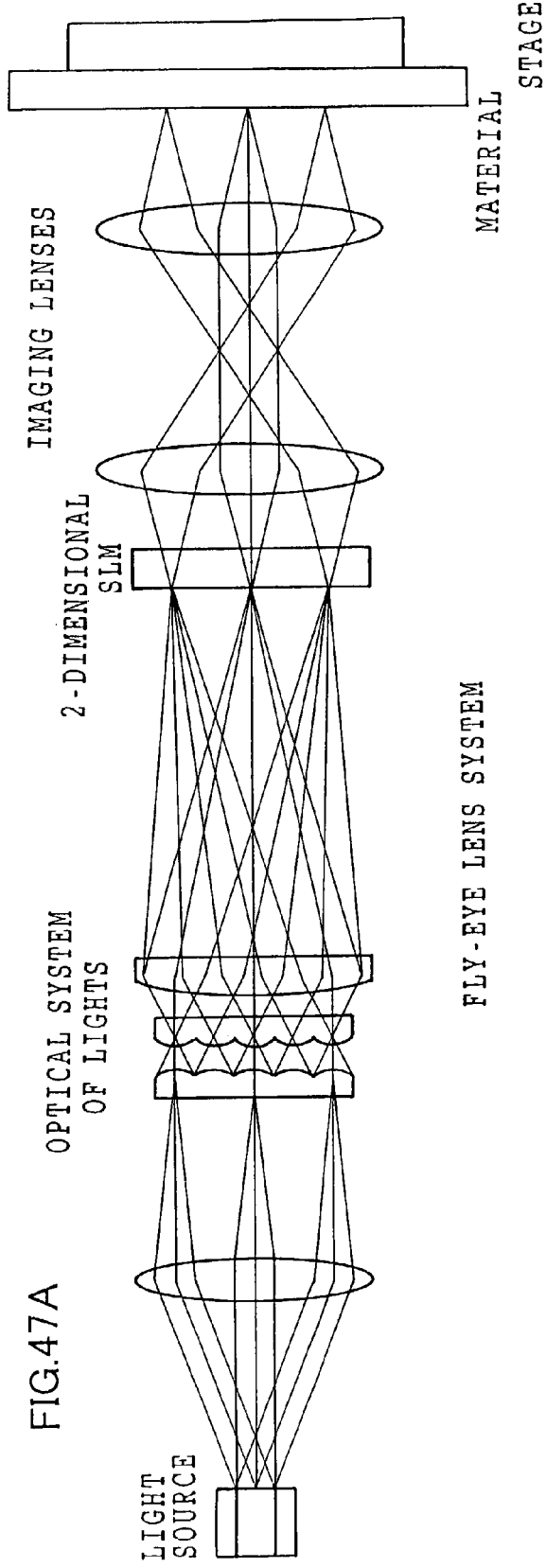
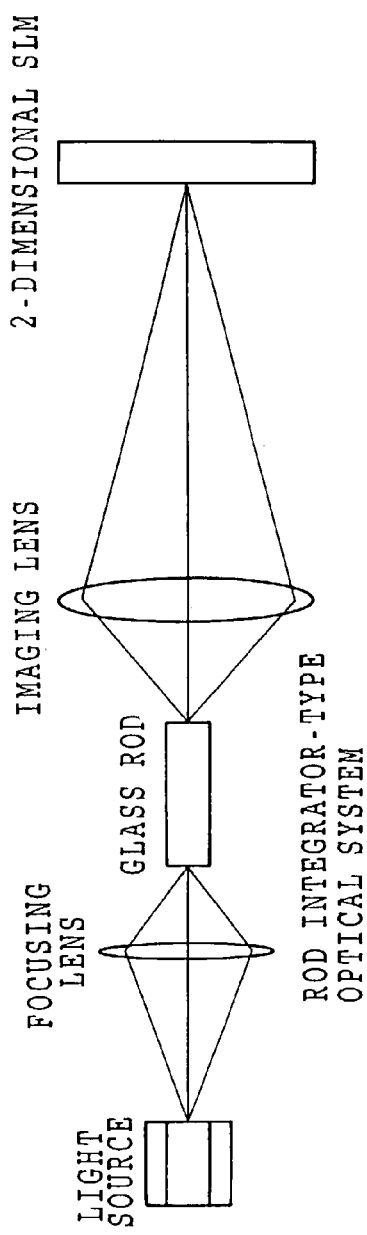
FIG.47A
FIG.47B

LASER ANNEALER AND LASER THIN-FILM FORMING APPARATUS

CROSS-REFERENCE TO RELATED APPLICATIONS

This application claims priority under 35 USC 119 from Japanese Patent Applications No. 2002-167279, No. 2002-167280, No. 2002-167281 and No. 2002-198248, the disclosures of which are incorporated by reference herein.

BACKGROUND OF THE INVENTION

1. Technical Field

The present invention relates to a laser annealer and a laser thin-film forming apparatus. Particularly, the invention relates to a laser annealer using a GaN (gallium nitride) type semiconductor laser as a light source and a laser thin-film forming apparatus for depositing a thin-film on a substrate that is accommodated in a closed space using products obtained by applying a laser beam to a material gas or a solid material in the closed space and causing a decomposing or synthesizing reaction.

2. Description of the Related Art

From the viewpoint of reduction in the size, weight, and cost of flat panel displays such as liquid crystal displays (LCDs) and organic EL (electroluminescence) displays, nowadays much attention is paid to system-on-glass (SOG) TFT technology. In this technology, not only thin-film transistors (TFTs) for pixel display gates but also driver circuits, a signal processing circuit, an image processing circuit and others are formed directly on a glass substrate of an LCD.

Whereas conventionally amorphous silicon has been used for TFTs for pixel display gates, polysilicon which exhibits a high carrier mobility is necessary for SOG-TFTs. The deformation temperature of glass is as low as 600° C., and crystal growth techniques utilizing temperatures higher than 600° C. cannot be used for formation of a polysilicon film. A technique commonly used for formation of a polysilicon film is an excimer laser annealing (ELA) method. In this method, an amorphous silicon film is formed at a low temperature (100 to 300° C.), melted thermally by applying to it pulse laser light generated by an XeCl excimer laser (wavelength: 308 nm), and then crystallized by a cooling process. By using the ELA, a polysilicon film can be formed on a glass substrate without giving thermal damage on a glass substrate.

The optical output power of the XeCl excimer laser is unstable and the output light intensity varies in a range of ±10%. When it is applied to ELA, the crystal grain size of a polysilicon film varies and the reproducibility is low. When the XeCl excimer laser is applied to ELA, the repetition frequency of pulse driving of the XeCl excimer laser is as low as 300 Hz. Thus, forming continuous crystal grain boundaries is difficult and high carrier mobility cannot be obtained. Also annealing cannot be performed at high speed in a large area. Further, the XeCl excimer laser has problems unique to gas lasers. They include the lives of a laser tube and a laser gas are as short as about $1\times10^7$ shots and the maintenance cost will increase, the laser apparatus becomes larger, and the energy efficiency is as low as 3%.

In the ELA, to produce a polysilicon film that is uniform in crystal characteristics, a laser beam that is emitted from an excimer laser is shaped by a homogenizer optical system into a line-shaped beam having a flat-top intensity profile. The use of the XeCl excimer laser causes that the profile of a line-shaped beam is not uniform because the optical output power of the XeCl excimer laser is unstable and the output light intensity varies in a range of ±10%. The wavelength 308 nm of the XeCl excimer laser is in the ultraviolet range, and an optical system using a special material is necessary to produce a line-shaped beam.

An example in which a high-output-power solid-state laser is used instead of an excimer laser is disclosed by HARA et al. in *Singakugiho* (Technical Report of IEICE) ED2001–10, The Institute of Electronics, Information and Communication Engineers of Japan, pp. 21–27, 2001. With this example, amorphous silicon does not absorb light sufficiently and the heat generation efficiency is low at a low-power oscillation wavelength 532 nm.

The annealing rate is serious in realizing mass-production and enabling processing of a large-side substrate.

Incidentally, among film forming methods using a laser is a method in which a thin film is deposited on a substrate by utilizing a decomposing reaction that is caused by applying a laser beam to a material gas or a solid material.

A thin-film forming method by CVD (chemical vapor deposition) is such that a thin film is deposited on a substrate by inputting a laser beam to a chamber as a closed space and decomposing, by optical energy, a material gas that is supplied to the chamber. A thin-film forming method by laser sputtering is such that a thin film is deposited on a substrate by inputting a laser beam to a chamber as a closed space and vaporizing a solid material in the chamber by applying the laser beam to it.

As such, methods using laser light as excitation energy are advantageous over other PVD (such as evaporation and sputtering) and CVD (such as thermal and plasma) method in that the temperature of a substrate on which a film is to be formed does not increase. Hence a thin film with weak internal stress can be formed, which can reduce a warp of a large-size substrate in particular.

As shown in FIG. 45, a thin-film forming method is known, in which an ArF excimer laser 140 (wavelength: about 193 nm) is used.

In the ArF excimer laser 140, the pulse width is fixed and a grain diameter for attaining desired properties cannot be obtained. The repetition frequency of pulse driving of the ArF excimer laser 140 is as low as 2 kHz and energy accumulation takes time. Hence the film formation rate is low and the production efficiency is low.

Furthermore, the ArF excimer laser 140 is expensive and its life is as short as about $5\times10^7$ shots. Its running cost is high.

Further, in the conventional laser sputtering thin-film forming method as shown in FIG. 45, a thin film is formed as follows. A laser beam emitted from the single ArF excimer laser 140 is deflected in the width direction (direction A) of a substrate 94 by an optical scanning system 142. A stage 144 mounted with the substrate 94 is moved in the length direction (direction B). Thus, this apparatus cannot be used for thin-film formation for a product having a large film formation area such as Si-TFTs for a liquid crystal display, a solar cell, or the like.

SUMMARY OF THE INVENTION

The present invention has been made to solve the above problems, and a first object of the present invention is to provide a laser annealer capable of forming, at high speed with high reproducibility, a polysilicon film having good crystal characteristics and a high carrier mobility by using semiconductor lasers that can be driven continuously and is superior in output power stability.

A second object of the invention is to provide a laser annealer that is compact and highly reliable and can be maintained easily.

A third object of the invention is to provide a laser annealer that need not use an optical system made of a special material and hence is of a low cost.

A fourth object of the invention is to provide a laser annealer that need not use an optical system made of a special material and can perform annealing through illumination with laser light having a uniform intensity profile.

A fifth object of the invention is to provide a laser annealer capable of performing annealing at high speed with high resolution.

A sixth object of the invention is to provide a laser thin-film forming apparatus that can form a large-area, uniform film, is of a low cost, and has a long life.

To attain the first to third objects, the invention provides a first laser annealer comprising a laser light source that comprises at least one GaN-type semiconductor laser and is configured so as to form a plurality of emission points that emit laser beams having a wavelength of 350 to 450 nm; and scanner for scanning an annealing surface with the laser beams emitted from the laser light source.

In the first laser annealer according to the invention, laser beams are emitted from the laser light source and the scanner scans the annealing surface with the emitted laser beams. The laser light source has at least one GaN-type semiconductor laser and is configured so as to form a plurality of emission points that emit laser beams having a wavelength of 350 to 450 nm. An output power necessary for annealing can be obtained by combining the laser beams emitted from the emission points.

Since the GaN-type semiconductor lasers which can be driven continuously and are superior in output power stability are used in the laser light source, a polysilicon film having good crystal characteristics and a high carrier mobility can be formed at high speed with high reproducibility. The first laser annealer is smaller and more reliable, can be maintained more easily, and is higher in energy efficiency than laser annealers using an excimer laser. Further, because of the use of laser beams having a wavelength of 350 to 450 nm, it is not necessary to use an optical system made of a special material and hence the cost is low.

The laser annealer according to the invention may comprise a spatial light modulator. For example, a laser annealer may be provided that comprises a laser light source that comprises at least one GaN-type semiconductor laser and is configured so as to form a plurality of emission points that emit laser beams having a wavelength of 350 to 450 nm; a spatial light modulator for modulating the laser beams emitted from the laser light source, the spatial light modulator being such that a number of pixel portions light modulating states of which are changed in accordance with respective control signals are arranged two-dimensionally on a substrate; and scanner for scanning an annealing surface with laser beams modulated by the pixel portions.

The spatial light modulator may be a micromirror device (DMD: digital micromirror device) in which a number of micromirrors having respective reflecting surfaces angles of which can be changed in accordance with respective control signals are arranged two-dimensionally on a substrate (e.g. silicon substrate). Alternatively, the spatial light modulator may be a grating light valve (GLV) in which movable grating elements each having a ribbon-shaped reflecting surface and capable of being moved in accordance with a control signal and fixed grating elements each having a ribbon-shaped reflecting surface are arranged alternately in a large number in parallel.

To attain the fourth object, the invention provides a second laser annealer comprising a laser light source that comprises at least one GaN-type semiconductor laser and is configured so as to form a plurality of emission points that emit laser beams having a wavelength of 350 to 450 nm; a spatial light modulator for modulating the laser beams emitted from the laser light source, the spatial light modulator being such that a number of pixel portions light modulating states of which are changed in accordance with respective control signals are arranged two-dimensionally, for example, on a substrate; and scanner for scanning an annealing surface with laser beams modulated by the pixel portions, the laser annealer further comprising, between the laser light source and the spatial light modulator, a collimator lens for collimating a light flux emitted from the laser light source; and a light intensity distribution correcting optical system for correcting the collimated light flux so that its light intensity distribution becomes approximately uniform on an illumination surface of the spatial light modulator by changing light flux widths at respective exit positions so that a ratio of a light flux width of a peripheral portion to that of a central portion that is close to an optical axis is smaller on an exit side than on an incidence side.

In the second laser annealer according to the invention, the collimator lens and the light intensity distribution correcting optical system are disposed between the laser light source that emits laser beams having a wavelength of 350 to 450 nm and the spatial light modulator. The use of laser beams having a wavelength of 350 to 450 nm makes it unnecessary to use an optical system made of a special material for ultraviolet light as in the case of ELA apparatuses. Further, high-resolution annealing can be performed with an arbitrary pattern by using the spatial light modulator such as a DMD or a GLV as in the case of visible-range laser exposure apparatuses.

Laser light that has been collimated by the collimator lens is corrected by the light intensity distribution correcting optical system so that its light intensity distribution becomes approximately uniform on the illumination surface of the spatial light modulator by changing light flux widths at respective exit positions so that the ratio of a light flux width of a peripheral portion to that of a central portion that is close to the optical axis is smaller on the exit side than on the incidence side. This makes it possible to performing laser annealing without unevenness using laser light having a uniform intensity profile.

In the second laser annealer according to the invention, laser beams are emitted from the laser light source and the scanner scans the annealing surface with the emitted laser beams. The laser light source has at least one GaN-type semiconductor laser and is configured so as to form a plurality of emission points that emit laser beams having a wavelength of 350 to 450 nm. An output power necessary for annealing can be obtained by combining the laser beams emitted from the emission points.

Since the GaN-type semiconductor lasers which can be driven continuously and are superior in output power stability are used in the laser light source, a polysilicon film having good crystal characteristics and a high carrier mobility can be formed at high speed with high reproducibility. The second laser annealer is smaller and more reliable, can be maintained more easily, and is higher in energy efficiency than laser annealers using an excimer laser.

To attain the fifth object, the invention provides a third laser annealer comprising a laser light source that comprises at least one GaN-type semiconductor laser and is configured so as to form a plurality of emission points that emit laser beams having a wavelength of 350 to 450 nm; a spatial light modulator for modulating the laser beams emitted from the laser light source, the spatial light modulator being such that a number of pixel portions light modulating states of which are changed in accordance with respective control signals are arranged on a substrate; a controller for controlling pixel portions that are smaller in number than all the pixel portions arranged on the substrate using respective control signals that are generated on the basis of annealing information; and scanner for scanning an annealing surface with laser beams modulated by the pixel portions.

In the third laser annealer according to the invention, laser beams emitted from the laser light source and having a wavelength of 350 to 450 nm are modulated by pixel portions of the spatial light modulator and the annealing surface is scanned by the scanner with the modulated laser beams. In the spatial light modulator, pixel portions that are smaller in number than all the pixel portions arranged on the substrate are controlled by using respective control signals that are generated on the basis of annealing information. That is, rather than all the pixel portions arranged on the substrate, part of them are controlled. Therefore, the number of pixel portions controlled is reduced and the control signal transfer rate is made higher than in the case of transferring control signals for all the pixel portions. As a result, the laser light modulation rate is increased and high-speed annealing is enabled.

The laser light source has at least one GaN-type semiconductor laser and is configured so as to form a plurality of emission points that emit laser beams having a wavelength of 350 to 450 nm. An output power necessary for annealing can be obtained by combining the laser beams emitted from the emission points. Since the GaN-type semiconductor lasers which can be driven continuously and are superior in output power stability are used in the laser light source, a polysilicon film having good crystal characteristics and a high carrier mobility can be formed at high speed with high reproducibility. The third laser annealer is smaller and more reliable, can be maintained more easily, and is higher in energy efficiency than laser annealers using an excimer laser. Further, because of the use of laser beams having a wavelength of 350 to 450 nm, it is not necessary to use an optical system made of a special material and hence the cost is low.

To attain the sixth object, the invention provides a first laser thin-film forming apparatus comprising a laser light source that comprises at least one semiconductor laser and is configured so as to form a plurality of emission points; and an optical system for focusing laser beams emitted from the laser light source into a line-shaped beam that extends in a width direction of a substrate, wherein a thin film is deposited on the substrate by inputting the laser beams to a reaction container and causing a material gas supplied to the reaction container to be photodecomposed by the line-shaped beam.

In the first laser thin-film forming apparatus, a thin film is deposited on the substrate by inputting laser beams to the reaction container and causing a material gas supplied to the reaction container to be photodecomposed by a line-shaped beam.

The laser light source is configured so as to form a plurality of emission points that are arranged in line parallel with the width direction of the substrate. Emitted laser beams are focused by the optical system into a line-shaped beam extending in the width direction of the substrate and applied to the substrate as a line beam covering the width of the substrate.

Therefore, it is not necessary to move the substrate in its width direction or scan the substrate with a laser beam as in the case with a laser beam of a conventional single light source; a film can be formed over the entire surface by moving the substrate or scanning it with a line beam only in one direction and hence the apparatus configuration is prevented from becoming unduly complex. Further, since the area in which a film is formed at one time is large, the first laser thin-film forming apparatus is suitable for thin-film formation for products having large film formation areas.

The invention provides a second laser thin-film forming apparatus comprising a laser light source in which emission points of a laser light exit section that emit laser beams are arranged in line parallel with a width direction of a solid material; and an optical system for focusing the laser beams emitted from the laser light source into a line-shaped beam that extends in the width direction of the solid material, wherein a thin film is deposited on a substrate by inputting the laser beams to a reaction container and causing the solid material accommodated in the reaction container to be vaporized by applying the line-shaped beam to the solid material.

In the second laser thin-film forming apparatus according to the invention, a thin film is deposited on the substrate by inputting laser beams to the reaction container and causing the solid material accommodated in the reaction container to be vaporized by applying a line-shaped beam to the solid material.

The emission points of the laser light exit section of the laser light source are arranged in line parallel with the width direction of a solid material. Emitted laser beams are focused by the optical system into a line-shaped beam extending in the width direction of the solid material and applied to the solid material as a line beam covering the width of the solid material.

Therefore, unlike in the conventional case, it is not necessary to move the solid material in its width direction or scan the solid material with a laser beam to illuminate the entire surface of the solid material with the laser beam.

BRIEF DESCRIPTION OF THE DRAWINGS

FIG. 1 is a perspective view showing an appearance of a laser annealer according to a first embodiment;

FIG. 2 is a perspective view showing the structure of a scanner of the laser annealer according to the first embodiment;

FIG. 4 is a perspective view showing a general configuration of one illumination head of the laser annealer according to the first embodiment;

FIG. 5A is a sectional view of the illumination head of FIG. 4 taken parallel with the auxiliary scanning direction along the optical axis;

FIG. 5B is a side view of the illumination head of FIG. 4;

FIG. 9A is a perspective view showing the structure of a fiber array light source;

FIG. 9B is a partial enlarged view of the fiber array light source of FIG. 9A;

FIGS. 15A and 15B are sectional views taken along the optical axis showing a difference between the depth of focus of a low-luminance illumination head and that of a high-luminance illumination head;

FIG. 17A is a side view of the illumination head in a case that the use area of the DMD is proper;

FIG. 17B is a sectional view of the illumination head of FIG. 17A taken parallel with the auxiliary scanning direction along the optical axis;

FIG. 23 is a plan view showing the structure of still another multiplexing laser light source;

FIG. 24A is a plan view showing the structure of a further multiplexing laser light source;

FIG. 24B is a sectional view of the multiplexing laser light source of FIG. 24A taken along the optical axis;

FIG. 32A is a sectional view of the illumination head of FIG. 31 taken along the optical axis;

FIG. 32B is a side view of the illumination head of FIG. 31;

FIG. 35 is a perspective view showing the structure of a scanner of a laser annealer according to a third embodiment;

FIG. 36A is a sectional view, taken parallel with the fiber arrangement direction along the optical axis, of an illumination head of the laser annealer according to the third embodiment;

FIG. 36B is a sectional view, taken parallel with the auxiliary scanning direction, of the illumination head of FIG. 36A;

FIG. 37 is a perspective view showing the structure of a fiber array light source of the illumination head of FIGS. 36A and 36B;

FIG. 38A is a sectional view of an illumination head of a laser annealer according to a fourth embodiment taken parallel with the fiber arrangement direction along the optical axis;

FIG. 38B is a sectional view of the illumination head of FIG. 38A taken parallel with the auxiliary scanning direction;

FIG. 45 illustrates a conventional laser thin-film forming apparatus;

FIGS. 46A and 46B show relationships of broad-stripe LD and fibers with a diameter of 60 μm; and FIGS. 47A and 47B are optional examples of beam uniforming illumination optical systems.

DETAILED DESCRIPTION OF THE INVENTION

Embodiments in each of which a laser annealer according to the present invention is applied to formation of low-temperature polysilicon TFTs will be hereinafter described in detail with reference to the drawings.

Figure 25A:
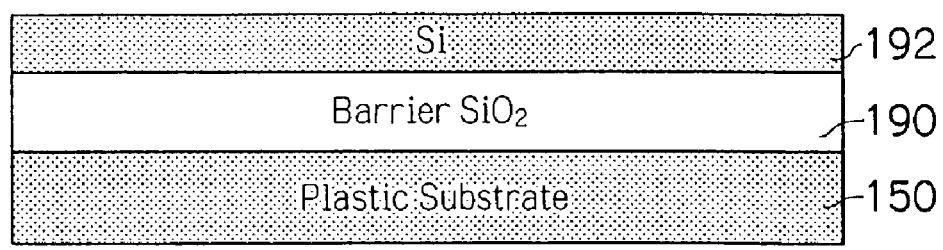
FIGS. 25A and 25B illustrate a low-temperature polysilicon TFT formation process.
Figure 25B:
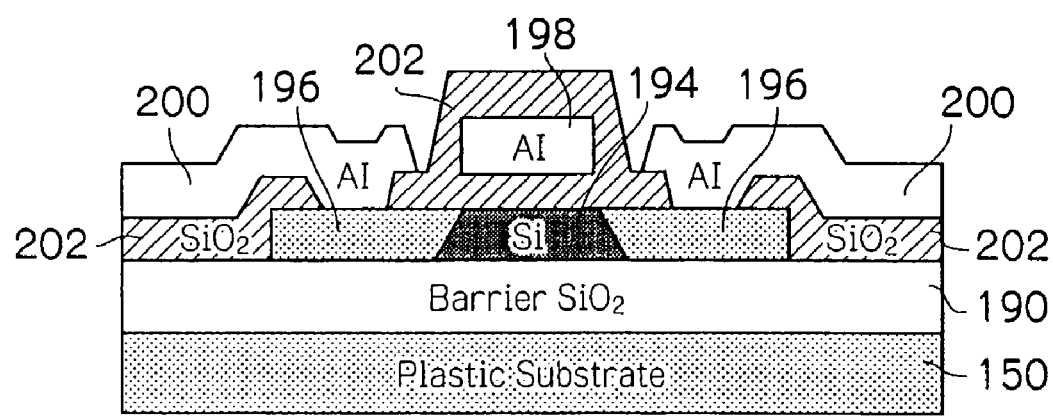

First, a low-temperature polysilicon TFT formation process will be described briefly. As shown in FIG. 25A, a silicon oxide ($SiO_x$) insulating film 190 is deposited on a glass or plastic transparent substrate 150 and an amorphous silicon film 192 is deposited on the $SiO_x$ insulating film 190. A polysilicon film is formed by crystallizing the amorphous silicon film 192 by laser annealing. Then, as shown in FIG. 25B, polysilicon TFTs each having a polysilicon active layer 194, a polysilicon source and drain 196, a gate electrode 198, source and drain electrodes 200, and a gate insulating film 202 are formed on the transparent substrate 150 with the $SiO_x$ insulating film 190 interposed in between.

First Embodiment

Configuration of Laser Annealer

As shown in FIG. 1, a laser annealer according to the first embodiment of the invention is equipped with a flat-plate stage 152 for holding a transparent substrate 150 on which an amorphous silicon film is deposited by absorbing the substrate 150 on its surface. Two guides 158 extending along the stage moving direction are provided on a thick-plate support stage 156 that is supported by four legs 154. The stage 152 is disposed such that its longitudinal direction is parallel with the stage moving direction, and is supported by the guides 158 so as to be able to reciprocate. The laser annealer is equipped with an unillustrated driving device for driving the stage 152 along the guides 158.

A bracket-shaped gate 160 is disposed at the center of the support stage 156 so as to stride the movement path of the stage 152. Respective end of the bracket-shaped gate 160 is fixed to both sides of the support stage 156. A scanner 162 is disposed on one side of the gate 160, and a plurality of (e.g., two) sensors 164 for detecting the front end and the rear end of the transparent substrate 150 are disposed on the other side of the gate 160. The scanner 162 and the sensors 164 are attached to the gate 160 and thereby disposed above the movement path of the stage 152 in a fixed manner. The scanner 162 and the sensors 164 are connected to an unillustrated controller for controlling those.

Figure 3A:
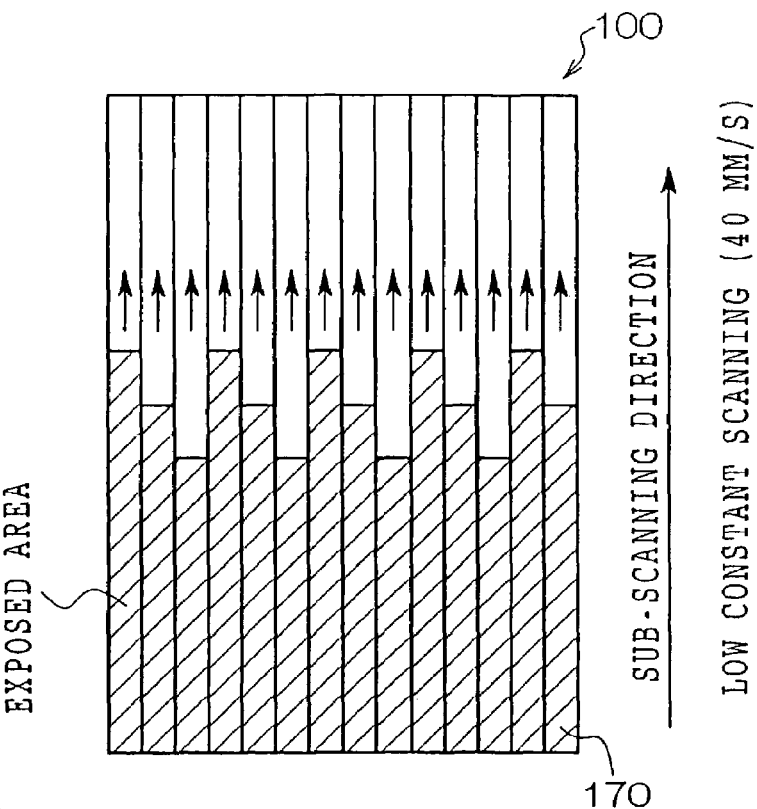
FIG. 3A is a plan view showing illumination completion areas formed on a photosensitive material.
Figure 3B:
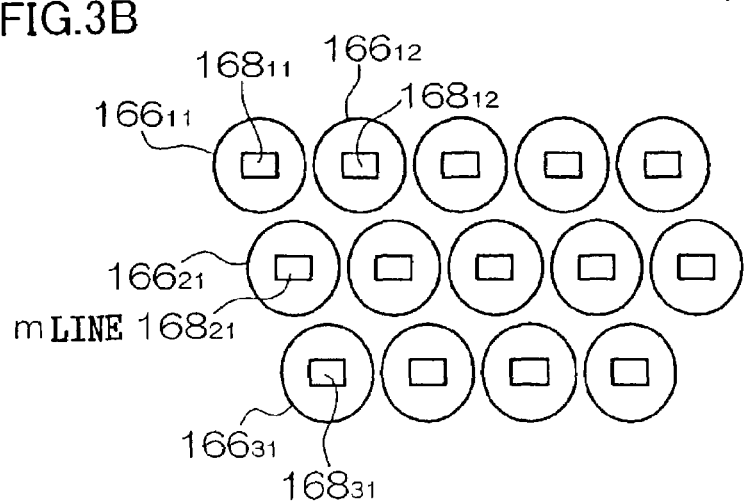
FIG. 3B shows an arrangement of illumination areas of respective illumination heads.

As shown in FIGS. 2 and 3B, the scanner 162 is equipped with a plurality of (e.g., 12) annealing laser illumination heads 166 that are generally arranged in an m-row by an n-column (e.g., 3-row/5-column) matrix. In this example, four illumination heads 166 are disposed on the third row because of a relationship with the width of the transparent substrate 150. An individual illumination head located at the mth-row/nth-column position will be referred to as an illumination head $166_{mn}$.

An illumination area 168 of an individual illumination head 166 is rectangle whose shorter side extends along the auxiliary scanning direction. As the stage 152 is moved, a band-shaped illumination completion area 170 is formed on the transparent substrate 150 for each illumination head 166. An illumination area that is formed by an individual illumination head located at the mth-row/nth-column position will be referred to as an illumination area $168_{mn}$.

As shown in FIGS. 3A and 3B, to arrange band-shaped illumination completion areas 170 in the direction perpendicular to the auxiliary scanning direction without forming gaps, the illumination heads of each row are arranged in deviating manner with a prescribed pitch (an integer multiple of the longer-side length of the illumination area; in this embodiment, two times). With this arrangement, an area between the illumination areas $168_{11}$ and $168_{12}$ that cannot be laser-illuminated by the illumination heads $166_{11}$ and $166_{12}$ of the first row can be laser-illuminated by the illumination heads $166_{21}$ and $166_{31}$.

As shown in FIGS. 4, 5A, and 5B, each of the illumination heads $166_{11}$ to $166_{mn}$ has a digital micromirror device (DMD) 50 as a spatial light modulator that modulates an incident light beam pixel by pixel in accordance with image data. The DMD 50 is connected to an unillustrated controller having a data processing section and a mirror drive control section. The image data processing section of the controller generates control signals for drive-controlling the individual micromirrors in control subject regions (described later) of the DMD 50 of each illumination head 166. The mirror drive control section controls the angles of the reflecting surfaces of the respective micromirrors of the DMD 50 of each illumination head 166 in accordance with the control signals generated in the image data processing section in a manner described later.

A fiber array light source 66 having a laser light exit section 68 in which optical fiber exit ends (emission points) are arranged in line in a direction corresponding to the longer side of the illumination area 168, a lens system 67 for focusing laser light emitted from the fiber array light source 66 onto the DMD 50 while correcting it, and a mirror 69 for reflecting, toward the DMD 50, laser light that has passed through the lens system 67 are arranged in this order on the light incidence side of the DMD 50.

The lens system 67 is composed of a pair of combination lenses 71 for converting laser light emitted from the fiber array light source 66 into parallel light, a pair of combination lenses 73 for correcting the parallel laser light so that it is given a uniform light intensity distribution, and a focusing lens 75 for focusing light intensity distribution-corrected laser light onto the DMD 50. The combination lenses 73 function as a light intensity distribution correcting optical system. That is, in the arrangement direction of the exit ends, the combination lenses 73 expand a portion of a light flux that is close to the optical axis of the lenses 73 and narrow a portion of the light flux distant from the optical axis. In the direction perpendicular to the arrangement direction of the exit ends, the combination lenses 73 allow the laser light to be passed as it is. In this manner, the combination lenses 73 corrects the laser light so that it is given a uniform light intensity distribution.

Lens systems 54 and 58 for imaging, onto the scanning surface (annealing surface) 56 of the transparent substrate 150, laser light reflected from the DMD 50 are disposed on the light reflection side of the DMD 50. The lens systems 54 and 58 are disposed so that the DMD 50 and the scanning surface 56 have a conjugate relationship.

Figure 6:
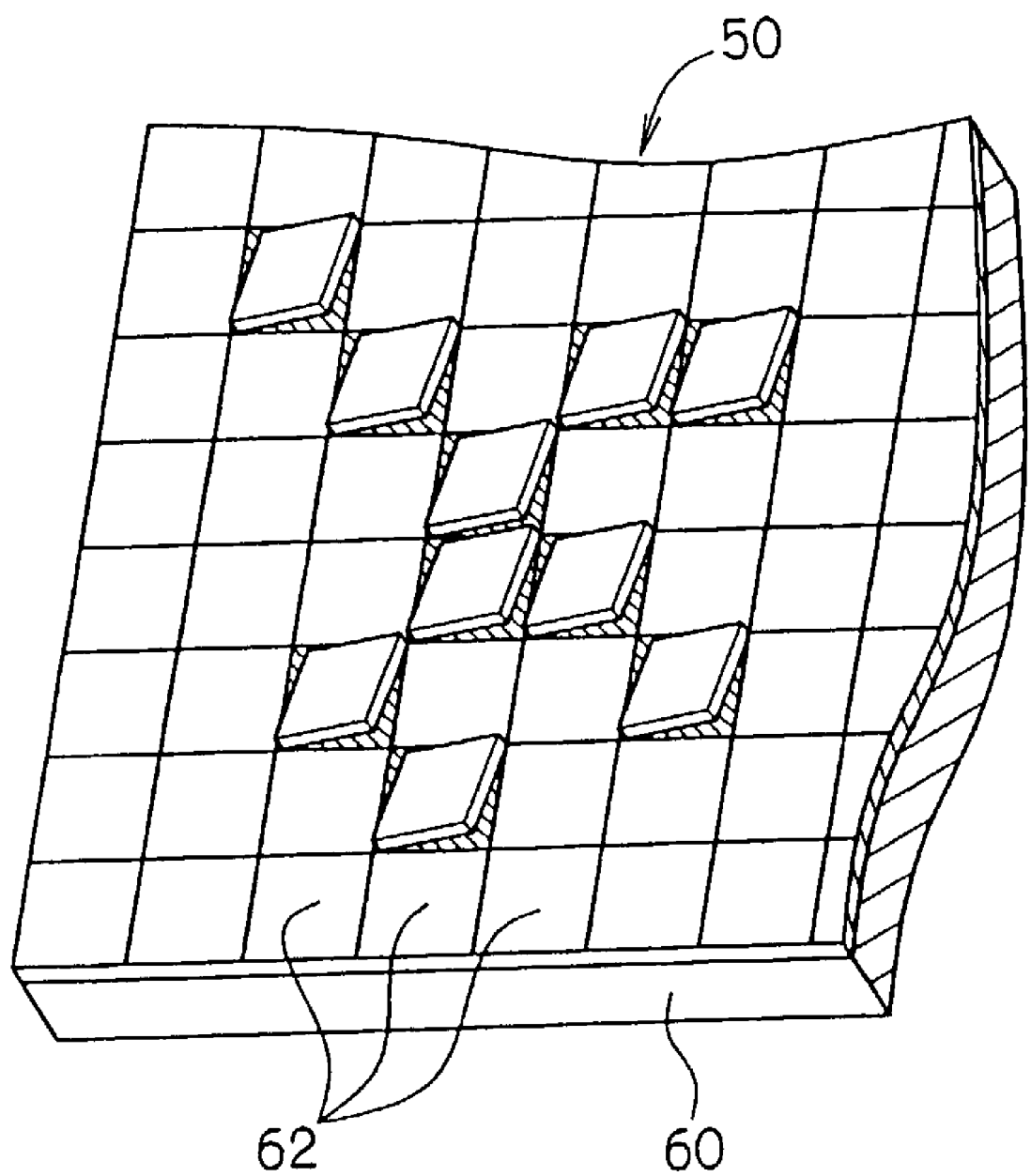
FIG. 6 is a partial enlarged view showing the structure of a digital micromirror device (DMD)

As shown in FIG. 6, in the DMD 50, very small mirrors (micromirrors) 62 are arranged on SRAM cells (memory cells) 60 in such a manner as to be supported by props. That is, the DMD 50 is a mirror device that is configured such that a number of (e.g., 600×800) very small mirrors that form pixels are arranged in matrix form. In each pixel, a micromirror 62 supported by a prop is disposed at the top and a high-reflectance material such as aluminum is evaporated on the surface of the micromirror 62. The reflectance of the micromirror 62 is greater than or equal to 90%. An SRAM cell 60 of a silicon-gate CMOS that is produced by an ordinary semiconductor memory manufacturing line is disposed right under the micromirror 62 with the prop including a hinge and a yoke interposed in between. A monolithic structure (uniform type) is formed as a whole.

Figure 7A:
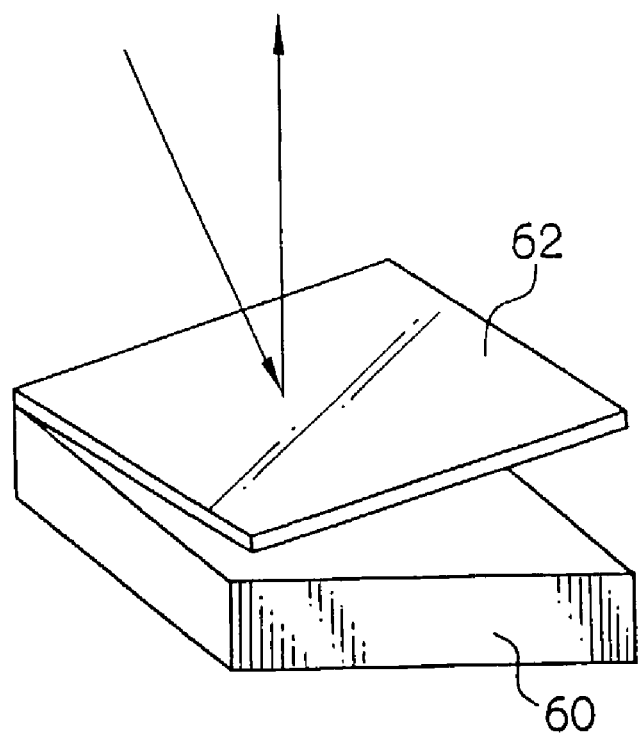
FIGS. 7A and 7B illustrate how the DMD operates.
Figure 7B:
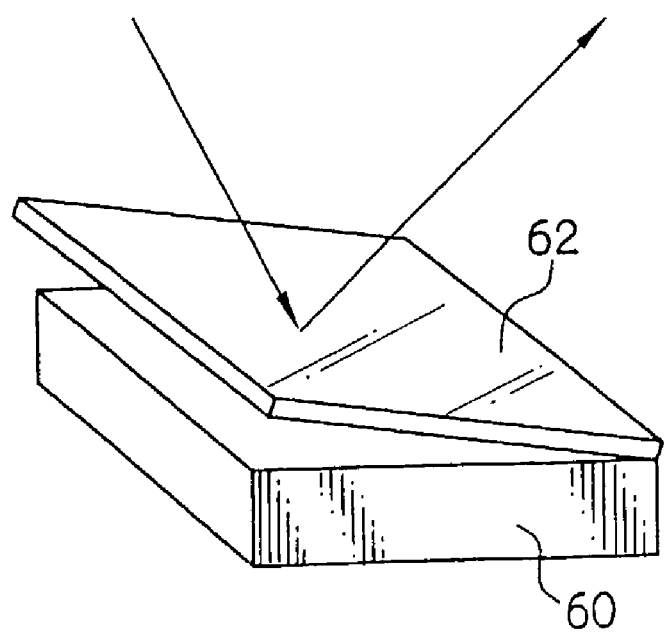

When a digital signal is written to an SRAM cell 60 of the DMD 50, the corresponding micromirror 62 which is supported by the prop is inclined in a range of $\pm\alpha°$ (e.g., $\pm10°$)

about a diagonal line with respect to the substrate on which the DMD 50 is placed. FIG. 7A shows a state that a micromirror 62 is inclined by +α° (on state), and FIG. 7B shows a state that a micromirror 62 is inclined by −α° (off state). Therefore, light that is incident on the DMD 50 is reflected in accordance with inclinations of the micromirrors 62 of the respective pixels of the DMD 50 that are controlled on the basis of image signals as shown in FIG. 6.

FIG. 6, which is a partially enlarged view of the DMD 50, shows an exemplary state that the micromirrors 62 are controlled so as to incline by +α° or −α°. The controller performs the on/off control on each of the micromirrors 62. The controller (not shown) is connected to the DMD 50. An unillustrated light absorber is disposed on a traveling path of light beams reflected from off-state micromirrors 62.

Figure 8A:
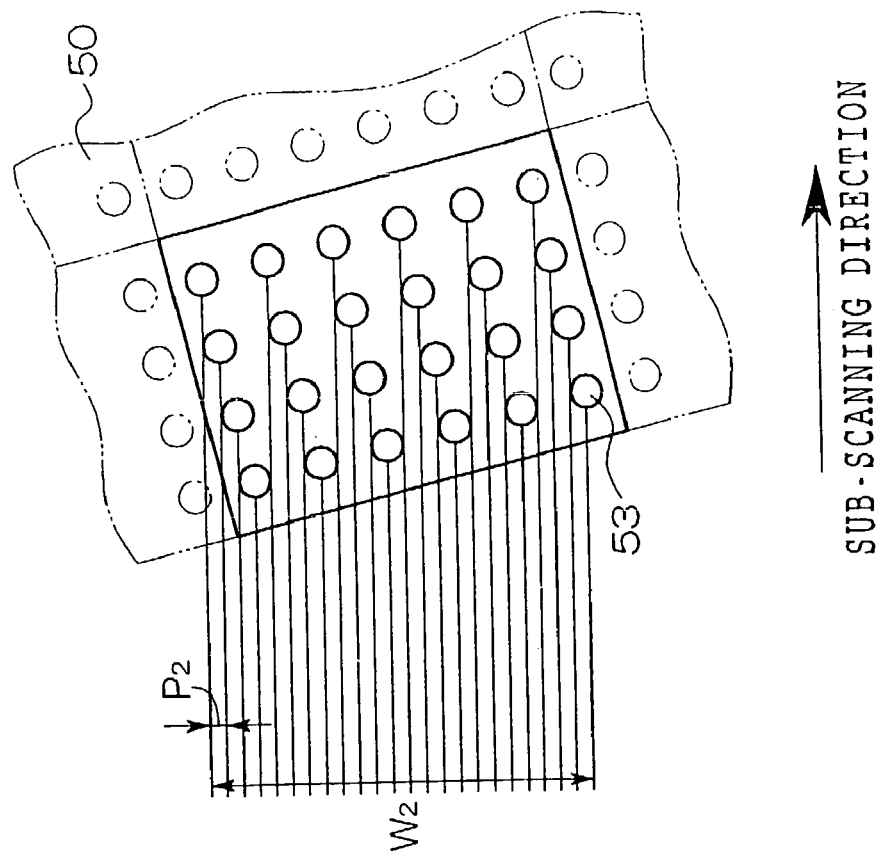
FIGS. 8A and 8B are plan views comparing an arrangement of scanning beams and scanning lines in the case that the DMD is not inclined and those in the case that the DMD is inclined.
Figure 8B:
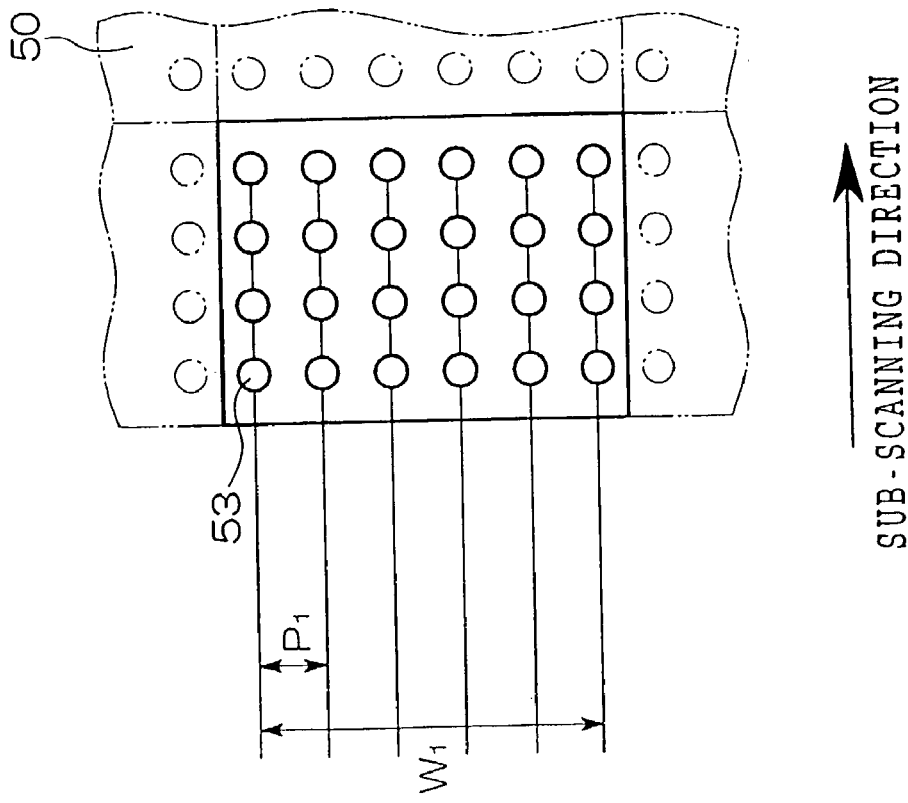

The DMD 50 may be inclined slightly so that its shorter side forms a prescribed angle θ(e.g., 0.1° to 5°) with the auxiliary scanning direction. FIG. 8A shows scanning loci of reflection light images (illumination beams) 53 of the micromirrors in the case that the DMD 50 is not inclined. FIG. 8B shows scanning loci of illumination beams 53 of the respective micromirrors in the case that the DMD 50 is inclined.

In the DMD 50, a number of (e.g., 600) micromirror lines each consisting of a number of (e.g., 800) micromirrors that are arranged along the longer side are arranged along the shorter side. As shown in FIG. 8B, a pitch $P_2$ of scanning loci (i.e., scanning lines) of illumination beams 53 of the respective micromirrors in the case that the DMD 50 is inclined is smaller than a pitch $P_1$ of scanning lines in the case that the DMD 50 is not inclined. Therefore, the resolution can be increased greatly by inclining the DMD 50. The inclination angle of the DMD 50 is very small, and a scanning width $W_2$ in the case that the DMD 50 is inclined is approximately the same as a scanning width $W_1$ in the case that the DMD 50 is not inclined.

Further, where the DMD 50 is inclined, the same scanning line is illuminated plural times with illumination beams 53 from micromirrors belonging to different micromirror lines (multiple exposure). The multiple exposure makes it possible to control laser illumination positions by very small lengths and thereby realize high-resolution annealing. In addition, controlling laser illumination positions by very small lengths makes it possible to connect the illumination areas 168 of the illumination heads 166 arranged in the main scanning direction without causing steps.

Instead of inclining the DMD 50, the micromirror lines may be arranged in a staggered manner by deviating those from each other by a prescribed length in the direction perpendicular to the auxiliary scanning direction. This alternative method can provide the same advantages as the method of inclining the DMD 50 does.

As shown in FIG. 9A, the fiber array light source 66 is equipped with a number of laser modules 64 to which one ends of multi-mode optical fibers 30 are connected, respectively. The other ends of the multi-mode optical fibers 30 are connected to respective optical fibers 31 that are the same in core diameter as and smaller in clad diameter than the multi-mode optical fibers 30. The exit ends (emission points) of the optical fibers 31 are arranged in line in the main scanning direction which is perpendicular to the auxiliary scanning direction to form the laser light exit section 68. Alternatively, the emission points may be arranged in plural lines in the main scanning direction.

As shown in FIG. 9B, the exit ends of the optical fibers 31 are fixed in such a manner as to be interposed between two support plates 65. To protect the end faces of the optical fibers 31, a transparent protective plate 63 such as a glass plate is disposed on the light exit side of the optical fibers 31. The protective plate 63 may either be in close contact with the end faces of the optical fibers 31 or be disposed so as to seal the end faces of the optical fibers 31. In a case of sealing the end faces, the protective plate 63 is separated from ends of the fibers 31. The protective plate 63 and support plates seal the end faces of the optical fibers. Additionally, sealing gas is filled and sealed. The exit ends of the optical fibers 31 are prone to deteriorate because the light density is high and dust tends to gather there. Disposing the protective plate 63 on the end faces of the optical fibers 31 prevents dust gathering there and can delay the deterioration of the exit ends.

In this example, to arrange the exit ends of the optical fibers 31 having a small clad diameter in line without forming gaps, the multi-mode optical fibers 30 having a large clad diameter and the optical fibers 31 are arranged such that a third multi-mode optical fiber 30 is placed on two (i.e., first and second) adjoining multi-mode optical fibers 30 and the exit end of the optical fiber 31 connected to the third multi-mode optical fiber 30 is interposed between the exit ends of the optical fibers 31 connected to the two multi-mode optical fibers 30.

In a fiber light source using optical fibers whose exit ends have a large clad diameter, the diameter of the emission points of bundled optical fibers becomes large, as a result of which a sufficient depth of focus cannot be obtained in the case of high-resolution annealing. Using optical fibers whose core diameter is uniform and clad diameter is smaller at the exit ends than at the incidence ends as in this example makes it possible to increase the luminance (brightness) of the light source and to realize a laser annealer having a great depth of focus. For example, this structure provides a sufficient depth of focus and makes it possible to perform annealing, at high speed and high resolution, even ultra-high-resolution annealing in which the beam diameter is 1 μm or less and the resolution is 0.1 μm or less. It also becomes possible to realize an even higher carrier mobility by improving the crystal properties of a polysilicon film and thereby decreasing its resistivity.

For example, such an optical fiber, that is, an optical fiber whose core diameter is uniform and clad diameter is smaller at the exit end than at the incidence end, can be formed by connecting a plurality of optical fibers having the same core diameter and different clad diameters to each other. For example, such an optical fiber can be formed by connecting an optical fiber 31 having a length of 1 to 30 cm and a small clad diameter to the laser-light-exit-side tip of a multi-mode optical fiber 30 having a large clad diameter in a concentric manner. The two optical fibers 30 and 31 are connected to each other such that the incidence end face of the optical fiber 31 is fused to the exit end face of the multi-mode optical fiber 30 such that their central axes coincide with each other. As mentioned above, the diameter of the core 31*a* of the optical fiber 31 is the same as that of the core 30*a* of the multi-mode optical fiber 30.

Alternatively, a short optical fiber formed by fusing an optical fiber having a small clad diameter to an optical fiber that is short and has a large clad diameter may be connected to the exit end of a multi-mode optical fiber 30 via a ferrule, an optical connector, or the like. Connecting a plurality of optical fibers to each other detachably via a connector or the like facilitates replacement work that is necessary when a light source module is damaged partially, for example, when an optical fiber having a small clad diameter is damaged, whereby the maintenance cost of the illumination heads 166 can be reduced. In the following description, the optical fiber 31 may be referred to as an "exit end portion of the multi-mode optical fiber 30". In addition to uniformity, the selected diameters do not change and where the core diameter is d and the clad diameter is D, the following relation is often used:

D<2d

The multi-mode optical fiber 30 and the optical fiber 31 may be any of a step-index optical fiber, a graded index optical fiber, or a composite optical fiber. For example, a step-index optical fiber of Mitsubishi Cable Industries, Ltd. can be used. In this embodiment, each of the multi-mode optical fiber 30 and the optical fiber 31 is a step-index optical fiber. The multi-mode optical fiber 30 is such that the clad diameter is 125 μm, the core diameter is 25 μm, NA is 0.2, and the transmittance of an incidence end face coating is 99.5% or more. The optical fiber 31 is such that the clad diameter is 60 μm, the core diameter is 25 μm, and NA is 0.2.

In general, the transmission loss of infrared laser light increases as the clad diameter of an optical fiber decreases. A proper clad diameter is determined in accordance with the wavelength band of laser light. The transmission loss decreases as the wavelength becomes shorter. In the case of laser light of an wavelength 405 nm emitted from a GaN-type semiconductor laser, almost no increase occurs in the transmission loss even if the cladding thickness (i.e., {(clad diameter)−(core diameter)}/2) is made about ½ of that employed for transmission of infrared light of a 800-nm-wavelength range or about ¼ of that employed for transmission of infrared light of a 1.5-μm-wavelength range for communication purposes. The clad diameter can thus be set as short as 60 μm.

The clad diameter of the optical fiber 31 is not limited to 60 μm. The clad diameter of optical fibers used in conventional fiber light sources is 125 μm. The smaller the clad diameter becomes, the greater the depth of focus becomes because the light source exhibits higher brightness. The clad diameter of the multi-mode optical fiber 30 may be smaller than 125 μm. In some cases, the clad diameter of the multi-mode optical fiber 30 may be smaller than or equal to 80 μm. In some other cases, the clad diameter of the multi-mode optical fiber 30 may be smaller than or equal to 60 μm. Further, the clad diameter of the multi-mode optical fiber 30 may be smaller than or equal to 40 μm. A core diameter of at least 3 to 4 μm should be secured, and the clad diameter of the optical fiber 31 may be larger than or equal to 10 μm.

Figure 11:
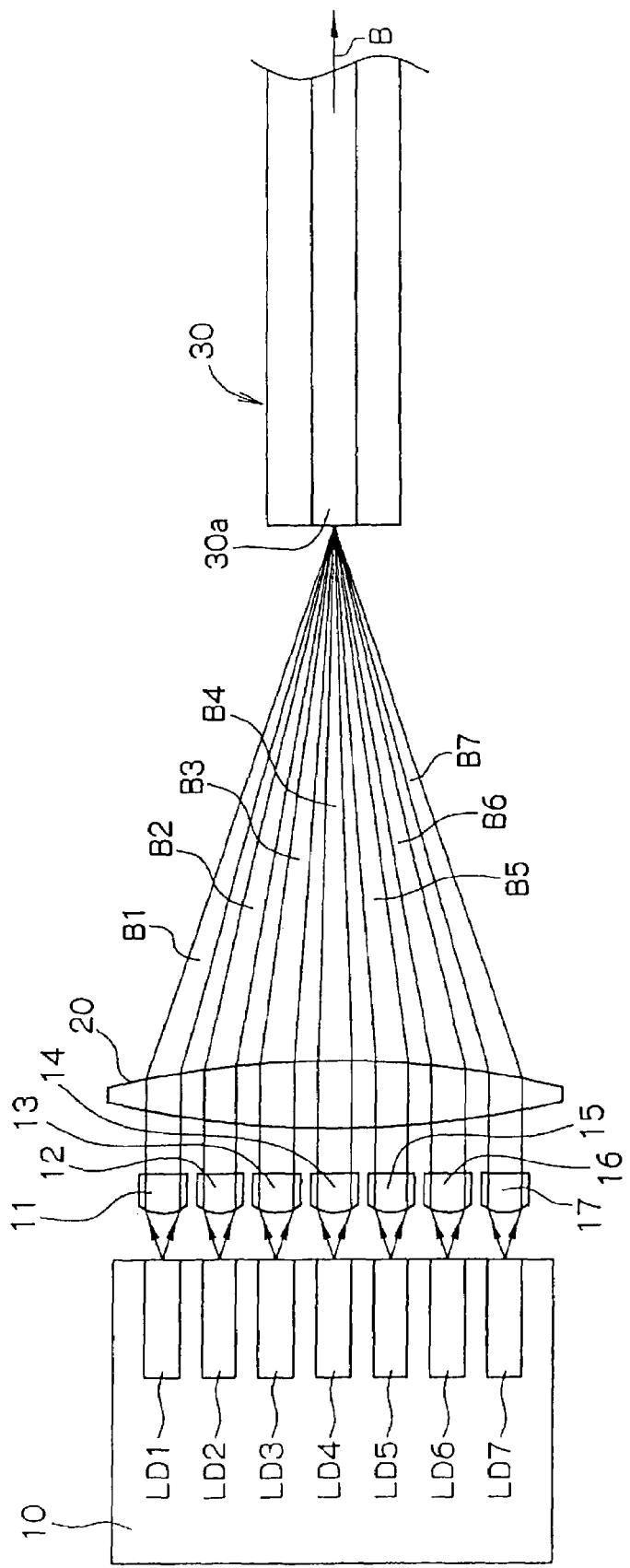
FIG. 11 is a plan view showing the structure of a multiplexing laser light source.

Each laser module 64 is mainly a multiplexing laser light source (fiber light source) shown in FIG. 11. This multiplexing laser light source is composed of a plurality of (e.g., seven) chip-shaped lateral multi-mode or single-mode GaN-type semiconductor lasers LD1–LD7 that are arranged on and fixed to a heat block 10, collimator lenses 11–17 that are disposed so as to correspond to the respective GaN-type semiconductor lasers LD1–LD7, one condenser lens 20, and one multi-mode optical fiber 30. The number of semiconductor lasers is not limited to seven. For example, it is possible to input as many as laser beams emitted from 20 semiconductor lasers to a multi-mode optical fiber whose clad diameter is 60 μm, core diameter is 50 μm, and NA is 0.2. In this manner, the number of optical fibers can be reduced while a light intensity required for each illumination head is attained.

The GaN-type semiconductor lasers LD1–LD7 have a common oscillation wavelength (e.g., 405 nm) and a common maximum output power (e.g., 100 mW for multi-mode lasers and 30 mW for single-mode lasers). The GaN-type semiconductor lasers LD1–LD7 may be lasers that oscillate at a wavelength that is not equal to the above-mentioned wavelength 405 nm but is in a range from 350 to 450 nm. A wavelength range will be discussed later.

Figure 12:
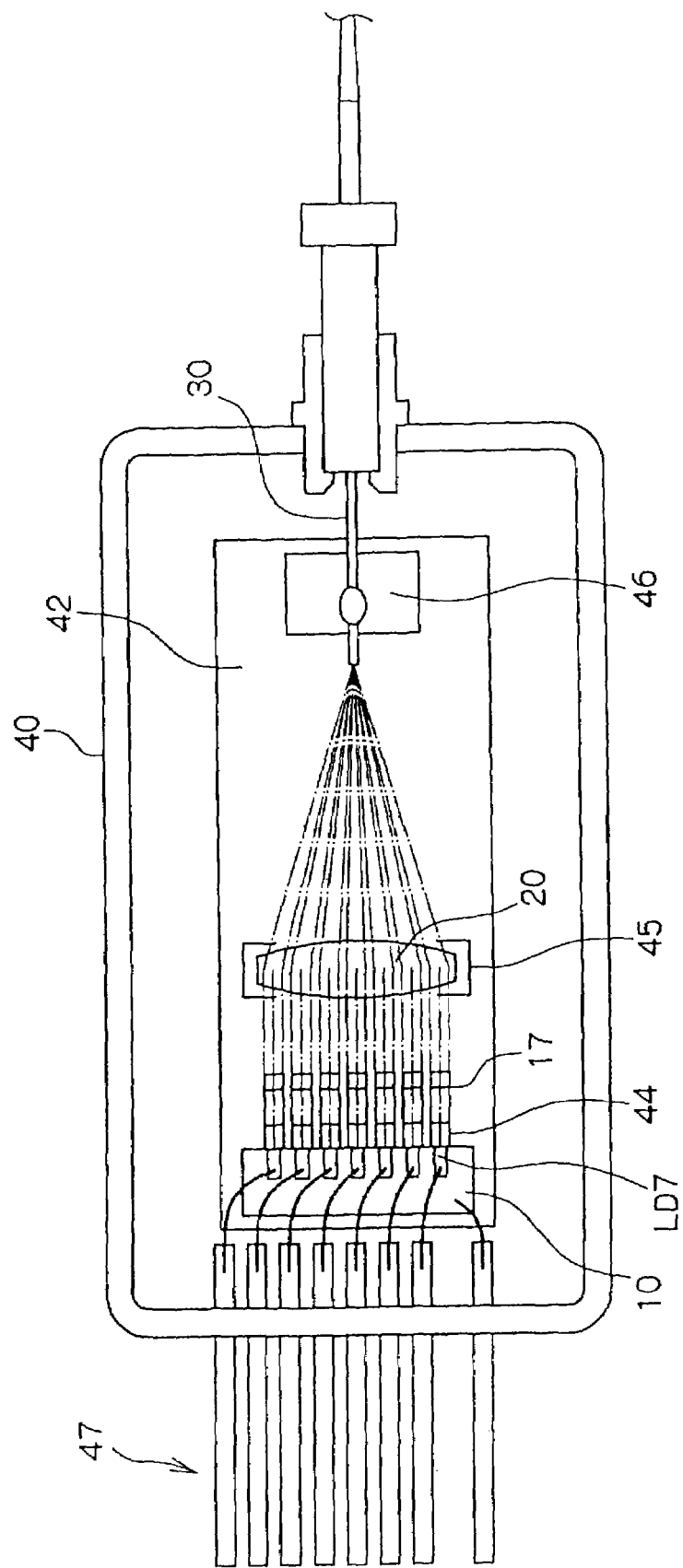
FIG. 12 is a plan view showing the structure of a laser module.
Figure 13:
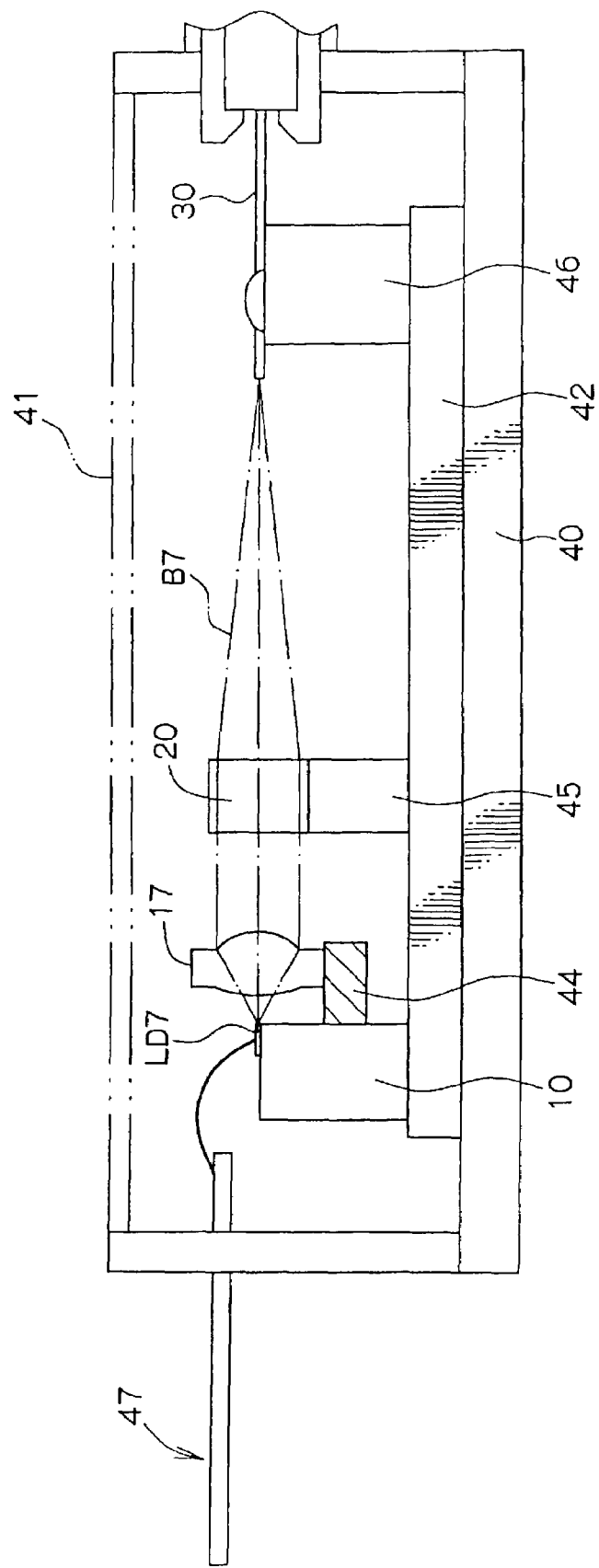
FIG. 13 is a side view showing the structure of a laser module.

As shown in FIGS. 12 and 13, the above multiplexing laser light source is housed in a box-shaped package 40 having a top opening together with other optical elements. The package 40 has a package lid 41 for closing its opening. The multiplexing laser light source is hermetically sealed in a closed space (i.e., a sealed space) formed by the package 40 and the package lid 41 by introducing a sealing gas into the package 41 after deaeration and then closing the opening of the package 40 with the package lid 41.

A base plate 42 is fixed to the bottom surface of the package 40. The heat block 10, a condenser lens holder 45 that holds the condenser lens 20, and a fiber holder 46 that holds an incidence end portion of the multi-mode optical fiber 30 are attached to the top surface of the base plate 42. An exit end portion of the multi-mode optical fiber 30 is led out of the package 40 through an opening that is formed through the front wall of the package 40.

A collimator lens holder 44 that holds the collimator lenses 11–17 is attached to a front face of the heat block 10. The rear wall of the package 40 is formed with openings through which lines 47 for supplying drive currents to the respective GaN-type semiconductor lasers LD1–LD7 are lead out.

To avoid unduly complicating of FIG. 13, only the GaN-type semiconductor laser LD7 of the semiconductor lasers LD1–LD7 and only the collimator lens 17 of the collimator lenses 11–17 are associated with the reference symbols "LD7" and "17" in FIG. 13.

Figure 14:
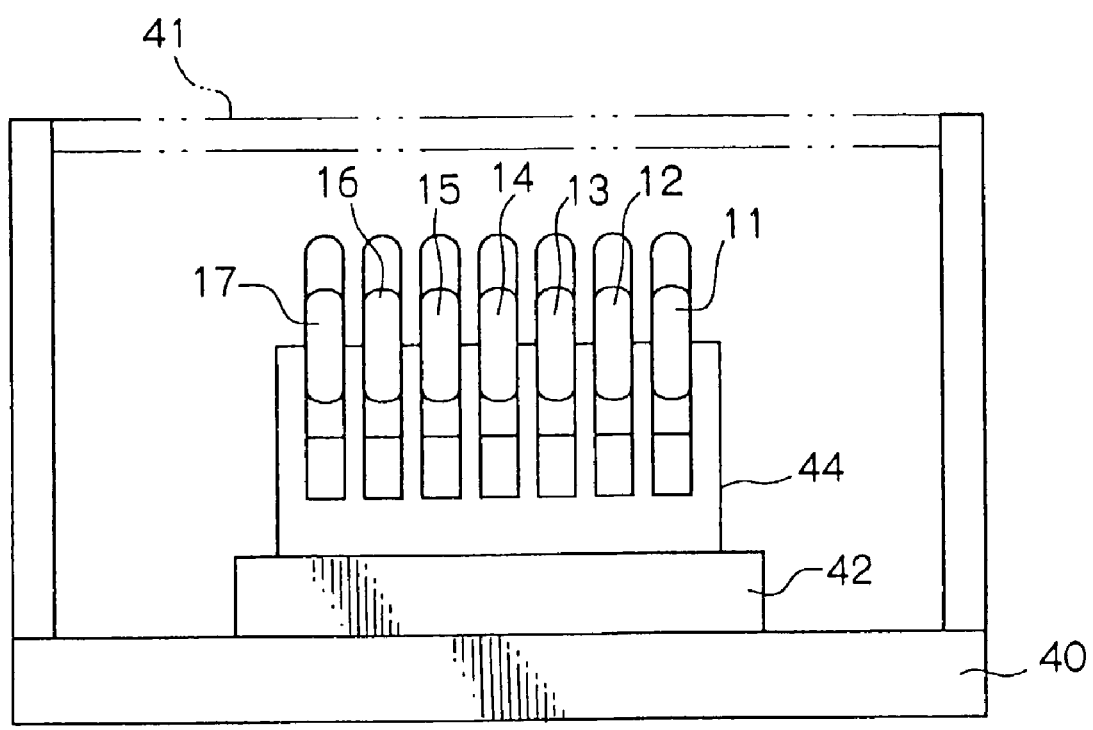
FIG. 14 is a partial front view showing the structure of a laser module.

FIG. 14 shows an attachment portion of the collimator lenses 11–17 as viewed from the front side. Each of the collimator lenses 11–17 has such a shape as obtained by cutting out a long and narrow portion including the optical axis of a circular lens having an aspherical surface by parallel planes. For example, such a long and narrow collimator lens can be formed by molding resin or optical glass. The collimator lenses 11–17 are arranged close to each other parallel with the arrangement direction of the emission points of the GaN-type semiconductor lasers LD1–LD7 in order to orient the length directions of the collimator lenses 11–17 perpendicular to the arrangement direction of the emission points (i.e., in the right-left direction in FIG. 14).

Each of the GaN-type semiconductor lasers LD1–LD7 has an active layer whose emission width is 2 μm and emits a laser beam B1, B2, B3, B4, B5, B6, or B7 having spread angles 10° and 30°, for example, in the directions parallel with and perpendicular to the active layer respectively. The GaN-type semiconductor lasers LD1–LD7 are arranged such that their emission points are arranged in line in the direction parallel with the active layers.

Accordingly, laser beams B1–B7 emitted from the respective emission points enter the long and narrow collimator lenses 11–17 such that direction with the large spread angle coincide with the length direction of the collimator lenses 11–17 and the direction with the small spread angle coincide with the width direction (i.e., the direction perpendicular to the length direction) of the collimator lenses 11–17. Each of the collimator lenses 11–17 measures 1.1 mm in width and 4.6 mm in length, and each of laser beams B1–B7 entering the collimator lenses 11–17 has beam diameters 0.9 mm and 2.6 mm in the horizontal direction and the vertical direction, respectively. Each of the collimator lenses 11–17 is such that the focal length $f_1$ is 3 mm, NA is 0.6, and the length arrangement pitch is 1.25 mm.

The condenser lens 20 has such a shape as obtained by cutting out a long and narrow portion including the optical axis of a circular lens having an aspherical surface by parallel planes, and is oriented such that its length direction coincides with the arrangement direction of the collimator lenses 11–17. That is, the horizontal direction, and its width direction coincides with the direction perpendicular to the arrangement direction of the collimator lenses 11–17. The condenser lens 20 is such that the focal length $f_2$ is 23 mm and NA is 0.2. For example, the condenser lens 20 can also be formed by molding resin or optical glass.

Operation of Laser Annealer

Next, the operation of the laser annealer will be described.

In each illumination head 166 of the scanner 162, laser beams B1–B7 that are emitted, as divergent beams, from the respective GaN-type semiconductor lasers LD1–LD7 of each multiplexing laser light source of the fiber array light source 66 are converted into parallel beams by the respective collimator lenses 11–17. The parallel laser beams B1–B7 are converged by the condenser lens 20 on the incidence end face of the core 30a of the multi-mode optical fiber 30.

In this example, the collimator lenses 11–17 and the condenser lens 20 constitute a condensing optical system, and the condensing optical system and the multi-mode optical fiber 30 constitute a multiplexing optical system. That is, laser beams B1–B7 converged by the condenser lens 20 in the above manner enter the core 30a of the multi-mode optical fiber 30 and travel through the optical fiber 30 to form a single, multiplexed laser beam B, which is output from the optical fiber 31. The optical fiber 31 is connected to the exit end of the multi-mode optical fiber 30.

Where in each laser module 64 the coupling efficiency of laser beams B1–B7 with the multi-mode optical fiber 30 is 0.85 and the output power of each of the GaN-type semiconductor lasers LD1–LD7 is 30 mW (in the case of using single-mode lasers), each of the optical fibers 31 arranged in array form can produce a multiplexed laser beam B having an output power of 180 mW (=30 mW×0.85×7). Thus, the output power of the laser light exit section 68 in which 100 optical fibers 31 are arranged in array form is about 18 W (180 mW×100).

In this manner, in the laser light exit section 68 of the fiber array light source 66, high-luminance emission points are arranged in line in the main scanning direction. A conventional fiber light source in which laser light emitted from a single-mode semiconductor laser is input to a single optical fiber is of a low output power, and hence to obtain a desired output power fiber light sources need to be arranged in a number of lines. In contrast, the multiplexing laser light source used in this embodiment is of a high output power, and hence laser light sources that are arranged in a small number of lines, for example, even a single line, can produce a desired output power.

For example, in a conventional fiber light source in which a semiconductor laser and an optical fiber are coupled to each other one by one, usually a semiconductor laser having an output power of about 30 mW (milliwatts) is used. Also, a multi-mode optical fiber whose core diameter is 50 μm, clad diameter is 125 μm, and NA (numerical aperture) is 0.2 is used. To obtain an output power of about 18 W, it is necessary to bundle 864 (8×108) multi-mode optical fibers. The area of an emission region is 13.5 mm² (1 mm×13.5 mm), and the luminance (brightness) of a laser light exit section 68 is 1.3 MW/m² and the luminance per optical fiber is 8 MW/M².

In contrast, in this embodiment, an output power of about 18 W can be obtained by 100 multi-mode optical fibers 30. Since the area of the emission region of the laser light exit section 68 is 0.3125 mm² (0.025 mm×2.5 mm), the luminance of the laser light exit section 68 is 57.6 MW/M², which is about 44 times greater than in the conventional case. The luminance per optical fiber is 288 MW/M², which is about 36 times greater than in the conventional case.

With reference to FIGS. 15A and 15B, a description will be made of a difference in the depth of focus between a low-luminance illumination head and the high-luminance illumination head 166 according to this embodiment. The width in the auxiliary scanning direction of the emission region of bundled fiber light sources of the low-luminance illumination head is 1.0 mm, and that of the fiber array light source 66 of the high-luminance illumination head 166 according to this embodiment is 0.025 mm. As shown in FIG. 15A, in the low-luminance illumination head, the emission region of the light source (bundled fiber light sources) 1 is large. The angle of a light flux incident on a scanning surface 5 becomes large because the angle of a light flux incident on the DMD 3 is large. Thus, the beam diameter tends to become thick when a deviation occurs in the focusing direction.

As shown in FIG. 15B, in the high-luminance illumination head 166 according to this embodiment, the width in the auxiliary scanning direction of the emission region of the fiber array light source 66 is small. The angle of a light flux that is incident on the DMD 50 after passing through the lens system 67 becomes small because the angle of a light flux incident on the scanning surface 56 is small, that is, the depth of focus is great. In this example, the width of the emission region in the auxiliary scanning direction is about 1/30 of that of the conventional example; a depth of focus almost equal to a diffraction-limited one can be obtained. Thus, the illumination head 166 of this embodiment is suitable for laser annealing with very small spots. This feature relating to the depth of focus is more remarkable and effective as the light intensity required for the illumination head 166 increases. In this example, the size of each pixel that is projected to the annealing surface is 10 μm×10 μm. Although the DMD 50 is a reflection-type spatial light modulator, FIGS. 15A and 16B are drawn as development diagrams to facilitate understanding of optical relationships.

Image data corresponding to an annealing pattern are input to the controller (not shown) that is connected to the DMD 50 and temporarily stored in a frame memory of the controller. The image data are binary data that represent densities of respective pixels (i.e., presence or absence of each dot) constituting an image.

The stage 152 that adheres to the transparent substrate 150 on its surface moves by a driving device (not shown) at a constant speed downstream with respect to the gate 160 along the guides 158. When the front end of the transparent substrate 150 is detected by the sensors 164 attached to the gate 160 as the stage 152 goes under the gate 160, sequential reading a plurality of lines of the image data stored in the frame memory starts. A control signal for each illumination head 166 is generated on the basis of image data that have been read by the data processing section. The micromirrors of the DMD 50 are on/off-controlled individually for each illumination head 166 by the mirror drive control section on the basis of the generated control signal.

Laser light emitted from the fiber array light source 66 is converted into parallel light by the combination lenses 71. Then the laser light is corrected by the combination of lenses 73 so that an approximately uniform light intensity distribution is produced on the illumination surface of the DMD 50. In this way, the laser light is focused onto the DMD 50 by the focusing lens 75. Of the laser light incident on the DMD 50, laser beams reflected by on-state micromirrors of the DMD 50 are imaged on the annealing surface 56 of the transparent substrate 150 by the lens systems 54 and 58. In this manner, laser light emitted from the fiber array light source 66 is switched on/off on a pixel-by-pixel basis whereby the transparent substrate 150 is laser-illuminated and annealed in units of pixels of approximately the same number as the number of pixels used of the DMD 50 (i.e., in units of an illumination area 168). When the transparent substrate 150 moves at a constant speed together with the stage 152, the scanner 162 scans the transparent substrate 150 in the auxiliary direction opposite to the stage moving direction. Band-shaped illumination completion areas 170 are formed for the respective illumination heads 166.

Figure 26:
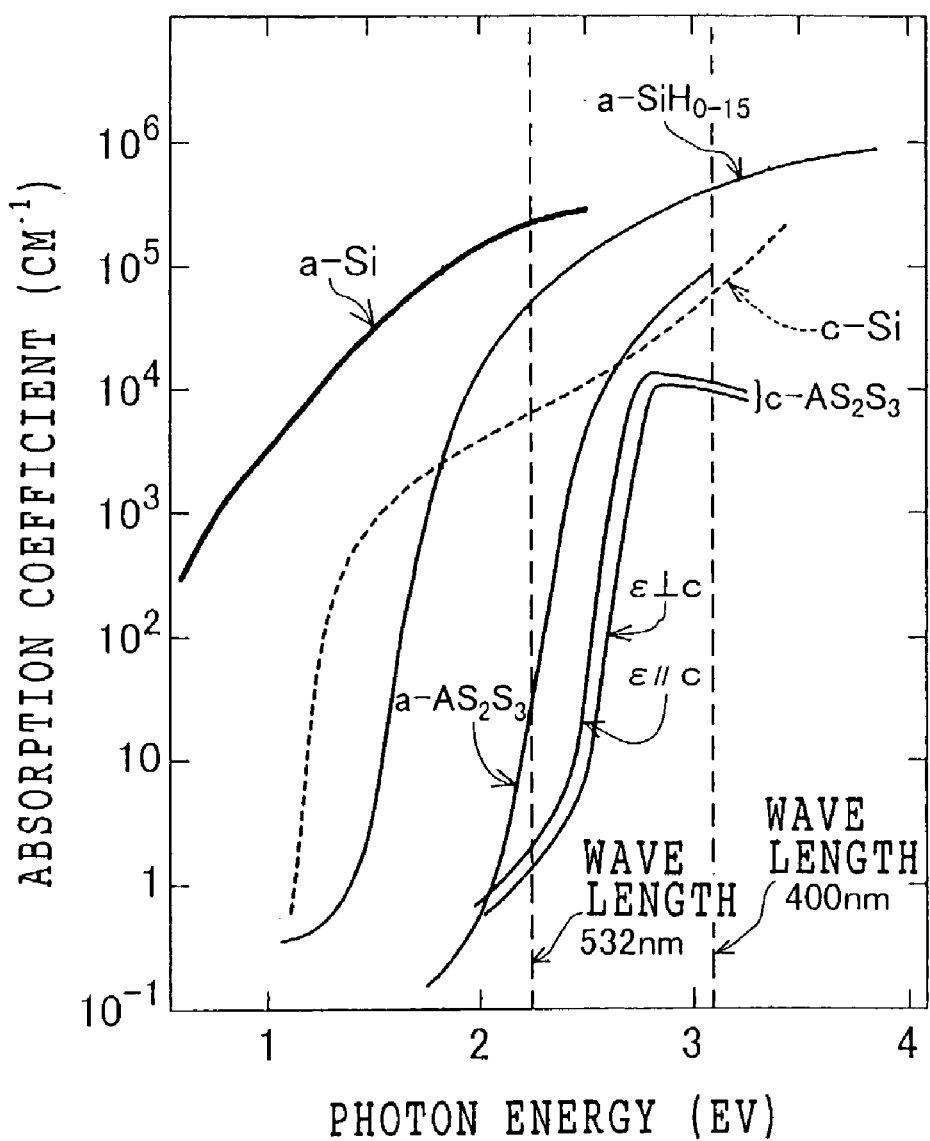
FIG. 26 is a graph showing absorption characteristics of amorphous silicon etc.

As written by Kazuo MORIGAKI in his "Fundamentals of Amorphous Semiconductors," Ohm-Sha, Ltd., p. 90, 1982, amorphous silicon has absorption characteristics shown in FIG. 26. As is understood from FIG. 26, the light absorption coefficients of amorphous silicon varies with the wavelength of illumination light. The GaN-type semiconductor lasers (wavelength: 405 nm) are used in this embodiment. As shown in FIG. 26, amorphous silicon hydride (a-SiH$_{0.16}$) exhibits a sufficiently large absorption coefficient of $10^5$ cm$^{-1}$ or more for laser light of a 400-nm wavelength band. it is estimated that amorphous silicon (a-Si) also exhibits an absorption coefficient of $10^5$ cm$^{-1}$ or more. Thus, annealing can be performed efficiently by using laser light in a wavelength band of 350 to 450 nm. With regard to the absorption coefficient, the use of a wavelength band of 370 to 410 nm is often used. The use of a wavelength band of 370 to 375 nm is also used where the GaN-type semiconductor laser produces a relatively large output power and amorphous silicon exhibits a large absorption coefficient. The photon energy and the wavelength have a relationship 1 eV=8.0655×10$^3$ cm$^{-1}$, hence wavelengths 532 nm and 400 nm correspond to 2.3 eV and 3.1 eV respectively.

Figure 16A:
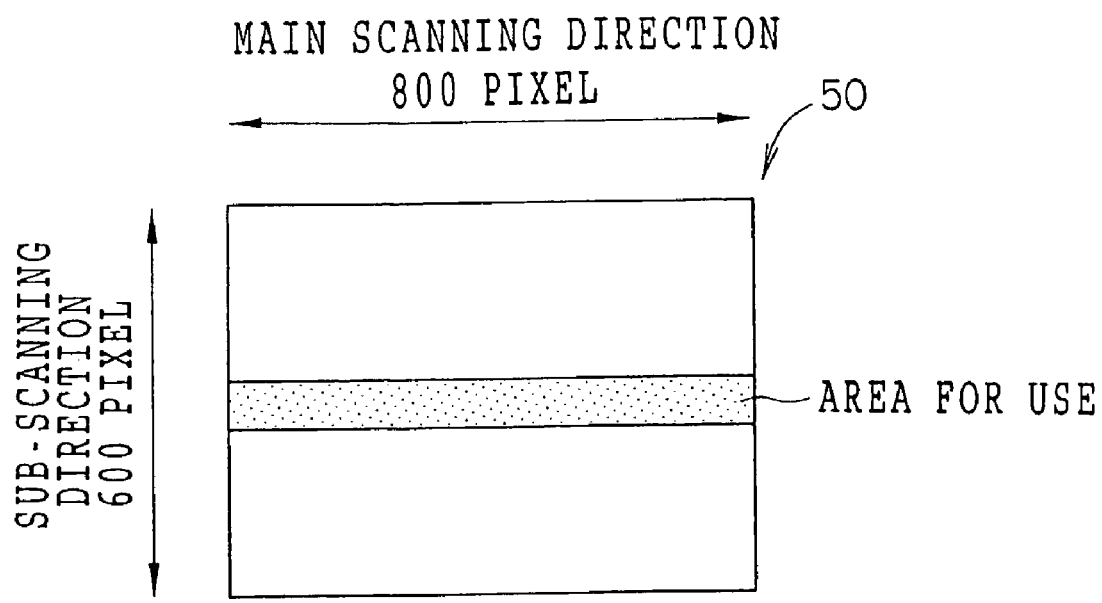
FIGS. 16A and 16B show exemplary use areas of the DMD.
Figure 16B:
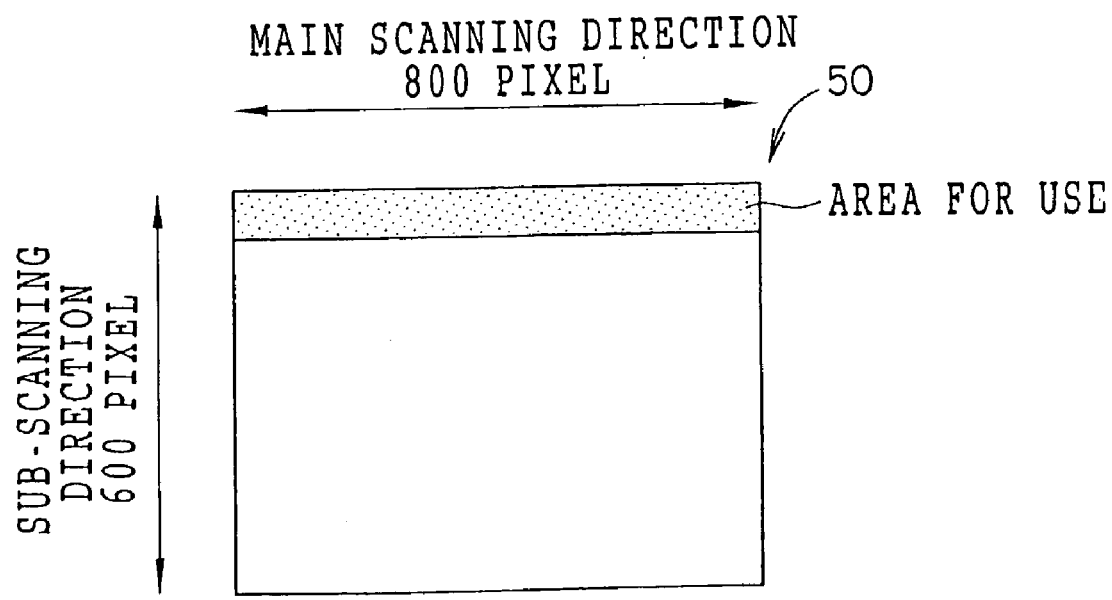

As shown in FIGS. 16A and 16B, in the DMD 50, 600 micromirror lines in each of which 800 micromirrors are arranged in the main scanning direction are arranged in the auxiliary scanning direction. In this embodiment, the DMD 50 can be controlled by the controller such that some of the lines of the micromirrors (e.g., 800×10 lines) are driven.

Micromirror lines located at the center of the DMD 50 may be used as shown in FIG. 16A, or micromirror lines located at an end of the DMD 50 may be used as shown in FIG. 16B. Should the trouble occur in some micromirrors, other normal micromirror lines may be used. In this manner, micromirror lines used may be changed as appropriate in accordance with a situation.

The data processing speed of the DMD 50 has a certain limit and the modulation rate per line is determined in proportion to the number of pixels used. Thus, the modulation rate per line increases by using only part of the micromirror lines. In a scanning method in which illumination heads are moved relative to the annealing surface continuously, it is not necessary to use all of the pixels in the auxiliary scanning direction.

For example, where only 300 lines of the 600 micromirror lines are used, the modulation can be performed twice as fast for each line than a case that all the 600 lines are used. Where only 200 lines of the 600 micromirror lines are used, the modulation can be performed three times faster for each line than a case that all the 600 lines are used. That is, a region measuring 500 mm in the auxiliary scanning direction can be laser-illuminated in 17 seconds. Where only 100 lines of the 600 micromirror lines are used, the modulation can be performed six times faster for each line than in a case that all the 600 lines are used. That is, a region measuring 500 mm in the auxiliary scanning direction can be laser-illuminated in 9 seconds.

The number of lines of micromirrors for use, that is, the number of the micromirrors arranged in the auxiliary scanning direction may be in a range from 10 to 200. Another range is from 10 to 100. The area of one micromirror corresponding to one pixel is 15 μm×15 μm. Thus, in terms of the area used of the DMD 50, the area may be in a range from 12 mm×150 μm to 12 mm×3 mm. In some cases, the area may be in a range from 12 mm×150 μm to 12 mm×1.5 mm.

As long as the number of lines of micromirrors used is in the above range, as shown in FIGS. 17A and 17B laser light emitted from the fiber array light source 66 can be converted into approximately parallel light by the lens system 67 and applied to the DMD 50. The illumination area to which laser light reflected from the DMD 50 is applied may coincide with the use area of the DMD 50. If the illumination area is wider than the use area of the DMD 50, the efficiency of utilization of laser light lowers.

It is necessary to decrease, by the lens system 67, the diameter of a light beam focused on the DMD 50 in accordance with the number of micromirrors used that are arranged in the auxiliary scanning direction. The number of micromirrors for use being smaller than 10 is not normally used because the angle of a light flux incident on the DMD 50 will become excessively large and the depth of focus at the scanning surface 56 will become unduly small. With regard to the modulation rate, the number of micromirrors for use may be smaller than or equal to 200. Although the DMD 50 is a reflection-type spatial light modulator, FIGS. 17A and 17B are drawn as development diagrams to facilitate understanding of optical relationships.

A light density on the exposure surface will be calculated below. As described above, the output power of each illumination head 166 is about 18 W. Only part (e.g., 800×10 lines) of the micromirrors of the DMD 50 are used, and the area of the illumination area 168 (i.e., the beam size on the exposure surface) of each illumination head 166 is equal to 150 μm×12 mm. Where the 150-μm area is exposed to light in 1 ms, the light density on the exposure surface is 1,000 mJ/cm$^2$. If the loss of the optical system is estimated to be about 50%, the light density on the exposure surface is 500 mJ/cm$^2$. In the entire scanner 162 equipped with the 14 illumination heads 166, the number of arrayed optical fibers 31 is equal to 1,400 and the total output power is 252 W. The sum of the areas of the illumination areas 168 is equal to 150 μm×168 mm. The light density on the exposure surface is 500 mJ/cm$^2$.

Where multi-mode lasers having an output power 100 mW is used in the multiplexing laser light source of each illumination head 166, a multiplexed laser beam B having an output power 600 mW can be obtained by seven laser diodes. An output power of about 18 W can be obtained by 30 optical fibers 31. In the entire scanner 162 that is equipped with the 14 illumination heads 166, the number of arrayed optical fibers 31 is equal to 420 and the total output power is 252 W. The sum of the areas of the illumination areas 168 is equal to 150 μm×168 mm and the light density on the exposure surface is 500 mJ/cm².

When auxiliary scanning of the transparent substrate 150 with the scanner 162 has been finished and the rear end of the transparent substrate 162 has been detected by the sensors 164, the stage 152 returns to the origin that is the farthest upstream position from the gate 160 along the guides 158 by the driving device (not shown). Then, the stage 152 moves from upstream to downstream along the guides 158 at a constant speed.

As described above, the high-quality GaN-type semiconductor lasers are used in the laser light source alternative to an excimer laser that is a gas laser. The laser annealer according to this embodiment provides the following features (1) to (6):

(1) The optical output power is stabilized and polysilicon films having uniform crystal grain sizes can be manufactured with high reproducibility.

(2) Being solid-state semiconductor lasers, the GaN-type semiconductor lasers can be driven over tens of thousands of hours and highly reliable. The GaN-type semiconductor lasers are formed by covalent bonds, and their light exit end faces are not prone to damage called COD (catastrophic optical damage) and hence they are highly reliable and can attain a high peak power.

(3) The apparatus can be made smaller, can be maintained much more easily, and is higher in energy efficiency of 10% to 20% compared to the case of using an excimer laser that is a gas laser.

(4) Basically, cw (continuous wave) driving is possible for the GaN-type semiconductor lasers. Thus, even in the case of pulsed driving, the repetition frequency and the pulse width (i.e., duty cycle) can be set freely in accordance with the absorbance and the heat generation rate of amorphous silicon. For example, the repetition frequency can be set arbitrarily in a range of several hertz to several megahertz and the pulse width can be set arbitrarily in a range of several picoseconds to hundreds of milliseconds. Particularly, the repetition frequency can be set even in a band of tens of megahertz. As such, the GaN-type semiconductor lasers enable formation of continuous crystal grain boundaries by pulsed driving as well as by cw driving. Further, a high repetition frequency enables high-speed annealing.

(5) An annealing surface can be scanned in a prescribed direction with cw laser light by cw-driving the GaN-type semiconductor lasers. This makes it possible to control the crystal growth direction and to form continuous crystal drain boundaries, which in turn makes it possible to form a polysilicon film having a high carrier mobility.

(6) Laser light in a wavelength range of 350 to 450 nm can be produced. In particular, a high output power can be obtained in a wavelength range of 370 to 410 nm (405 nm in particular) where amorphous silicon exhibits high absorbance. Amorphous silicon can thus be crystallized efficiently. It is expected that in the future the output power of GaN-type semiconductor lasers will be increased further.

Further, the laser annealer according to this embodiment employs, as a laser light source, the fiber array light source in which the exit end portions of the optical fibers of the multiplexing laser light sources are arranged in array form. This provides the following advantages (1) to (3):

(1) In laser annealers, in general, a high light density in a range from 400 to 700 mJ/cm² is needed on the annealing surface (i.e., exposure surface). In this embodiment, a high output power and a high light density of multiple beams can easily be attained by increasing the number of fibers arrayed and the number of laser beams multiplexed. For example, if the output power of a single multiplexing laser light source is 180 mW, a high output power of 100 W can be obtained stably by bundling 556 multiplexing laser light sources. In addition, the beam quality is stable and the power density is high. Thus, the apparatus can accommodate future increase in the low-temperature polysilicon film formation area and in throughput.

(2) The exit end portion of each optical fiber can be attached replaceably by using a connector or the like, which facilitate maintenance.

(3) Each laser module is a small multiplexing module in which small semiconductor lasers are combined together, and the light source section can be made much smaller than in the case of using an excimer laser.

In the laser annealer according to this embodiment, the GaN-type semiconductor lasers in a wavelength range of 350 to 450 nm are employed. It is not necessary to generate a line beam using an optical system made of a special material for ultraviolet light as in ELA apparatuses. As in the case of visible-range laser exposure apparatuses, high-resolution annealing with an arbitrary pattern can be performed by using a spatial light modulator such as a DMD.

Particularly, in this embodiment, the clad diameter of the exit end of each optical fiber is made smaller than that of the incidence end. The diameter of the emission portion is thus small, which increases the luminance of the fiber array light source. This makes it possible to realize a laser annealer having a great depth of focus. For example, ultra-high-resolution annealing in which the beam diameter is 1 μm or less and the resolution is 0.1 μm or less can be performed at high speed with a great depth of focus.

The laser annealer according to this embodiment employs the DMD in which 600 micromirror lines in each of which 800 micromirrors are arranged in the main scanning direction are arranged in the auxiliary scanning direction. The controller controls the DMD such that only part of the micromirror lines are driven. Thus, the modulation rate per line is made faster than in the case that all the micromirror lines are driven. This makes it possible to perform laser annealing at an even higher speed.

Further, in the laser annealer according to this embodiment, the light intensity distribution correcting optical system makes it possible to illuminate the spatial light modulator with light having an almost uniform light intensity distribution, whereby laser annealing can be performed while the exposure surface is illuminated without unevenness.

Second Embodiment

A laser annealer according to the second embodiment is such that a grating light valve (GLV) is used as a spatial light modulator in each of the illumination heads $166_{11}$ to $166_{mn}$. As disclosed in U.S. Pat. No. 5,311,360, for example, the GLV is a kind of MEMS (microelectromechanical systems)-type spatial light modulator and is a reflection diffraction grating type spatial light modulator. In the other points, the laser annealer according to the second embodiment is approximately the same as that according to the first embodiment that has been described above with reference to FIGS. 1–14. Thus, components common to the first embodiment will not be described.

Figure 31:
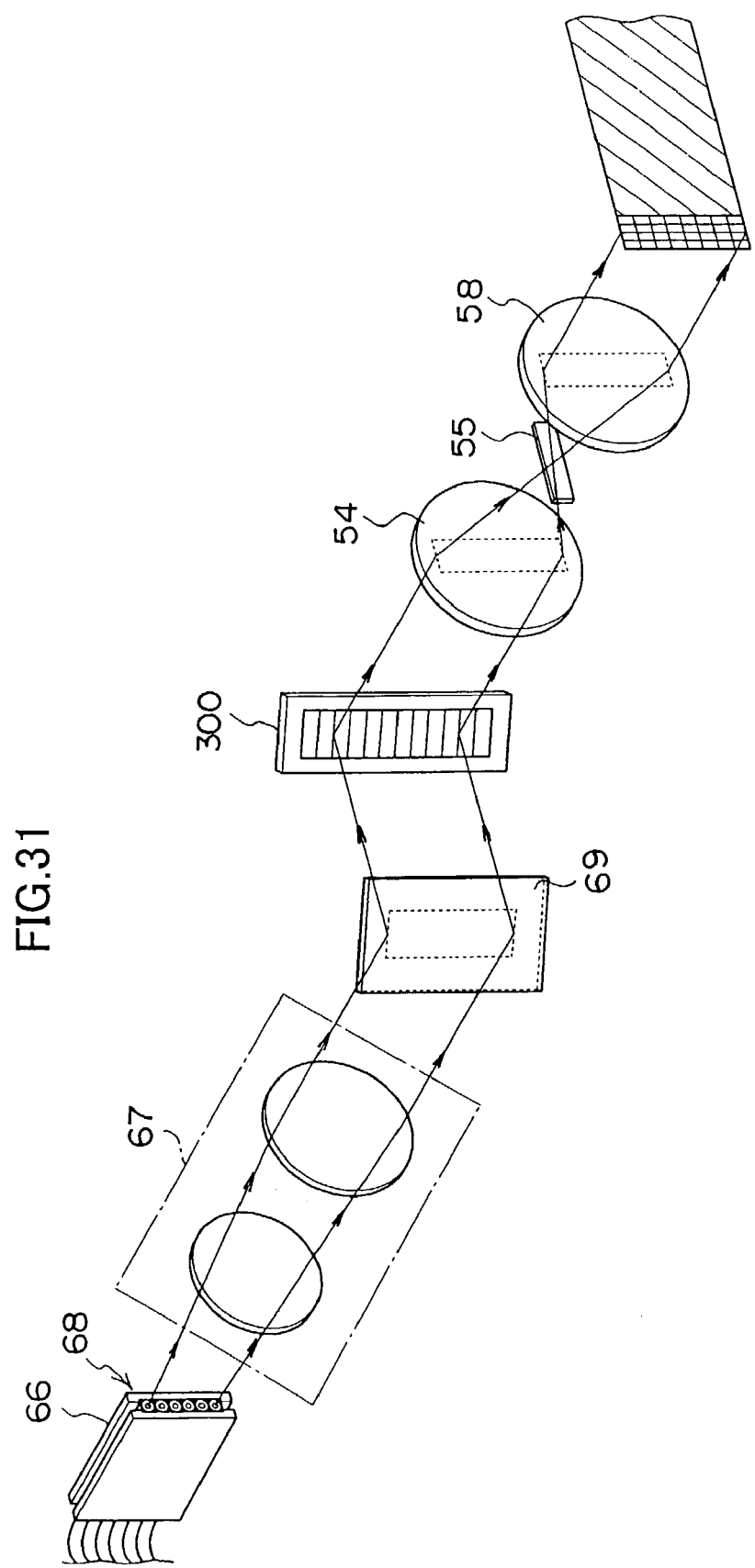
FIG. 31 is a perspective view showing a general configuration of one illumination head of a laser annealer according to a second embodiment.

In this embodiment, as shown in FIGS. 31, 32A, and 32B, each of the illumination heads $166_{11}$, to $166_{mn}$ is equipped, as a spatial light modulator for modulating an incident light beam on a pixel-by-pixel basis in accordance with image data, with a GLV 300 that is long in a prescribed direction (i.e., line-shaped). As in the case of the first embodiment, the fiber array light source 66, the lens system 67, and the mirror 69 are arranged in this order on the light incidence side of the GLV 300. The lens systems 54 and 58 are disposed on the light exit side of the GLV 300.

The line-shaped GLV 300 is oriented such that its longitudinal direction is parallel with the optical fiber arrangement direction of the fiber array light source 66 and the reflecting surfaces of ribbon-shaped microbridges of the GLV 300 are approximately parallel with the reflecting surface of the mirror 69. The GLV 300 is connected to a controller (not shown).

Figure 33:
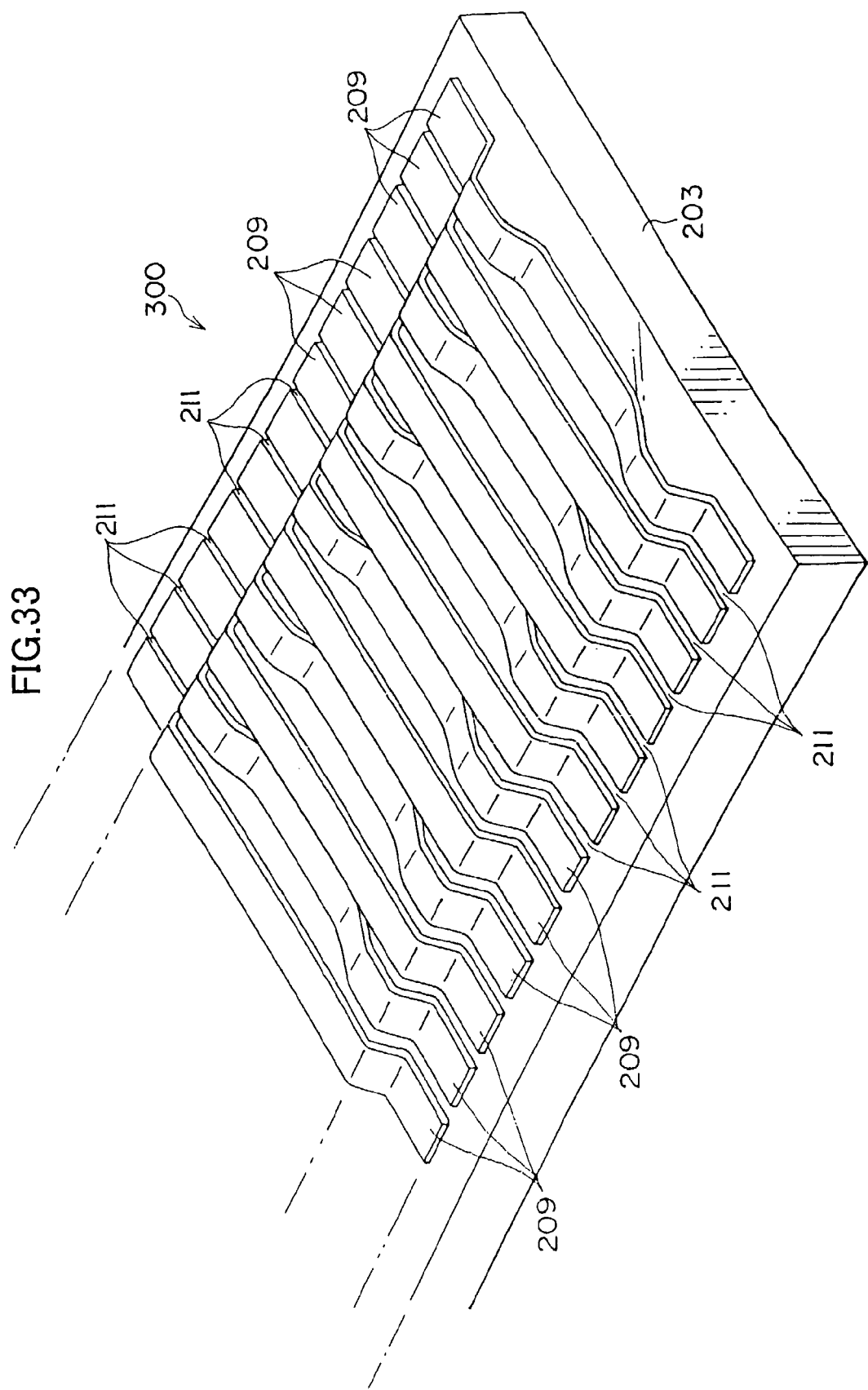
FIG. 33 is a partial enlarged view showing the structure of a grating light valve (GLV)

As shown in FIG. 33, the GLV 300 is configured such that a number of (e.g., 6,480) microbridges 209 each having a ribbon-shaped reflecting surface are arranged parallel with each other on a long substrate 203 made of silicon or the like. A slit 211 is formed between adjoining ones of the microbridges 209. Usually, one pixel consists of a plurality of (e.g., six) microbridges 209. If one pixel consists of six microbridges 209, 6,480 microbridges 209 enables exposure by 1,080 pixels.

Figure 34A:
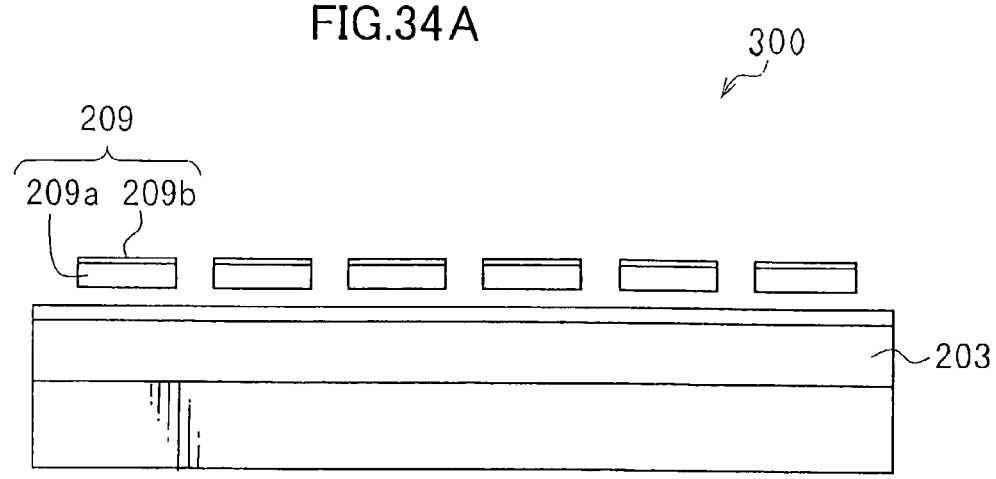
FIGS. 34A and 34B illustrate how the GLV operates.
Figure 34B:
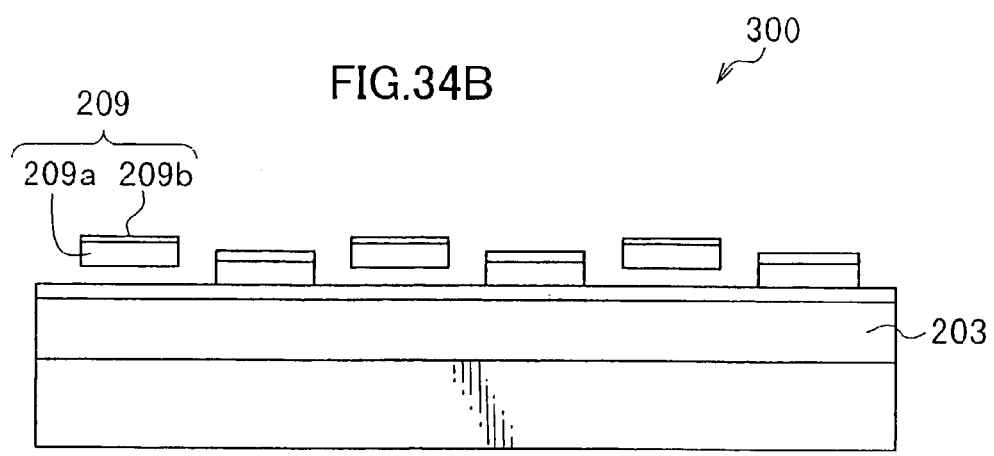

As shown in FIGS. 34A and 34B, each microbridge 209 is configured such that a reflection electrode film 209b that is an aluminum (alternatively gold, silver or copper) single-layer metal film is formed on the surface of a flexible beam 209a made of silicon nitride ($SiN_x$) or the like. Each reflection electrode film 209b is connected to a power source via a line and a switch (both not shown).

The principle of operation of the GLV 300 will be described below briefly. In a state that no voltage is applied to a microbridge 209, the microbridge 209 is separated from the substrate 203 by a prescribed distance. When a voltage is applied between the microbridge 209 and the substrate 203, electrostatically induced charges cause electrostatic attractive force between the microbridge 209 and the substrate 203, whereby the microbridge 209 is bent toward the substrate 203. When the application of the voltage stops, the bend ceases and the microbridge 209 separates from the substrate 203 as an elastic return. Thus, a diffraction grating can be formed by alternately arranging microbridges 209 to which a voltage is applied and microbridges 209 to which no voltage is applied.

FIG. 34A shows a state that no voltage is applied to microbridges 209 of one pixel hence they are in an off-state. In the off-state, the reflecting surfaces of all of those microbridges 209 have the same height and hence they reflect light specularly without causing any optical path difference. That is, they produce only a 0th diffraction beam. FIG. 34B shows a state that a voltage is applied to the microbridges 209 of one pixel and hence they are in an on-state. The voltage is applied to every other microbridge 209. In the on-state, the central portions of the microbridges 209 to which the voltage is applied (i.e., alternate microbridges 209) are bent according to the above-described principle, whereby alternately stepped reflecting surfaces are formed, that is, a diffraction grating is formed. When laser light is applied to those reflecting surfaces, an optical path difference occurs between light reflected from the bent microbridges 209 and light reflected from the non-bent microbridges 209, whereby 1st diffraction beams are output in prescribed directions.

In this manner, laser light incident on the GLV 300 is modulated and diffracted to the prescribed directions pixel by pixel by on/off-controlling a voltage that is applied to the microbridges 209 of each pixel of the GLC 300 in accordance with a control signal from the controller (not shown).

The lens systems 54 and 58 for imaging diffraction light on the scanning surface (exposure surface) 56 are disposed on the light reflection side of the GLV, that is, on the side to which diffraction light (0th diffraction beam and ±1st diffraction beams) is output, such that the GLV 300 and the exposure surface 56 are in a conjugate relationship. To allow diffraction light to enter the lens system 54, the ribbon-shaped reflecting surfaces of the GLV 300 are inclined in advance from the optical axis of the lens system 54 by a prescribed angle (e.g., 45°).

In FIGS. 32A and 32B, a 0th diffraction beam is indicated by broken lines and 1st diffraction beams are indicated by solid lines. The lens system 54 converges incident diffraction light in the longitudinal direction of the GLV 300 and converges it into parallel light in the auxiliary direction. A long shield plate 55 for removing the 0th diffraction beam from the optical path toward the scanning surface 56 is disposed at the converging position of the 0th diffraction beam between the lens systems 54 and 58 such that the longitudinal direction of the shield plate 55 is perpendicular to that of the GLV 300. As a result, only the 0th diffraction beam is eliminated selectively.

In this laser annealer, when image data corresponding to an annealing pattern are input to the controller (not shown) connected to the GLV 300, control signals are generated on the basis of the image data and the microbridges 209 of the GLV 300 are on/off-controlled pixel by pixel on the basis of the generated control signal in each illumination head 166. When laser light is applied to the GLV 300 from the fiber array light source 66, laser light that is reflected when the microbridges 209 of a certain pixel of the GLV 300 are in an on-state is imaged on the annealing surface 56 of the transparent substrate 150 by the lens systems 54 and 58.

As described above, laser light emitted from the fiber array light source 66 is turned on or off on a pixel by pixel basis and an amorphous silicon film that is deposited on the transparent substrate 150 is laser-illuminated and annealed for each of pixels that are approximately the same in number as the pixels of the GLV 300. The transparent substrate 150 moves at a constant speed together with the stage 152, and the transparent substrate 150 is scanned by the scanner 152 in the auxiliary scanning direction, that is, in the direction opposite to the stage moving direction whereby band-shaped illumination completion areas 170 are formed for the respective illumination heads 166.

A light density on the exposure surface will be calculated as follows. As in the first embodiment, single-mode lasers having an output power 30 mW are used in the multiplexing laser light source of each illumination head 166, seven laser diodes can produce a multiplexed laser beam B having an output power 180 mW. Thus, in the fiber array light source 66 in which 50 optical fibers 31 are arranged in one-dimensional array form, the output power of the laser light exit section 68 is about 9 W.

Where all of the pixels (e.g., 1,000 pixels×1 line) of the GLV 300 are used, the area of the illumination area 168 of each illumination head 166 is equal to 25 μm×25 mm. Where the 25-μm area is exposed to light in 1 ms, the light density on the exposure surface is 1,440 $mJ/cm^2$. If the loss of the optical system is estimated to be about 50%, the light density on the exposure surface is 720 $mJ/cm^2$. In the entire scanner 162 that is equipped with the 14 illumination heads 166, the number of arrayed optical fibers 31 is equal to 700 and the total output power is 126 W. The sum of the areas of the illumination areas 168 is equal to 25 μm×350 mm and the light density on the exposure surface is 720 $mJ/cm^2$.

Where multi-mode lasers having an output power 100 mW is used in the multiplexing laser light source of each illumination head 166, a multiplexed laser beam B having an output power 600 mW can be obtained by seven laser diodes. An output power of about 9 W can be obtained by 15 optical fibers 31. In the entire scanner 162 that is equipped with the 14 illumination heads 166, the number of arrayed optical fibers 31 is equal to 210 and the total output power is 126 W. The sum of the areas of the illumination areas 168 is equal to 25 μm×350 mm and the light density on the exposure surface is 720 mJ/cm$^2$.

As described above, in the laser annealer according to this embodiment, it is difficult to attain efficient illumination because the GLV 300 is a long and narrow spatial light modulator. As in the case of the first embodiment, the high-luminance fiber array light source in which the exit end portions of the optical fibers of the multiplexing laser light sources are arranged in array form is used as the light source for illuminating the GLV 300 and the clad diameter of the exit end of each optical fiber is made smaller than that of the incidence end. The diameter in the auxiliary scanning direction of a beam emitted from the laser light exit section 68 is small, hence the angle of a light flux that is incident on the GLV 300 after passing through the lens system 67 and being reflected by the mirror 69 is small. This makes it possible to illuminate the GLV 300 efficiently and to realize a great depth of focus. Further, the use of the multiplexing laser light sources enables annealing with a high power hence reduces the cost of the laser annealer.

In the laser annealer according to this embodiment, the light intensity distribution correcting optical system makes it possible to illuminate the spatial light modulator with light having an almost uniform light intensity distribution, whereby laser annealing can be performed while the exposure surface is illuminated without unevenness.

Further, in the laser annealer according to this embodiment, the GaN-type semiconductor lasers in a wavelength range of 350 to 450 nm are employed. It is not necessary to generate a line beam using an optical system made of a special material for ultraviolet light as in ELA apparatuses. As in the case of visible-range laser exposure apparatuses, high-resolution annealing with an arbitrary pattern can be performed by on/off-controlling the GLV 300.

Furthermore, like the laser annealer according to first embodiment, the laser annealer according to this embodiment provides the advantages due to the use of the GaN-type semiconductor lasers and the fiber array light source in which the exit end portions of the optical fibers of the multiplexing laser light sources are arranged in array form.

Third Embodiment

As shown in FIGS. 35, 36A, and 36B, a laser annealer according to a third embodiment is configured in approximately the same manner as the laser annealer according to the first embodiment shown in FIG. 1 except that the scanner 162 is equipped with only a single illumination head 500 and that the illumination head 500 does not have a spatial light modulator. The same components as in the first embodiment will not be described.

In this embodiment, as shown in FIG. 35, the scanner 162 is equipped with only the single illumination head 500 for annealing. An illumination area 502 of the illumination head 500 has a long line shape extending perpendicularly to the auxiliary scanning direction.

As shown in FIGS. 36A and 36B, the illumination head 500 is composed of a fiber array light source 506 having a laser light exit section 68 in which the exit ends (emission points) of a number of (e.g., 1,200) optical fibers 30 are arranged in line perpendicularly to the auxiliary scanning direction and a cylindrical lens 510 for focusing laser light emitted from the fiber array light source 506 only in the direction perpendicular to the arrangement direction of the exit ends of the optical fibers 30 and for imaging the laser beam on the scanning surface (annealing surface) 56 of the transparent substrate 150.

The cylindrical lens 510 is curved in a prescribed plane and is long in the direction perpendicular to the prescribed plane. The cylindrical lens 510 is oriented such that its longitudinal direction (i.e., the direction perpendicular to the prescribed plane) is parallel with the arrangement direction of the exit ends of the optical fibers 30. Although an illumination optical system for making a beam uniform is omitted in this example to simplify the description, a fly-eye lens system as a beam uniformizing illumination optical system or a light intensity distribution correcting optical system as described in this specification may be used.

In this laser annealer, laser light emitted from the fiber array light source 506 is focused by the cylindrical lens 510 only in the direction perpendicular to the arrangement direction of the exit ends of the optical fibers 30 and thereby imaged on the annealing surface 56 in line form. The cylindrical lens 510 functions as a magnifying optical system that magnifies a beam diameter by a factor of 3, for example, in the shorter-axis direction and by a factor of 1 in the longer-axis direction. The transparent substrate 150 is moved at a constant speed together with the stage 152, and is scanned with a line beam of the illumination head 500 of the scanner 162 in the auxiliary scanning direction, that is, in the direction opposite to the stage moving direction, whereby an illumination completion area 504 is formed.

As shown in FIG. 37, the fiber array light source 506 is equipped with a number of laser modules 64 to which one ends of multi-mode optical fibers 30 are connected respectively. The other ends of the multi-mode optical fibers 30 are located outside respective packages 40, and the exit ends (emission points) of the respective multi-mode optical fibers 30 are arranged in the main scanning direction perpendicular to the auxiliary scanning direction to form the laser light exit section 68. That is, the fiber array light source 506 is the same as the fiber array light source 66 of FIG. 9 except that no optical fibers having a small clad diameter are connected to the exit ends of the optical fibers 30. The components having the same components in the fiber array light source 66 of FIG. 9 are given the same reference numerals as the latter and will not be described.

A light density on the exposure surface will be calculated below. As in the case of the first embodiment, single-mode lasers having an output power 30 mW are used in the multiplexing laser light source of the illumination head 500, seven laser diodes can produce a multiplexed laser beam B having an output power 180 mW. Thus, in the fiber array light source 506 in which 1,200 multi-mode optical fibers 30 are arranged in line, the output power of the laser light exit section 68 is about 216 W.

Where step-index optical fibers whose clad diameter is 125 μm, core diameter is 50 μm, and NA is 0.2 are used as the multi-mode optical fibers 30, the beam cross-section at the laser light exit section 68 measures 50 μm×150 mm. If the beam diameter is magnified by a factor of 3 in the shorter-axis direction and by a factor of 1 in the longer-axis direction, the area of the illumination area 502 is equal to 150 μm×150 mm. Where the illumination area 502 is exposed to light in 1 ms, the light density on the exposure surface is 960 mJ/cm². If the loss of the optical system is estimated to be about 75%, the light density on the exposure surface is 720 mJ/cm². Thus, annealing can be performed at a rate of 150 mm/s with the width of 150 mm, that is, an area of 150 mm×150 mm can be annealed in 1 second.

As described above, in the laser annealer according to this embodiment, a line beam can easily be obtained by the fiber array light source in which the optical fibers are arranged in array form although no spatial light modulator is used.

Generally, a laser annealer requires a line beam that is focused in the shorter-axis direction and expanded in the longer-axis direction that is perpendicular to the shorter-axis direction. Usually, the line beam measures 125 to 300 mm in the longer-axis direction and 150 to 700 µm in the shorter-axis direction. The longer the line beam is in the longer-axis direction, the larger the area that can be annealed at one time is.

In the laser annealer according to this embodiment, the line beam length can be increased while the energy intensity and the energy uniformity are maintained by increasing the number of optical fibers arrayed. Thus, the laser annealer according to this embodiment is suitable for manufacture of a large-size TFT-LCD panel.

Further, like the laser annealer according to first embodiment, the laser annealer according to this embodiment provides the advantages due to the use of the GaN-type semiconductor lasers and the fiber array light source in which the exit end portions of the optical fibers of the multiplexing laser light sources are arranged in array form.

Although the above embodiment is directed to the case of using the scanner that is equipped with only the single illumination head, a plurality of illumination heads may be arranged in the longer-axis direction if the length of a line beam in the longer-axis direction is insufficient.

Fourth Embodiment

A laser annealer according to a fourth embodiment is configured in approximately the same manner as the laser annealer according to the third embodiment shown in FIG. 35 except the structure of the magnifying optical system of the illumination head. The same components as in the third embodiment will not be described.

As shown in FIGS. 38A and 38B, the illumination head 500 is composed of a fiber array light source 506 having a laser light exit section 68 in which the exit ends (emission points) of a number of (e.g., 500) optical fibers 30 are arranged in line perpendicularly to the auxiliary scanning direction, a first cylindrical lens 512 for focusing laser light emitted from the fiber array light source 506 only in the direction perpendicular to the arrangement direction of the exit ends of the optical fibers 30, a second cylindrical lens 514 for focusing, only in the arrangement direction of the exit ends of the optical fibers 30, the laser light being focused in the direction perpendicular to the arrangement direction, and for imaging the laser beam on the scanning surface (annealing surface) 56 of the transparent substrate 150.

The first cylindrical lens 512 is curved in a prescribed plane and is long in the direction perpendicular to the prescribed plane. The first cylindrical lens 512 is oriented such that its longitudinal direction (i.e., the direction perpendicular to the prescribed plane) is parallel with the arrangement direction of the exit ends of the optical fibers 30. The second cylindrical lens 514 is curved in a prescribed plane and is long in the prescribed plane. The second cylindrical lens 514 is oriented such that its longitudinal direction is parallel with the arrangement direction of the exit ends of the optical fibers 30.

In this laser annealer, laser light emitted from the fiber array light source 506 is focused by the first cylindrical lens 512 in the direction perpendicular to the arrangement direction of the exit ends of the optical fibers 30, focused by the second cylindrical lens 514 in the arrangement direction of the exit ends of the optical fibers 30, and imaged on the annealing surface 56 in line form. The cylindrical lenses 512 and 514 function as a magnifying optical system that magnifies a beam diameter by a factor of 6, for example, in the shorter-axis direction and by a factor of 2, for example, in the longer-axis direction. As shown in FIG. 35, the transparent substrate 150 is moved at a constant speed together with the stage 152, and is scanned with a line beam of the illumination head 500 of the scanner 162 in the auxiliary scanning direction, that is, in the direction opposite to the stage moving direction, whereby an illumination completion area 504 is formed.

A light density on the exposure surface will be calculated below. Where multi-mode lasers having an output power 100 mW are used in the multiplexing laser light source of the illumination head 500, seven laser diodes can produce a multiplexed laser beam B having an output power 600 mW. Thus, in the fiber array light source 506 in which 500 multi-mode optical fibers 30 are arranged in line, the output power of the laser light exit section 68 is about 300 W.

Where step-index optical fibers whose clad diameter is 125 µm, core diameter is 50 µm, and NA is 0.2 are used as the multi-mode optical fibers 30, the beam cross-section at the laser light exit section 68 measures 50 µm×62.5 mm. If the beam diameter is magnified by a factor of 6 in the shorter-axis direction and by a factor of 2 in the longer-axis direction, the area of the illumination area 502 is equal to 300 µm×125 mm. Where the illumination area 502 is exposed to light in 1 ms, the light density on the exposure surface is 800 mJ/cm². If the loss of the optical system is estimated to be about 75%, the light density on the exposure surface is 600 mJ/cm². Thus, annealing can be performed at a rate of 300 mm/s with the width of 125 mm, that is, an area of 300 mm×125 mm can be annealed in 1 second.

As described above, in the laser annealer according to this embodiment, a line beam can easily be obtained by the fiber array light source in which the optical fibers are arranged in array form, though no spatial light modulator is used. The line beam length can be increased while the energy intensity and the energy uniformity are maintained by increasing the number of optical fibers arrayed. Thus, the laser annealer according to this embodiment is suitable for manufacture of a large-size TFT-LCD panel.

Further, like the laser annealer according to first embodiment, the laser annealer according to this embodiment provides the advantages due to the use of the GaN-type semiconductor lasers and the fiber array light source in which the exit end portions of the optical fibers of the multiplexing laser light sources are arranged in array form. As in the third embodiment, illumination heads may be arranged in the longer-axis direction.

Next, modifications of the above-described laser annealers will be described.

Example in Which Mirror is Used Instead of Spatial Light Modulator

In the first and second embodiments, laser annealing is performed by using laser light that is modulated by the spatial light modulator in accordance with an annealing pattern. Where the annealing pattern is simple as in the case of annealing the entire surface, a reflecting mirror may be used instead of the spatial light modulator.

Other Uses of Laser Annealer

In the above embodiments, a low-temperature polysilicon TFTs are formed by using the laser annealer according to the invention. The laser annealer according to the invention can also be used for annealing of transparent electrode films made of ITO (indiumtinoxide), $SnO_2$ (tin dioxide) or other materials.

Other Spatial Light Modulators

In the first and second embodiments, the DMD or GLV is used as the spatial light modulator. MEMS (microelectromechanical systems) type spatial light modulators (SLMs) and non-MEMS type spatial light modulators such as an optical device in which transmission light is modulated by the electro-optical effect (i.e., a PLZT device) and a liquid crystal optical shutter (FLC) can also be used. MEMS is a generic term representing microscopic systems in which microscopic sensors, actuators, and a control circuit are integrated by the micromachining technology that is based on IC manufacturing processes. The MEMS-type spatial light modulators are spatial light modulators that are driven by electromechanical action that utilizes electrostatic force.

In the first embodiment, part of the micromirrors of the DMD are driven. Where a long and narrow DMD is used in which a number of micromirrors are arranged two-dimensionally on a substrate whose length in a direction corresponding to a prescribed direction is longer than its length in a direction crossing the prescribed direction such that the angles of their reflecting surfaces can be changed on the basis of respective control signals, the number of micromirrors whose reflecting surface angles are controlled is small and hence the modulation rate can similarly be increased. Also where a MEMS-type spatial light modulator or a non-MEMS-type spatial light modulator is used, using part of all the pixels arranged on a substrate makes it possible to increase the modulation rate per one main scanning line and hence to provide similar advantages.

Other Exposure Methods

Figure 18:
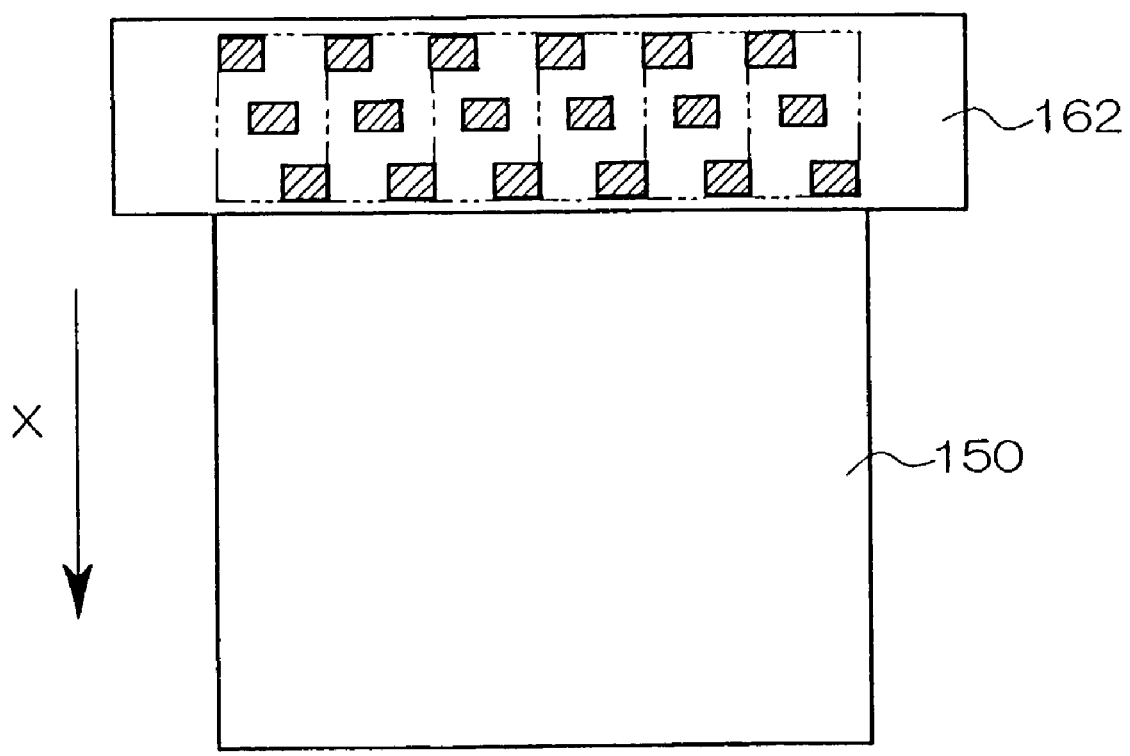
FIG. 18 is a plan view illustrating an annealing method in which the entire surface of a transparent substrate is annealed by one scan with a scanner.
Figure 19A:
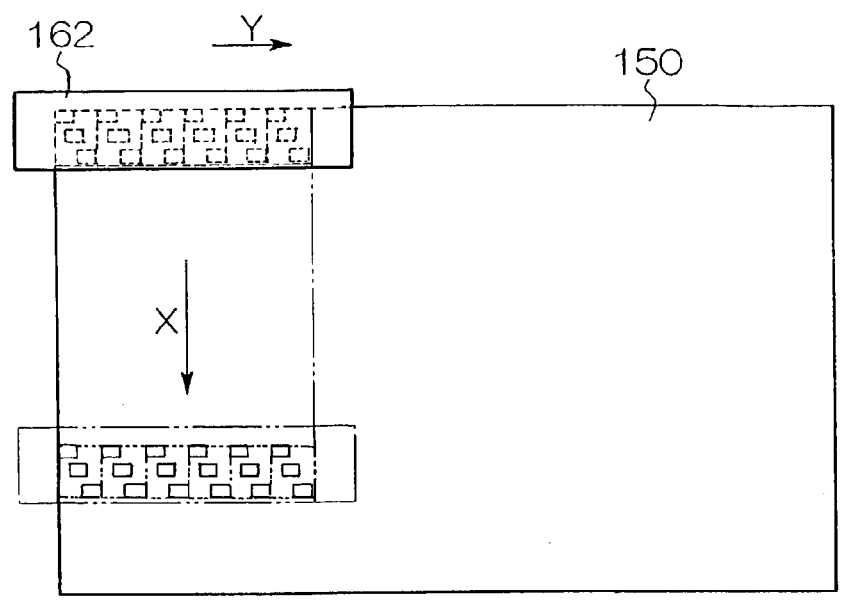
FIGS. 19A and 19B is a plan view illustrating an annealing method in which the entire surface of a transparent substrate is annealed by a plurality of scans with a scanner.
Figure 19B:
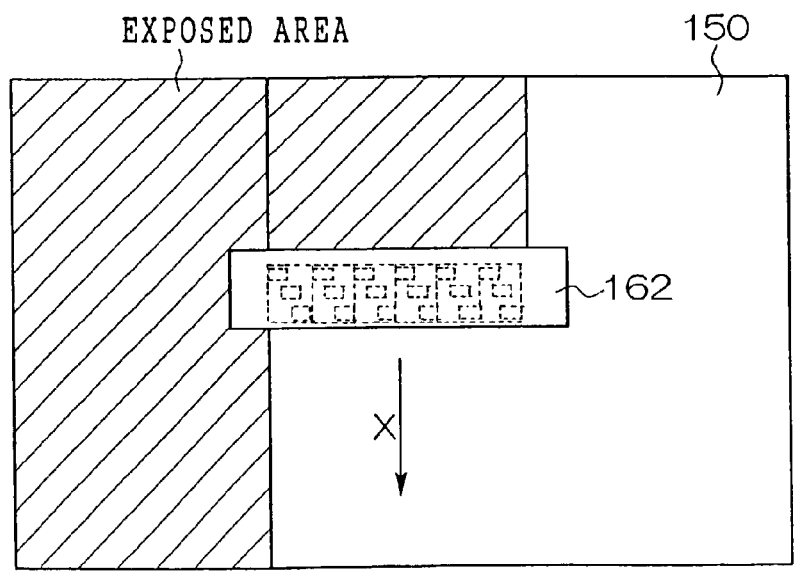

As shown in FIG. 18, as in the case of the above embodiments, the entire surface of the transparent substrate 150 may be annealed by one scan in the X-direction with the scanner 162. Alternatively, as shown in FIGS. 19A and 19B, the entire surface of the transparent substrate 150 may be annealed by a plurality of scans by repeating a scan and a movement such that after the transparent substrate 150 is scanned in the X-direction with the scanner 162, the scanner is moved one step in the Y-direction and a scan is performed again in the X-direction. In this example, the scanner 162 is equipped with 18 illumination heads 166.

Other Laser Devices (Light Sources)

In the above embodiments, the fiber array light source is used that is equipped with a plurality of multiplexing laser light sources. The laser light source is not limited to the fiber array light source in which multiplexing laser light sources are arrayed. For example, a fiber array light source in which fiber light sources each having a single optical fiber that outputs laser light emitted from a single semiconductor laser having a single emission point are arrayed may be used.

The following light sources (1)–(7) are often used as the laser light source that is configured as to form a plurality of emission points. Among the light sources (1)–(7), the multiplexing laser light source and the fiber array light source and the fiber bundle light source each of which uses a plurality of multiplexing laser light sources, with which attaining high output power and high luminance is easy, are often used. That is, the multiplexing laser light source can attain high luminance by increasing the number of laser beams to be multiplexed, which makes it possible to improve the crystal characteristics of a polysilicon film and lower its resistivity, which can in turn increase the carrier mobility further. In the fiber array light source and the fiber bundle light source, since the light source is formed by arraying or bundling a plurality of optical fibers, the area that can be laser-illuminated at one time can be increased and hence a large area can be annealed at high speed. That is, the processing speed can easily be increased further.

(1) A laser array in which a plurality of GaN-type semiconductor lasers are arranged in array form.

(2) A GaN-type multi-cavity laser in which a plurality of emission points are provided in a single chip.

(3) A multiplexing laser light source that is equipped with a plurality of GaN-type semiconductor lasers, a single optical fiber, and a converging optical system for converging laser beams emitted from the respective GaN-type semiconductor lasers and inputting the converged beams to the incidence end of the optical fiber.

(4) A multiplexing laser light source that is equipped with a plurality of GaN-type multi-cavity lasers, a single optical fiber, and a converging optical system for converging laser beams emitted from a plurality of emission points of the GaN-type multi-cabity lasers and inputting the converged beams to the incidence end of the optical fiber.

(5) A multiplexing laser light source that is equipped with a GaN-type multi-cavity laser having a plurality of emission points, a single optical fiber, and a converging optical system for converging laser beams emitted from the respective emission points and inputting the converged beams to the incidence end of the optical fiber.

(6) A fiber array light source or a fiber bundle light source that is equipped with a plurality of multiplexing laser light sources as described above and in which the emission points at the exit ends of the optical fibers of the multiplexing laser light sources are arranged in array form or bundle form.

(7) A fiber array light source or a fiber bundle light source that is equipped with a plurality of fiber light sources each of which is composed of a single GaN-type semiconductor laser, a single optical fiber, and a condensing optical system for condensing a laser beam emitted from the single GaN-type semiconductor laser and inputting the condensed beam to the incidence end of the optical fiber. The emission points at the exit ends of the optical fibers of the fiber light sources are arranged in array form or bundle form.

The structures of the above laser light sources will be described below in detail one by one.

Laser Array

Figure 20:
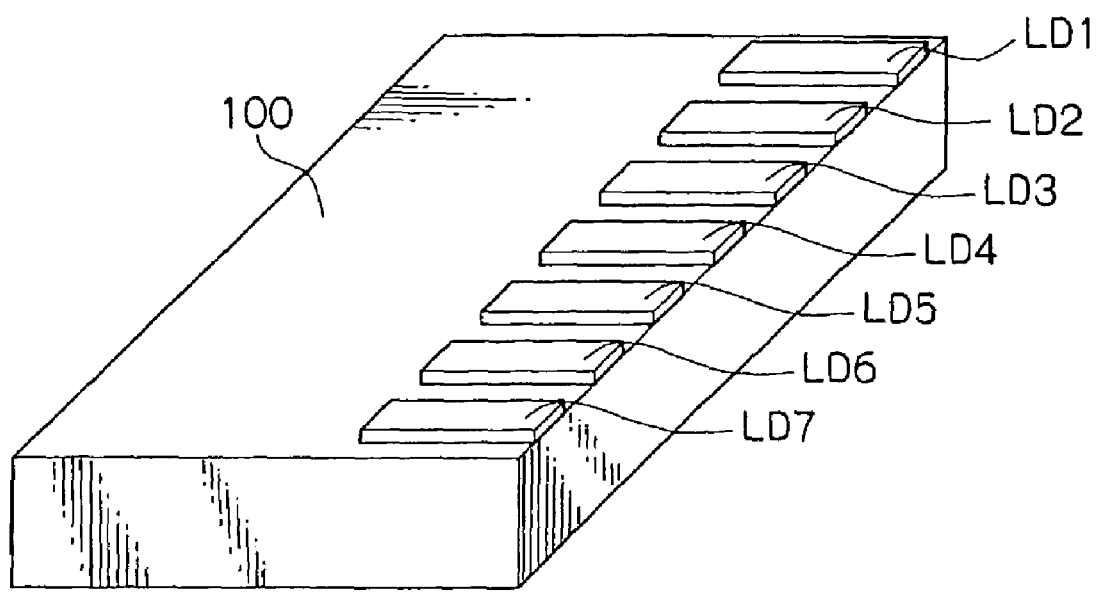
FIG. 20 is a perspective view showing the structure of a laser array.

A laser array in which a plurality of (e.g., seven) chip-shaped semiconductor lasers LD1–LD7 are arranged on a heat block 100 as shown in FIG. 20 can be used as a light source having a plurality of emission points.

Multi-Cavity Laser and Array of Multi-Cavity Lasers

Figure 21A:
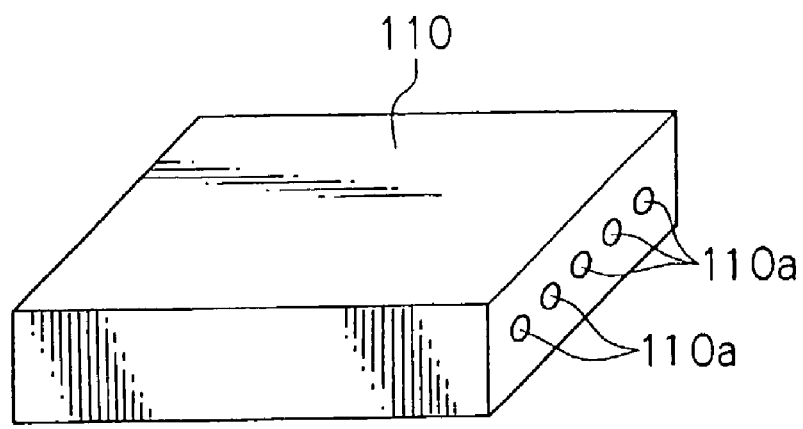
FIG. 21A is a perspective view showing the structure of a multi-cavity laser.
Figure 21B:
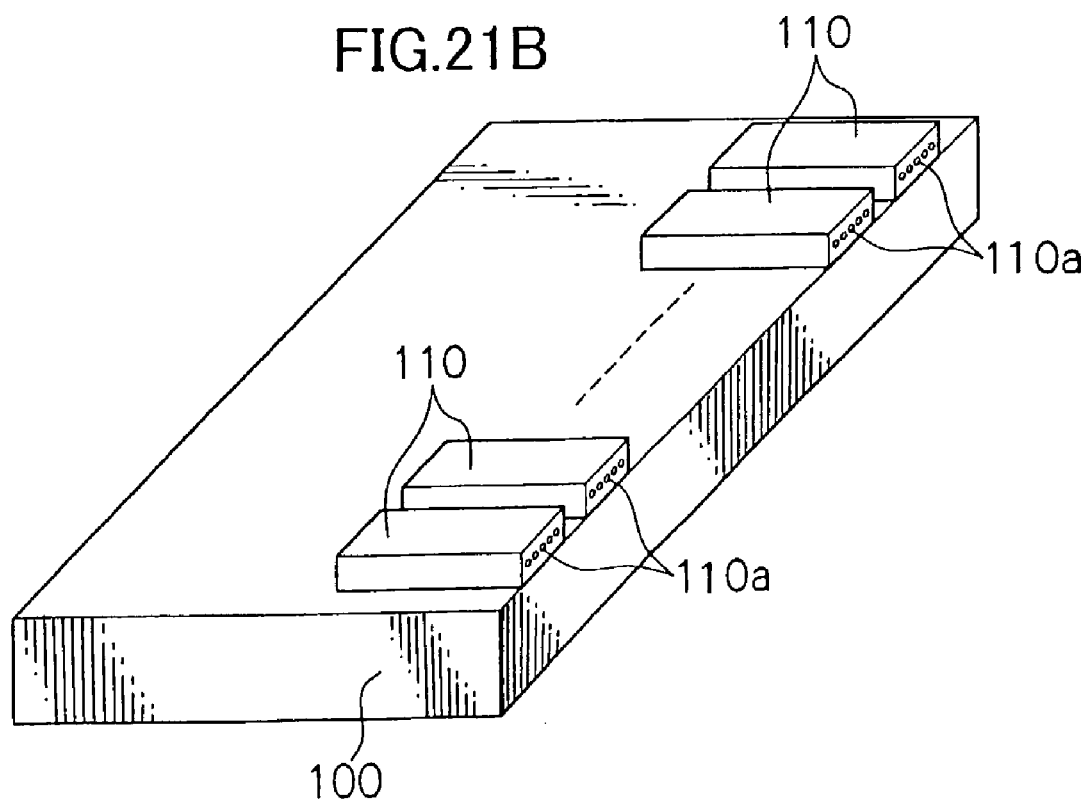
FIG. 21B is a perspective view showing the structure of a multi-cavity laser array in which multi-cavity lasers each shown in FIG. 21A are arranged in array form.

A chip-shaped multi-cavity laser 110 as shown in FIG. 21A is known in which a plurality of (e.g., five) emission points 110a are arranged in a prescribed direction. The multi-cavity laser 110 provides an advantage that laser beams emitted from the respective emission points can be multiplexed easily because the emission points can be arranged with higher positional accuracy than in a case of arranging chip-shaped semiconductor lasers. As the number of emission points 110a increases, the multi-cavity laser 110 becomes more prone to bend during its manufacture. The number of emission points 110a may be five or less. In the illumination head used in the invention, the multi-cavity laser 110 or a multi-cavity laser array in which a plurality of multi-cavity lasers 110 are arranged on the heat block 100 in the same direction as the arrangement direction of the emission points 110a of each chip (see FIG. 21B) can be used as a laser light source.

Multiplexing Laser Light Source Using Multi-Cavity Laser

Figure 22:
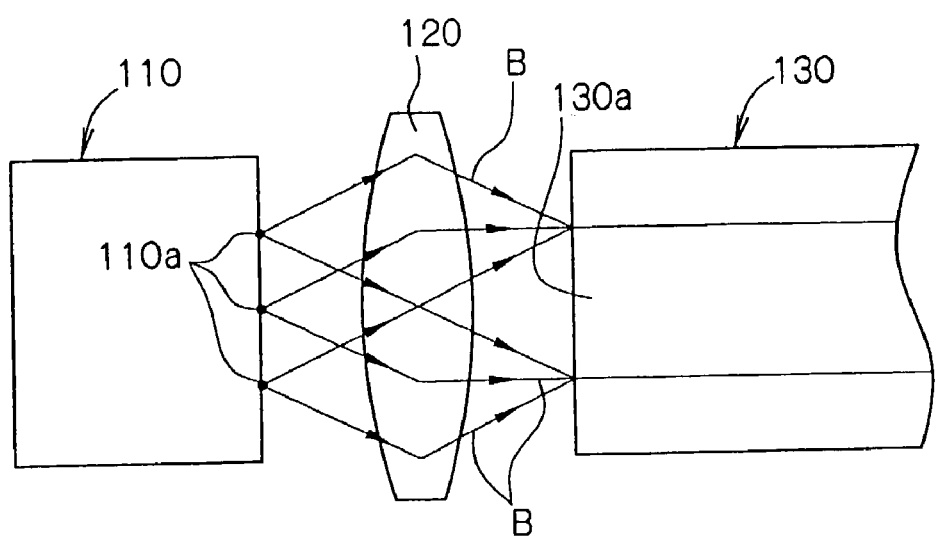
FIG. 22 is a plan view showing the structure of another multiplexing laser light source.

The multiplexing laser light source is not limited to the one in which laser beams emitted from a plurality of chip-shaped semiconductor lasers are multiplexed. For example, a multiplexing laser light source shown in FIG. 22 may be used that is equipped with a chip-shaped multi-cavity laser 110 having a plurality of (e.g., three) emission points 110a. This multiplexing laser light source is composed of the multi-cavity laser 110, a single multi-mode optical fiber 130, and a converging lens 120. For example, the multi-cavity laser 110 may be a GaN-type laser diode having an oscillation wavelength 405 nm.

In this multiplexing laser light source, laser beams B emitted from the respective emission points 110a of the multi-cavity laser 110 are converged by the converging lens 120 and input to the core 130a of the multi-mode optical fiber 130. The laser beams incident on the core 130a travel through the optical fiber 130 and are output from the optical fiber 130 in the form of a single, multiplexed beam.

The coupling efficiency between laser beams B and the multi-mode optical fiber 130 can be increased by arranging the emission points 110a of the multi-cavity laser 110 in a width that is approximately equal to the core diameter of the multi-mode optical fiber 130 and using, as the converging lens 120, a convex lens whose focal length is approximately equal to the core diameter of the multi-mode optical fiber 130 or a rod lens that collimates laser beams B emitted from the multi-cavity laser 110 only in the planes perpendicular to its active layers.

Another multiplexing laser light source shown in FIG. 23 may be used that is equipped with a laser array 140 in which a plurality of (e.g., nine) multi-cavity lasers 110 each having a plurality of (e.g., three) emission points are arranged on a heat block 111 at regular intervals. The multi-cavity lasers 110 are arranged in the same direction as the arrangement direction of the emission points 110a of each chip and fixed to the heat block 111.

This multiplexing laser light source is composed of the laser array 140, a plurality of lens arrays 114 that are disposed so as to correspond to the respective multi-cavity lasers 110, a single rod lens 113 disposed between the laser array 140 and the plurality of lens arrays 114, a single multi-mode optical fiber 130, and a converging lens 120. Each lens array 114 has a plurality of microlenses that correspond to the respective emission points of the corresponding multi-cavity laser 110.

In the above multiplexing laser light source, each of laser beams B emitted from the emission points 110a of the multi-cavity lasers 110 is converged in the prescribed direction by the rod lens 113 and then converted into a parallel beam by the associated microlens of the lens arrays 114. Resulting parallel beams L are converged by the converging lens 120 and input to the core 130a of the multi-mode optical fiber 130. The laser beams incident on the core 130a travel through the optical fiber 130 and are output from the optical fiber 130 in the form of a single, multiplexed beam.

Multiplexing Laser Light Source Using Multi-Stage Laser Arrays

A further multiplexing laser light source will be described. As shown in FIGS. 24A and 24B, in this multiplexing laser light source, a heat block 182 having an L-shaped cross-section taken parallel with the optical axis is mounted on a generally rectangular heat block 180 and an accommodation space is formed between the two blocks 180 and 182. A plurality of (e.g., two) multi-cavity lasers 110 in each of which a plurality of (e.g., five) emission points are arranged in array form are arranged on the top surface of the L-shaped heat block 182 at regular intervals in the same direction as the arrangement direction of the emission points of each chip and are fixed to the top surface.

The generally rectangular heat block 180 has a recess. A plurality of (e.g., two) multi-cavity lasers 110 in each of which a plurality of (e.g., five) emission points are arranged in array form are disposed on a portion, close to the space, of the top surface of the heat block 180 such that their emission points are located in the same vertical planes as the emission points of the laser chips mounted on the top surface of the heat block 182.

Collimator lens arrays 184 in each of which collimator lenses are arranged so as to correspond to the respective emission points 110a of the chips are disposed on the laser light exit side of the multi-cavity lasers 110. Each collimator lens array 184 is oriented such that the length direction of each collimator lens coincides with the direction in which the laser beam spread angle is large (i.e., the fast axis direction) and the width direction of each collimator lens coincides with the direction in which the laser beam spread angle is small (i.e., the slow axis direction). Integrating collimator lenses in array form in this manner increases the space utilization efficiency of laser beams and makes it possible to increase the output power of the multiplexing laser light source. Further, the number of parts is decreased and the cost can be reduced.

A single multi-mode optical fiber 130 and a converging lens 120 for converging laser beams and inputting those to the incidence end of the multi-mode optical fiber 130 are disposed on the laser light exit side of the collimator lens arrays 184.

In this multiplexing laser light source, each of laser beams emitted from the plurality of emission points 110a of the plurality of multi-cavity lasers 110 that are mounted on the heat blocks 180 and 182 is converted into a parallel beam by the associated collimator lens array 184, converged by the converging lens 120, and input to the core 130a of the multi-mode optical fiber 130. Laser beams incident on the core 130a travel through the optical fiber 130 and are output from the optical fiber 130 in the form of a single, multiplexed beam.

By virtue of the above-described multi-stage arrangement of the multi-cavity lasers and arrayed collimator lenses, this multiplexing laser light source provides a particular advantage of a high output power. The use of this multiplexing laser light source enables formation of higher-luminance fiber array light source or bundled fiber light source. As such, this multiplexing laser light source is particularly suitable for use as a fiber light source for forming a laser light source of the illumination head according to the embodiments.

A laser module may be formed by housing one of the above multiplexing laser light sources in a casing and leading the exit end portion of the multi-mode optical fiber 130 out of the casing.

In the first and second embodiments, the luminance of the fiber array light source is increased by connecting, to the exit ends of the multi-mode optical fibers of the multiplexing laser light sources, the optical fibers whose core diameter is the same as the core diameter of the multi-mode optical fibers and whose clad diameter is smaller than the clad diameter of the multi-mode optical fibers. For example, multi-mode optical fibers whose clad diameter is 125 µm, 80 µm, 60 µm, or the like may be used without connecting other optical fibers to their exit ends.

A fiber array light source of the laser annealers according to the first to fourth embodiments can be constructed by using multiplexing laser light sources each of which employs the above-described multi-stage laser array. For example, if a fiber array light source is formed by using such multiplexing laser light sources in the fourth embodiment shown in FIG. 38, a light density on the exposure surface is calculated in the following manner.

(1) Where multi-cavity lasers in which the output power at each emission point is equal to 30 mW are used in each multiplexing laser light source of the illumination head 500, 20 emission points can produce a multiplexed laser beam B having an output power 500 mW. Therefore, in the fiber array light source 506 in which 600 multi-mode optical fibers 30 are arranged in line, the output power of the laser light exit section 68 is about 300 W. Where step-index optical fibers whose clad diameter is 125 µm, core diameter is 50 µm, and NA is 0.2 are used as the multi-mode optical fibers 30, the beam cross-section at the laser light exit section 68 measures 50 µm×75 mm. If the beam diameter is magnified by the magnifying optical system by a factor of 6 in the shorter-axis direction and by a factor of 1.66 in the longer-axis direction, the area of the illumination area 502 is equal to 300 µm×125 mm. Where the illumination area 502 is exposed to light in 1 ms, the light density on the exposure surface is 800 mJ/cm$^2$. If the loss of the optical system is estimated to be about 75%, the light density on the exposure surface is 600 mJ/cm$^2$.

(2) Where multi-cavity lasers in which the output power at each emission point is equal to 100 mW are used in each multiplexing laser light source of the illumination head 500, 20 emission points can produce a multiplexed laser beam B having an output power 1,600 mW. Therefore, in the fiber array light source 506 in which 625 multi-mode optical fibers 30 are arranged in line, the output power of the laser light exit section 68 is about 1 kW. Where step-index optical fibers whose clad diameter is 125 µm, core diameter is 50 µm, and NA is 0.2 are used as the multi-mode optical fibers 30, the beam cross-section at the laser light exit section 68 measures 50 µm×78 mm. If the beam diameter is magnified by the magnifying optical system by a factor of 6 in the shorter-axis direction and by a factor of 5.3 in the longer-axis direction, the area of the illumination area 502 is equal to 300 µm×413 mm. Where the illumination area 502 is exposed to light in 1 ms, the light density on the exposure surface is 800 mJ/cm$^2$. If the loss of the optical system is estimated to be about 25% (active rate is 75%), the light density on the exposure surface is 600 mJ/cm$^2$.

(3) Where multi-cavity lasers in which the output power at each emission point is equal to 100 mW are used in each multiplexing laser light source of the illumination head 500, 20 emission points can produce a multiplexed laser beam B having an output power 1,600 mW. Therefore, in the fiber array light source 506 in which 1,250 (=625×2) multi-mode optical fibers 30 are arranged in two lines, the output power of the laser light exit section 68 is about 2 kW. Where optical fibers whose clad diameter is 60 µm and core diameter is 50 µm are connected to the exit ends of the multi-mode optical fibers 30 respectively, the beam cross-section at the laser light exit section 68 measures 110 µm×37.5 mm. If the beam diameter is magnified by the magnifying optical system by a factor of 6 in the shorter-axis direction and by a factor of 10 in the longer-axis direction, the area of the illumination area 502 is equal to 660 µm×375 mm. Where the illumination area 502 is exposed to light in 1 ms, the light density on the exposure surface is 800 mJ/cm$^2$. If the loss of the optical system is estimated to be about 75%, the light density on the exposure surface is 600 mJ/cm$^2$. A greater depth of focus can be obtained by increasing the magnification factor in the longer-axis direction.

Broad stripe semiconductor laser beams from a laser light source whose output is 500 mW are condensed and guided into a single multi-mode optical fiber at an illumination head. The condensed beams become a light of 480 mW with an efficiency is 96%. Accordingly, the output at the laser exit section will be 960 W when a fiber array light source where two rows of 2,000 multi-mode fibers (1,000 fibers per row×2) are arranged is used. Optical fibers whose clad diameter is 60 µm and core diameter is 50 µm are connected and beam diameter becomes about 10 µm×60 µm. Enlarging the beam diameter 3.6 times larger in a short axis direction and 5 times larger in a long axis direction by an optical system, the area at the illumination will become 400 µm×300 mm. Accordingly, when exposing at 1 msec, the optical density at an exposure surface will be 800 mJ/cm$^2$. Further, when the loss at the optical system is assumed to be about 75%, the optical density at an exposure surface will be 600 mJ/cm$^2$. In this way, an example of combining fibers whose clad diameter is 60 µm is given. In FIGS. 46A and 46B, the LD has wavelength of 400 nm-to 420 nm, width of illuminating layer is 0.5 m in a perpendicular direction and 30 µm in a parallel direction. At lenses 1 and 3, NA of the beam of a perpendicular direction is converted to become smaller than NA of the fiber. At lenses 2 and 4, an image is formed at one time with regard to the parallel direction. The width of 30 µm at the exit section of the parallel direction is formed at a fiber core section. With regard to a practical arrangement for a sufficient efficiency of connection to the fibers, the width of the broad stripe may be in a range from 5 to 200 µm, NA of multi-mode fiber may be in a range from 0.15 to 0.3 and the core diameter of the fiber may be in a range from 10 µm to 80 µm. This beam correction optical system in FIGS. 46A and 46B employs cylindrical lenses, however, configuration of the optical system is not limited this. Alternatively, by guiding the light of a broad stripe LD directly into multi-mode optical fibers whose clad diameter is 60 µm and core diameter is 50 µm, the light without changing diameter may be used as an illuminating end.

As described above, a case where a semiconductor laser is connected to a fiber is presented. Of course, integrating a plurality of broad area laser beams into one beam and connecting the beam to a fiber will mean a higher luminance light source for outputting to a fiber.

Light Quantity Profile Correcting Optical System

In the first and second embodiments, the light intensity distribution correcting optical system consisting of a pair of combination lenses is employed in each illumination head 166. The light intensity distribution correcting optical system corrects a parallel light flux originating from the light source so as to produce an approximately uniform light intensity distribution on the illumination surface of the DMD 50 by changing the light flux width at each exit position so that the ratio of the light flux width of a peripheral portion to the light flux width of a central portion that is close to the optical axis becomes smaller on the exit side than on the incidence side. The action of the light intensity distribution correcting optical system will be described below.

Figure 27A:
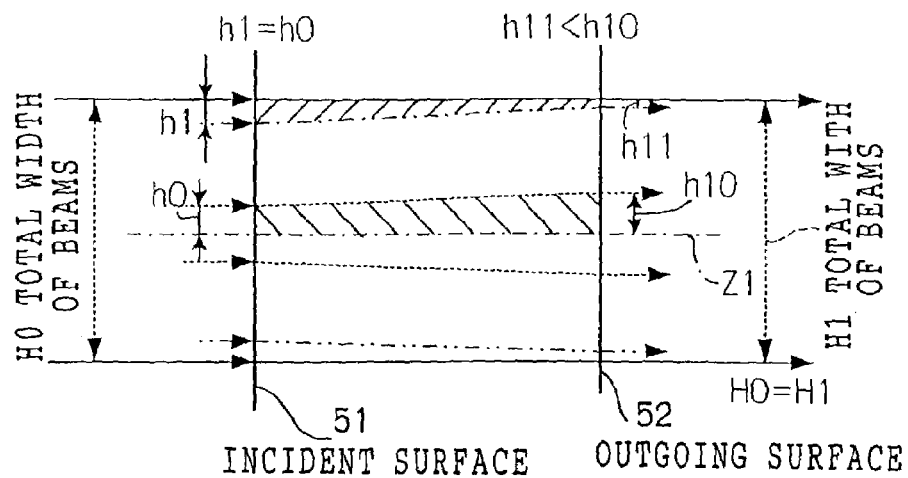
FIGS. 27A–27C illustrate a concept of correction of a light intensity distribution correcting optical system.

First, a description will be made of a case that the entire light flux width H0 of an incident light flux is the same as the entire light flux width H1 of an exit light flux as shown in FIG. 27A. In FIG. 27A, reference numerals 51 and 52 represent an imaginary incident plane and exit plane of the light intensity distribution correcting optical system.

In the light intensity distribution correcting optical system, it is assumed that the light flux width h0 of a light flux entering a central portion that is close to the optical axis Z1 is the same as the light flux width h1 of a light flux entering a peripheral portion (h0=h1). For the light having the same light flux widths h0 and h1 on the incidence side, the light intensity distribution correcting optical system functions so as to increase, from h0, the light flux width of the light flux incident on the central portion and, conversely, decrease, from h1, the light flux width of the light flux incident on the peripheral portion. That is, the light intensity distribution correcting optical system establishes a relationship h11<h10 between the width h10 of a central exit light flux and the width h11 of a peripheral exit light flux. In terms of the light flux width ratio, the ratio h11/h10 (<1) of the peripheral light flux width to the central light flux width on the exit side is made smaller than the ratio h1/h0 (=1) on the incidence side.

Changing the light flux widths in the above manner makes it possible to divert a central light flux outward to reinforce a peripheral portion where the light intensity is insufficient, whereby the light intensity distribution on the illumination surface of the DMD 50 is made almost uniform without lowering the efficiency of utilization of light as a whole. For example, the uniformization is performed in such a degree that the light intensity unevenness falls within 30%, often within 20%, in the effective area.

Figure 27B:
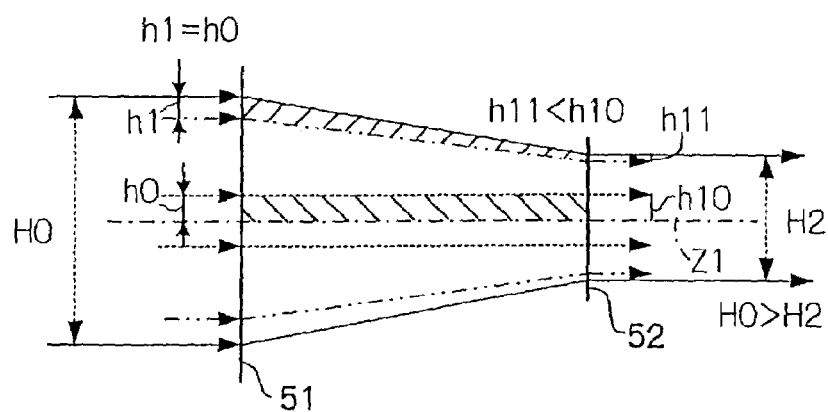
Figure 27C:
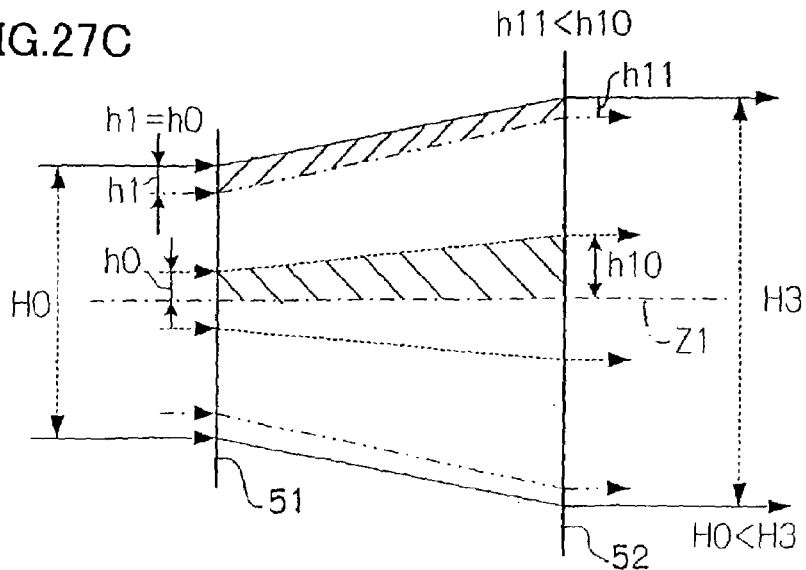

The above-described action and advantage of the light intensity distribution correcting optical system remain the same also in a case that the entire light flux width on the exit side is different than on the incidence side (see FIGS. 27B and 27C).

FIG. 27B shows a case that the entire light flux width H2 on the exit side is smaller than the entire light flux width H0 on the incidence side (H0>H2). Also in this case, for light having the same light flux widths h0 and h1 on the incidence side, the light intensity distribution correcting optical system functions so as to establish, on the exit side, a relationship h1<h10 between the width h10 of a central exit light flux and the width h11 of a peripheral exit light flux. In terms of the light flux contraction ratio, the light intensity distribution correcting optical system functions so as to make the contraction ratio of a central light flux smaller than that of a peripheral light flux. Also in this case, the ratio h11/h10 (<1) of the peripheral light flux width to the central light flux width on the exit side is made smaller than the ratio h1/h0 (=1) on the incidence side.

FIG. 27C shows a case that the entire light flux width H3 on the exit side is smaller than the entire light flux width H0 on the incidence side (H0<H3). Also in this case, for light having the same light flux widths h0 and h1 on the incidence side, the light intensity distribution correcting optical system functions so as to establish, on the exit side, a relationship h11<h10 between the width h10 of a central exit light flux and the width h11 of a peripheral exit light flux. In terms of the light flux expansion ratio, the light intensity distribution correcting optical system functions so as to make the expansion ratio of a central light flux greater than that of a peripheral light flux. Also in this case, the ratio h11/h10 (<1) of the peripheral light flux width to the central light flux width on the exit side is made smaller than the ratio h1/h0 (=1) on the incidence side.

As described above, since the light intensity distribution correcting optical system changes the light flux width at each exit position so that the ratio of the light flux width of a peripheral portion to the light flux width of a central portion that is close to the optical axis Z1 becomes smaller on the exit side than on the incidence side, for light having the same central and peripheral light flux widths on the incidence side, the central light flux width becomes greater than the peripheral light flux width on the exit side. As a result, a central light flux can be diverted outward to reinforce a peripheral portion, whereby a light flux cross-section can be formed in which the light intensity distribution is almost uniform without lowering the efficiency of utilization of light of the entire optical system.

Next, a description will be made of an example of specific lens data of a pair of combination lenses that serve as the light intensity distribution correcting optical system. The lens data of this example are of a case that the light intensity distribution in a cross-section of an exit light flux is a Gaussian distribution as in a case that the light source is a laser array light source. Where a single semiconductor laser is coupled to the incidence end of a single-mode optical fiber, the light intensity distribution of an exit light flux of the optical fiber becomes a Gaussian distribution. This embodiment can be applied to such a case. This embodiment can also be applied to a case the light intensity of a central portion is made greater than that of a peripheral portion by, for example, decreasing the core diameter of a multi-mode optical fiber to make it come closer to a single-mode optical fiber.

Basic lens data are shown in Table 1.

TABLE 1

Basic lens data

| $S_i$ | $r_i$ | $d_i$ | $N_i$ |
|---|---|---|---|
| 01 | Aspherical | 5.000 | 1.52811 |
| 02 | ∞ | 50.000 | |
| 03 | ∞ | 7.000 | 1.52811 |
| 04 | Aspherical | | |

NOTE:
$S_i$ = Surface Number;
$r_i$ = Radius of curvature;
$d_i$ = Surface interval;
and $N_i$ = Refractive index.

As seen from Table 1, the pair of combination lenses are two aspherical lenses that are rotation-symmetrical. If the light-incidence-side surface and the light-exit-side surface of the first, light-incidence-side lens are called a first surface and a second surface respectively, the first surface is an aspherical surface. If the light-incidence-side surface and the light-exit-side surface of the second, light-exit-side lens are called a third surface and a fourth surface respectively, the fourth surface is an aspherical surface.

In Table 1, the surface number $S_i$ means the number of an ith surface (i=1 to 4), the radius $r_i$ of curvature means a radius of curvature of an ith surface, the surface interval $d_i$ means a surface interval in mm between an ith surface and an (i+1)th surface, and the refractive index $N_i$ means a refractive index at a wavelength 405 nm of an optical element having an ith surface.

Table 2 shows aspherical surface data of the first surface and the fourth surface.

TABLE 2

Aspherical Surface Data

|  | First Surface | Fourth Surface |
|---|---|---|
| C | −1.4098E−02 | −9.8506E−03 |
| K | −4.2192E+00 | −3.6253E+01 |
| a3 | −1.0027E−04 | −8.9980E−05 |
| a4 | 3.0591E−05 | 2.3060E−05 |
| a5 | −4.5115E−07 | −2.2860E−06 |
| a6 | −8.2819E−09 | 8.7661E−08 |
| a7 | 4.1020E−12 | 4.4028E−10 |
| a8 | 1.2231E−13 | 1.3624E−12 |
| a9 | 5.3753E−16 | 3.3965E−15 |
| a10 | 1.6315E−18 | 7.4823E−18 |

The above aspherical surface data are coefficients of the following Equation (A) that represents an aspherical surface:

$$Z = \frac{C \cdot \rho^2}{1 + \sqrt{1 - K \cdot (C \cdot \rho)^2}} + \sum_{i=3}^{10} a_i \cdot \rho^i \quad (A)$$

The variables and coefficients in Equation (A) are defined as follows:

Z: length (mm) of the perpendicular from a point on the aspherical surface having a height ρ from the optical axis to the tangential plane to the aspherical surface at the top (i.e., the plane perpendicular to the optical axis).

ρ: distance (mm) from the optical axis.

K: constant of the cone.

C: paraxial curvature (1/r; r: paraxial radius of curvature).

$a_i$: ith-order aspherical surface coefficient (i=3 to 10).

In each numerical value shown in Table 2, symbol "E" means that the numerical value following symbol E is an exponent (base: 10) and the power of 10 is multiplied by the numerical value preceding symbol E. For example, 1.0E−02 means $1.0 \times 10^{-2}$.

Figure 28:
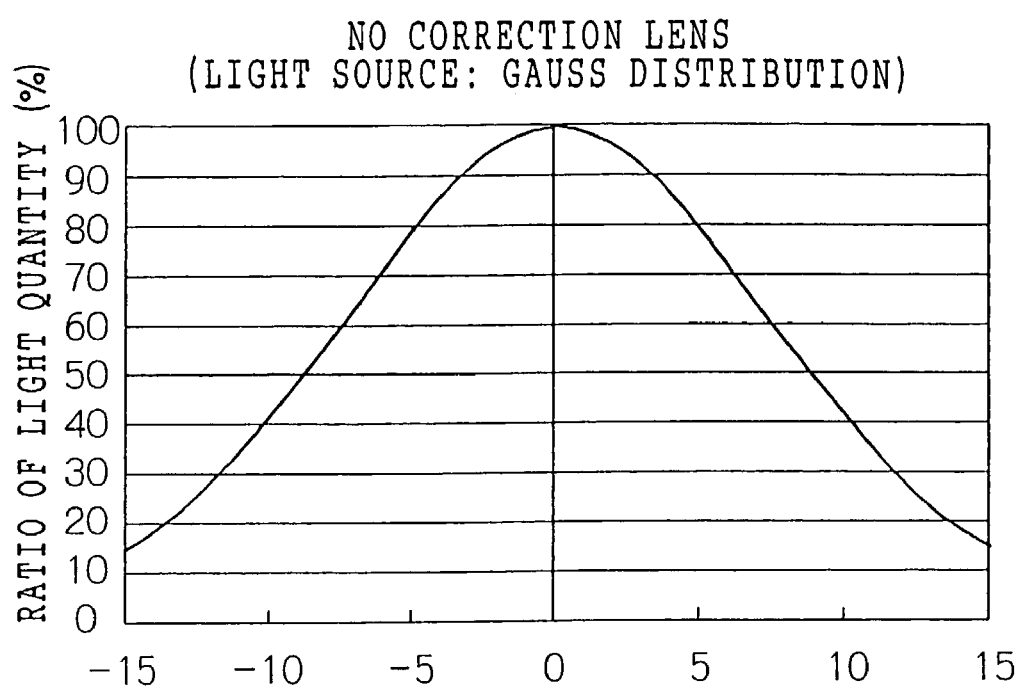
FIG. 28 is a graph showing a light intensity distribution that is obtained when the light source has a Gaussian distribution and no light intensity distribution correction is performed.
Figure 29:
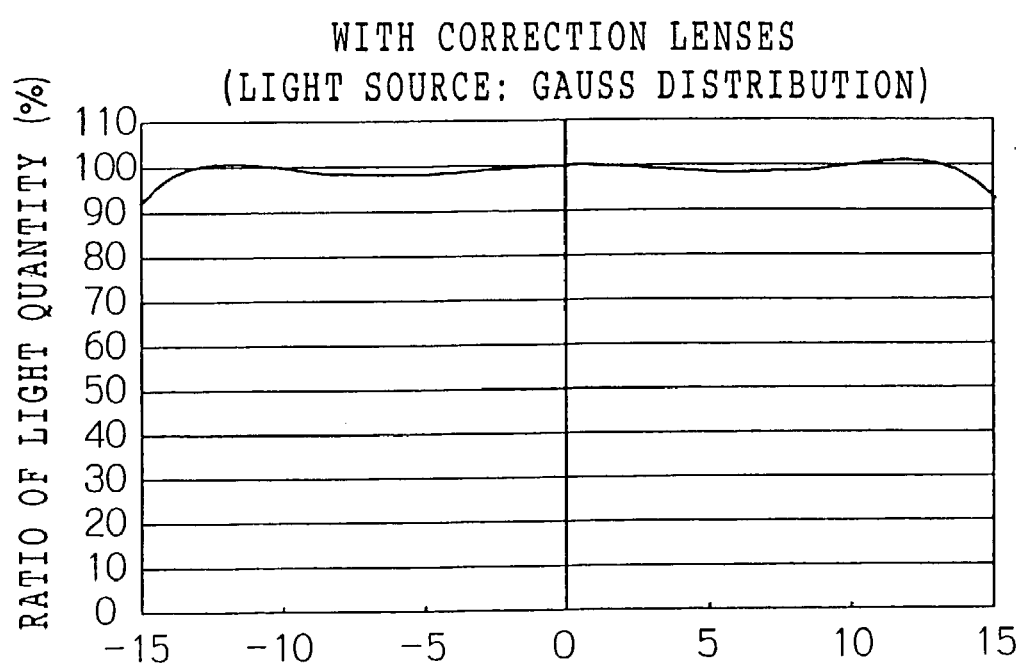
FIG. 29 is a graph showing a light intensity distribution that is obtained when correction by the light intensity distribution correcting optical system is performed.

FIG. 29 shows a light intensity distribution of illumination light obtained by the pair of combination lenses shown in Tables 1 and 2 in which the horizontal axis represents the distance from the optical axis and the vertical axis represents the light intensity ratio (%). For comparison, FIG. 28 shows a light intensity distribution (Gaussian distribution) of illumination light that is obtained with no correction. As seen from FIGS. 28 and 29, a much more even light intensity distribution than in the case that no correction can be obtained by the correction by the light intensity distribution correcting optical system. As a result, laser annealing can be performed without unevenness by using uniform laser light while the efficiency of utilization of light is not lowered in the illumination head.

Alternative to the above-described light intensity distribution correcting optical system, other optical systems such fly-eye lens or rod integrator type (FIGS. 47A and 47B) can be applied to the present invention.

Other Imaging Optical Systems

In the first embodiment, the two lens systems 54 and 58 as the imaging optical system are disposed on the light reflection side of the DMD 50 in each illumination head 166. Alternatively, an imaging optical system that images laser light while magnifying it may be employed. Enlarging the cross-section of a light flux reflected from the DMD 50 makes it possible to increase the area of the illumination area 168 on the illumination surface.

Figure 30A:
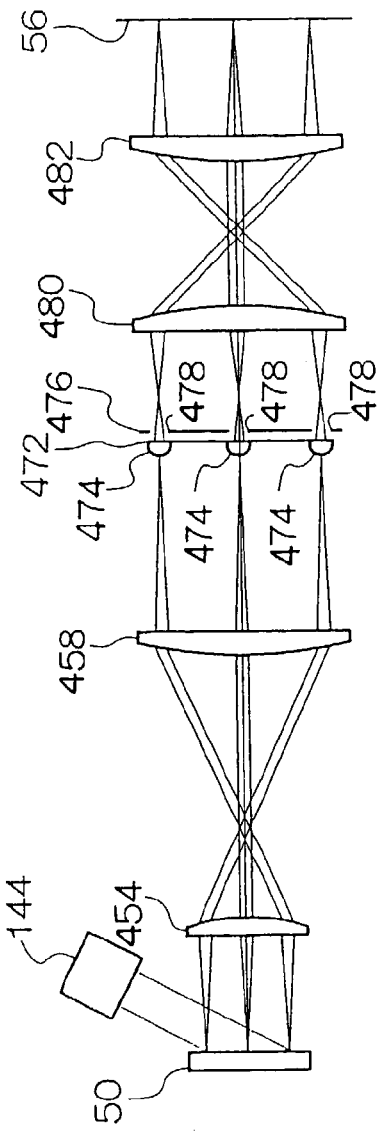
FIG. 30A is a sectional view, taken along the optical axis, of another illumination head having another imaging optical system.

For example, as shown in FIG. 30A, each illumination head may be composed of a DMD 50, an illumination device 144 for applying laser light to the DMD 50, lens systems 454 and 458 for imaging laser light reflected from the DMD 50 while magnifying it, a microlens array 742 in which a number of microlenses 474 are arranged so as to correspond to the respective pixels of the DMD 50, an aperture array 476 in which a number of apertures 478 are arranged so as to correspond to the respective microlenses 474 of the microlens array 742, lens systems 480 and 482 for imaging laser light that has passed through the apertures 478 on an illumination surface 56.

In this illumination head, laser light is applied from the illumination device 144 to the DMD 50 and the cross-section of each light flux that is reflected from the DMD 50 in the on-direction is multiplied by several times (e.g., two times) by the lens systems 454 and 458. The magnified laser beams are focused by the microlenses 474 of the microlens array 472 in such a manner as to correspond to the respective pixels of the DMD 50, and pass through the respective apertures 478 of the aperture array 476. The laser beams that have passed through the apertures 478 are imaged on the exposure surface 56 by the lens systems 480 and 482.

Figure 30C:
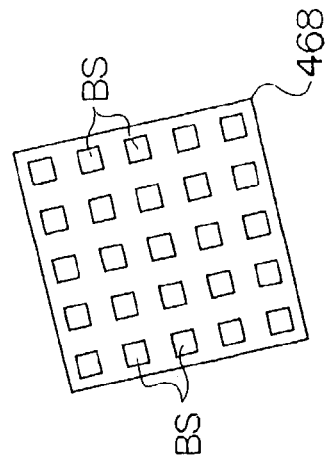
FIG. 30C is a plan view showing an optical image that is projected onto the scanning surface in a case that a microlens array etc. are used.
Figure 30B:
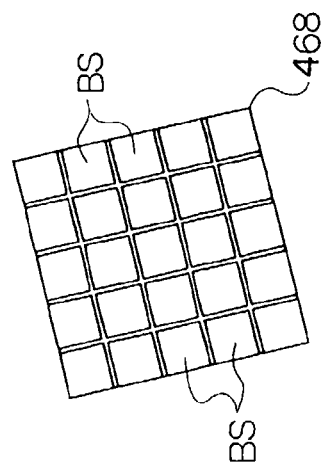
FIG. 30B is a plan view showing an optical image that is projected onto the scanning surface in a case that a microlens array etc. are is not used.

In this imaging optical system, laser beams reflected from the DMD 50 are magnified by the magnifying lens systems 454 and 458 by several times and projected onto the scanning surface 56 and hence the entire image area is increased. If the microlens array 472 and the aperture array 476 were not disposed, as shown in FIG. 30B the one-pixel size (i.e., spot size) of each beam spot BS projected on the scanning surface 56 would become large in accordance with the size increase of the illumination area 468 and the MTF (modulation transfer function) characteristic that represents the sharpness of the illumination area 468 would decrease.

Where the microlens array 472 and the aperture array 476 are disposed, laser beams reflected from the DMD 50 are focused by the respective microlenses 474 of the microlens array 472 in such a manner as to correspond to the respective pixels of the DMD 50. As a result, as shown in FIG. 30C, although the illumination area 468 is enlarged, the spot size of each beam spot BS can be reduced to a desired size (e.g., 10 μm×10 μm), whereby deterioration of the MTF characteristic is prevented and high-resolution exposure can be performed. The reason why the illumination area 468 is inclined is that the DMD 50 is inclined to eliminate gaps between the pixels.

Even if beams are made thicker due to aberrations of the microlenses 474, the apertures 478 can shape the beams so that the spot sizes on the scanning surface 56 are kept constant. Further, causing beams to pass through the apertures 478 that are provided so as to correspond to the respective pixels prevents crosstalk between adjoining pixels.

Where a high-luminance light source is used as the illumination device 144 as in the above embodiments, the angles of light fluxes incident on the respective microlenses 474 of the microlens array 472 from the lens system 458 become small, which prevents parts of light fluxes of adjacent pixels from entering each microlens 474. A large extinction ratio can thus be realized.

As described above, a first laser annealer according to the invention provides an advantage that polysilicon films having superior crystal characteristics and a high carrier mobility can be formed at high speed with high reproducibility by using a semiconductor laser that can be driven continuously and is superior is output power stability. This laser annealer provides another advantage that it is compact and highly reliable and can be maintained easily. This laser annealer provides a further advantage that the cost is low because it is not necessary to use an optical system made of a special material.

A second laser annealer according to the invention provides an advantage that annealing can be performed by illumination with strong and uniform laser light without the need for using an optical system made of a special material.

A third laser annealer according to the invention is equipped with a spatial light modulator. This laser annealer provides an advantage that high-speed, high-resolution annealing can be performed by increasing the modulation rate of the spatial light modulator.

Fifth Embodiment

A laser thin-film forming apparatus according to a fifth embodiment of the invention will be described below with reference to the drawings.

Laser Thin-Film Forming Apparatus

Figure 39:
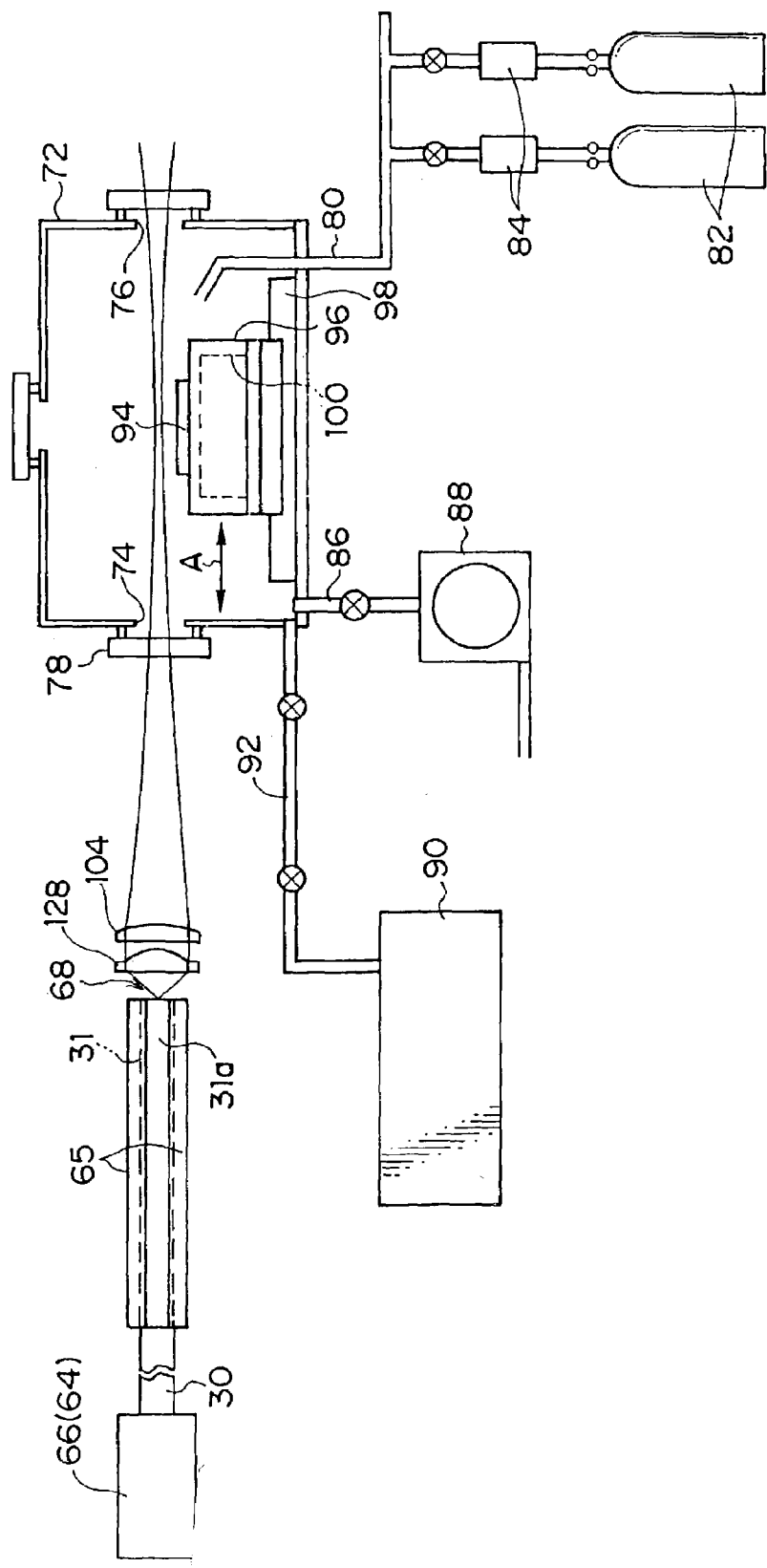
FIG. 39 shows the entire configuration of a laser thin-film forming apparatus according to a fifth embodiment.

As shown in FIG. 39, a laser thin-film forming apparatus 70 is equipped with a box-shaped chamber 72. An incidence window 74 through which a line beam emitted from a fiber array light source 66 (described later) is input and an exit window 76 as an exit of the line beam are formed through side walls of the chamber 72. The incidence window 74 is closed by a synthesized quartz glass plate 78 having high transmittance.

The chamber 72 is equipped with a supply passage 80 for supplying a silane gas ($SiH_4$). Material gas cylinders 82 are connected to the supply passage 80 via respective massflow controllers 84. The bottom wall of the chamber 72 is provided with an exhaust passage 86 through which exhaust gas is discharged. A gas inside the chamber 72 is exhausted and the internal pressure of the chamber 72 is controlled by a vacuum pump 88.

A guide pipe 92 for guiding a gas from the chamber 72 to a quadruple-pole mass filter 90 is connected to the bottom wall of the chamber 72. Reaction products inside the chamber 72 can be monitored by the quadruple-pole mass filter 90.

A movable stage 96 that is mounted with a glass substrate 94 on which a thin film is to be formed is disposed at a central position in the chamber 72. A heater 100 is incorporated in the movable stage 96, whereby the temperature of the substrate 94 is kept at about 250° C.

The movable stage 96 is disposed at such a position that a thin film S can be deposited thereon by exciting a material gas with a line beam. That is, the movable stage 96 is disposed in a line beam illumination region.

The bottom surface of the movable stage 96 is formed with recesses 102 that are engaged with guide rails 98. The movable stage 96 is moved at a prescribed speed in a direction indicated by arrow A along the guide rails 98. The movement direction (i.e., the direction of arrow A) is perpendicular to a beam waist area W (optical decomposing reaction region; see FIG. 42).

As shown in FIG. 9A, the fiber array light source 66 is equipped with a number of laser modules 64 and one ends of multi-mode optical fibers 30 are connected to the respective laser modules 64. The other ends of the multi-mode optical fibers 30 are connected to respective optical fibers 31 that are the same in core diameter as and smaller in clad diameter than the multi-mode optical fibers 30.

The exit ends (emission points) of the optical fibers 31 are arranged in line to form a laser light exit section 68. The arrangement direction of the emission points is perpendicular to the movement direction (i.e., the direction of arrow A) of the movable stage 96 which is provided in the chamber 72. A line beam having a prescribed width traverses along the width direction of the substrate 94 mounted on the movable stage 96.

As shown in FIG. 9B, the exit ends of the optical fibers 31 are fixed in such a manner as to be interposed between two support plates 65. The exit ends of the optical fibers 31 are protected by a transparent protective plate 63 such as a glass plate. The protective plate 63 may either be in close contact with the end faces of the optical fibers 31 or be disposed so as to seal the end faces of the optical fibers 31. The exit ends of the optical fibers 31 are prone to deteriorate because the light density is high and dust tends to gather there. Disposing the protective plate 63 on the end faces of the optical fibers 31 prevents dust sticking to the end faces and can delay the deterioration of the exit ends.

A collimator lens 128, which is disposed in front of the laser light exit section 68, collimates laser light emitted from the laser light exit section 68. The collimated laser light is focused by a cylindrical lens 104 only in the direction perpendicular to the arrangement direction of the exit ends of the optical fibers 31.

The cylindrical lens 104 is curved in a prescribed plane and is long in the direction perpendicular to the prescribed plane. The cylindrical lens 104 is oriented such that its longitudinal direction (i.e., the direction perpendicular to the prescribed plane) is parallel with the arrangement direction of the exit ends of the optical fibers 31. Laser light emitted from the laser light exit section 68 is focused by the cylindrical lens 104 into a line beam over the substrate 94.

In this embodiment, to arrange the exit ends of the optical fibers 31 having a small clad diameter in line without forming gaps, the multi-mode optical fibers 30 having a large clad diameter and the optical fibers 31 are arranged such that a third multi-mode optical fiber 30 is placed on two (i.e., first and second) adjoining multi-mode optical fibers 30 and the exit end of the optical fiber 31 connected to the third multi-mode optical fiber 30 is interposed between the exit ends of the optical fibers 31 connected to the two multi-mode optical fibers 30.

Figure 10:
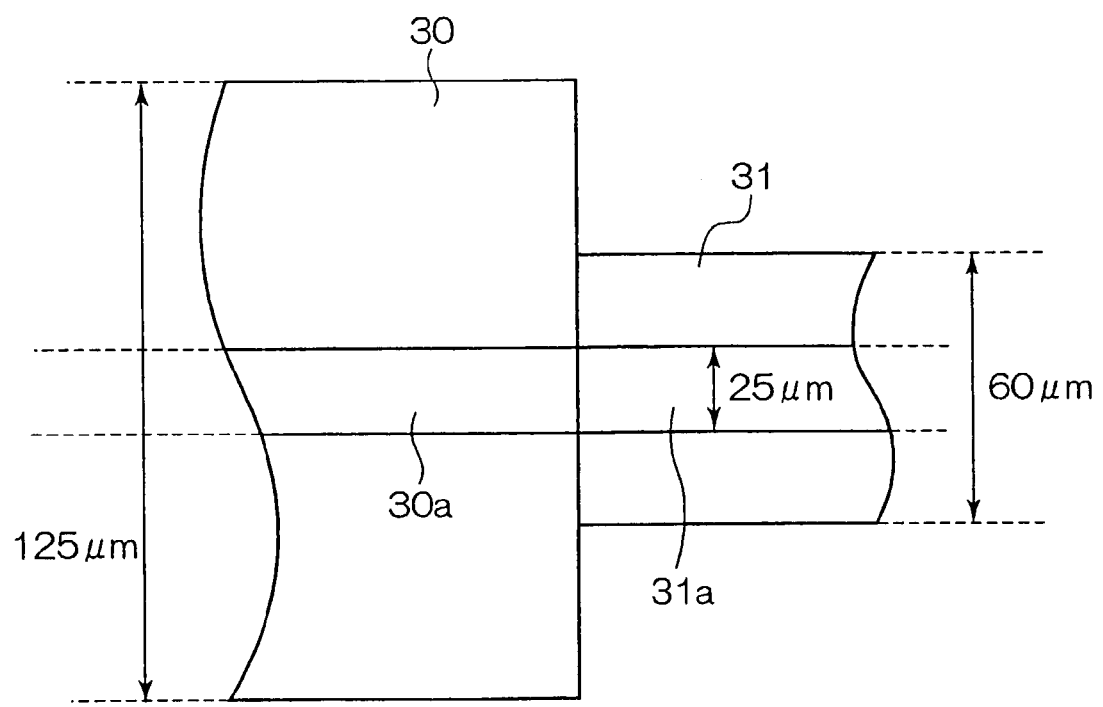
FIG. 10 shows the structure of a multi-mode optical fiber.

For example, as in the case of the first embodiment, such an optical fiber can be formed by connecting an optical fiber 31 having a length of 1 to 30 cm and a small clad diameter to the laser-light-exit-side tip of a multi-mode optical fiber 30 having a large clad diameter in a concentric manner (see FIG. 10).

As in the case of the first embodiment, each laser module 64 is formed by the multiplexing laser light sources (fiber light sources) shown in FIGS. 11–14.

Operation of Laser Thin-Film Forming Apparatus

The operation of the laser thin-film forming apparatus will be described below.

Laser beams B1–B7 that are emitted, as divergent beams, from the respective GaN-type semiconductor lasers LD1–LD7 of each multiplexing laser light source of the fiber array light source 66 are converted into parallel beams by the respective collimator lenses 11–17. The parallel laser beams B1–B7 are converged by the condenser lens 20 on the incidence end face of the core 30a of the multi-mode optical fiber 30.

In this example, the collimator lenses 11–17 and the condenser lens 20 constitute a condensing optical system, and the condensing optical system and the multi-mode optical fiber 30 constitute a multiplexing optical system. That is, laser beams B1–B7 that are converged by the condenser lens 20 in the above manner enter the core 30*a* of the multi-mode optical fiber 30 and travel through the optical fiber 30 to form a single, multiplexed laser beam B, which is output from the optical fiber 31 that is connected to the exit end of the multi-mode optical fiber 30.

Where in each laser module 64 the coupling efficiency of laser beams B1–B7 with the multi-mode optical fiber 30 is 0.85 and the output power of each of the GaN-type semiconductor lasers LD1–LD7 is 30 mW (in the case of using single-mode lasers), each of the optical fibers 31 that are arranged in array form can produce a multiplexed laser beam B having a power of 180 mW (=30 mW×0.85×7). Thus, the output power of the laser light exit section 68 in which 1,200 optical fibers 31 are arranged in array form is about 216 W (180 mW×1,200).

In this embodiment, the number of optical fibers 31 is 1,200. Basically, the number of optical fibers 31 is determined so as to set the length of a line beam greater than the width of the substrate 94 on which a thin film S is to be deposited.

That is, the line beam length can be increased while the energy intensity and the energy uniformity are maintained by increasing the number of arrayed optical fibers. Therefore, the thin-film forming apparatus according to this embodiment is suitable for manufacture of a large-size TFT-LCD panel.

In the laser light exit section 68 of the fiber array light source 66, the high-luminance emission points are arranged in line in the main scanning direction. A conventional fiber light source in which laser light emitted from a single semiconductor laser is input to a single optical fiber is of a low output power, and hence to obtain a desired output power fiber light sources need to be arranged in a number of lines. In contrast, the multiplexing laser light source used in this embodiment is of a high output power, hence laser light sources that are arranged in a small number of lines, for example, even a single line, can produce a desired output power.

Where step-index optical fibers whose clad diameter is 125 μm, core diameter is 50 μm, and NA is 0.2 are used as the multi-mode optical fibers 30, the beam cross-section at the laser light exit section 68 measures 50 μm×150 mm. That is, the illumination area over the substrate 94 measures 50 μm×150 mm. Where the illumination lasts 1 ms, the light density over the substrate 94 is 960 mJ/cm$^2$. If the loss of the optical system is estimated to be about 25%, the light density over the substrate 94 is 720 mJ/cm$^2$. Thus, illumination for a length of 150 mm can be performed in 1 second.

In some cases, the following design values will be employed, considering the connection efficiency to the fibers. The width of the broad stripe of the broad stripe laser may be in the range from 5 μm to 20 μm. The NA of the multi-mode optical fiber may be in the range from 0.15 to 0.3. The fiber core diameter may be in the range from 10 μm to 80 μm.

Figure 40:
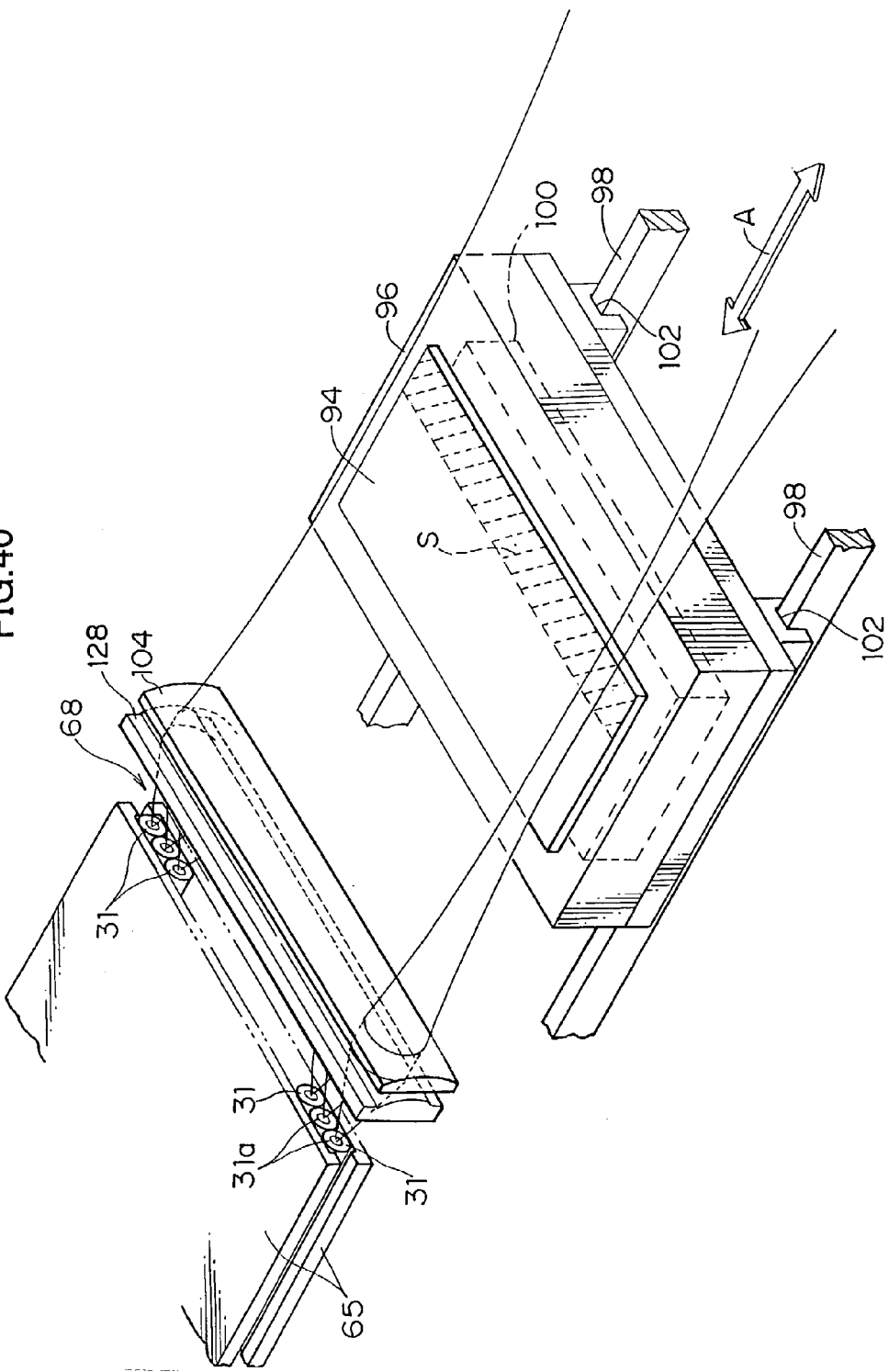
FIG. 40 is a perspective view showing a positional relationship between a line beam and a substrate in the laser thin-film forming apparatus according to the fifth embodiment.
Figure 41:
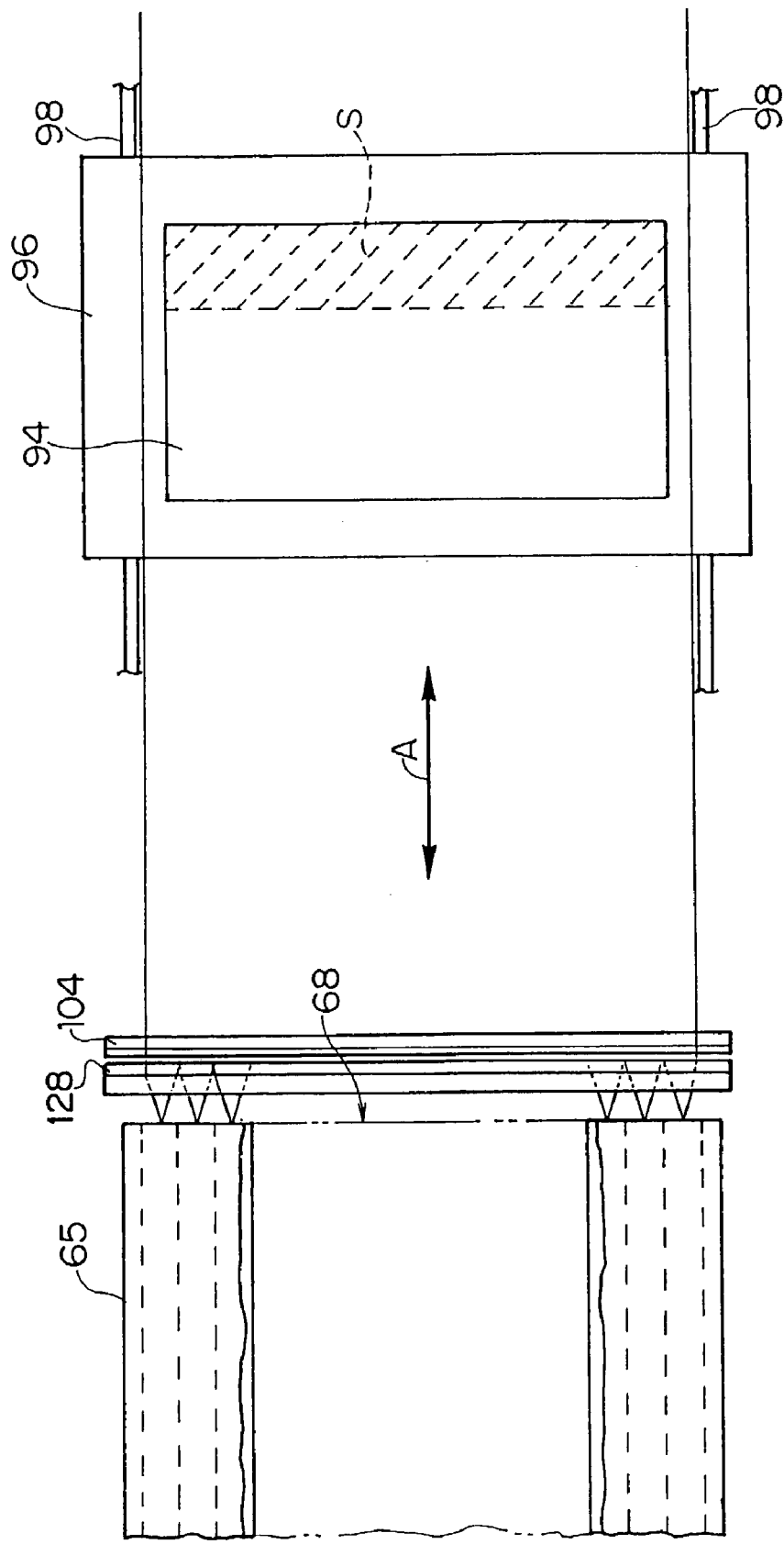
FIG. 41 is a plan view showing a positional relationship between a line beam and a substrate in the laser thin-film forming apparatus according to the fifth embodiment.
Figure 42:
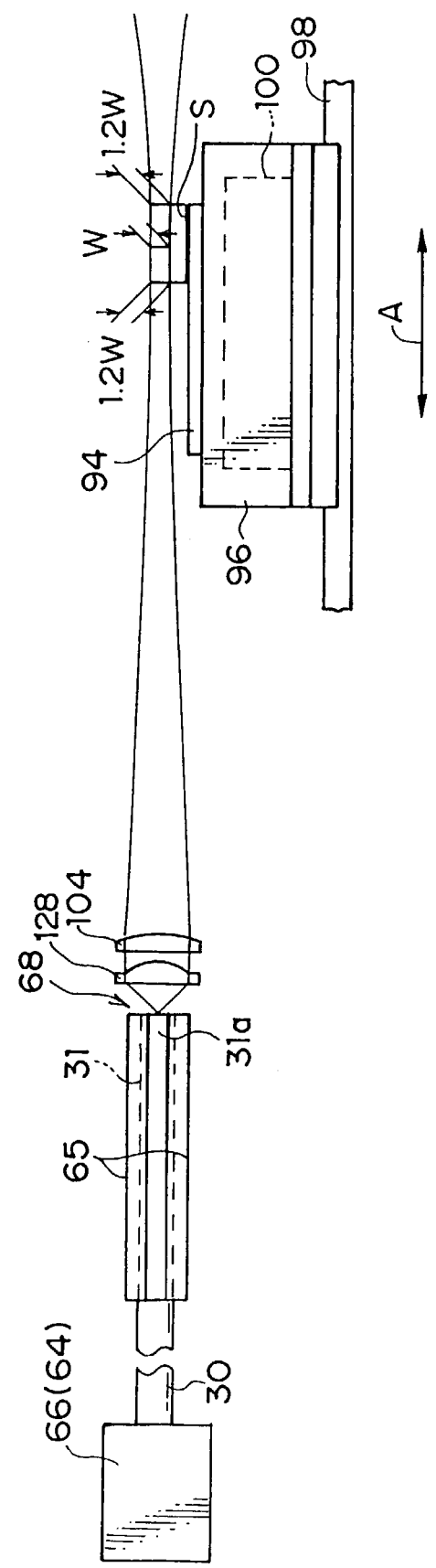
FIG. 42 is a side view showing a positional relationship between a line beam and a substrate in the laser thin-film forming apparatus according to the fifth embodiment.

In the above thin-film forming apparatus, a laser beam emitted from the fiber array light source 66 in line form is collimated by the collimator lens 128 and then focused by the cylindrical lens 104 only in the direction perpendicular to the arrangement direction of the optical fibers 31 to become a line beam. The line beam enters the chamber 72 through the incidence window 74 and, as shown in FIGS. 40-42, gives optical energy to a material gas in a reaction region that extends in the width direction of the substrate 94, is centered by the beam waist area, and has a height of 50 to 60 μm ((the beam waist height (50 μm))×1.2). The reaction region is wide because of a great depth of focus.

The temperature of the substrate 94 is kept at about 300° C. by the heater 100. A 10%-He-diluted silane gas (SiH$_4$) is supplied from the supply passage 80 as a material gas. The silane gas is scattered to over the substrate 94 and decomposed by the optical energy of the laser beam, whereby an insulating thin film S of SiO$_2$ having the same width as the width of the reaction region is deposited on the glass substrate 94 over the width of the substrate 94.

Since the illumination area of the line beam covers the entire width of the substrate 94, it is not necessary to deflect a laser beam for scanning as in the case of using a laser beam emitted from a conventional single light source (see FIG. 45).

To form a film over the entire surface of the substrate 94, the movable stage 96 is moved in the direction of arrow A at a constant speed. An insulating thin film S of SiO$_2$ having a large area is formed progressively from the end of the substrate 94.

The movable stage 96 that is mounted with the substrate 94 is moved in the direction perpendicular to the with direction of the substrate 94. A scanning optical system is not necessary for scanning with a line beam and hence the configuration of the apparatus is simplified.

In this embodiment, a film is deposited on the entire surface by moving the substrate 94. Alternatively, line beam illumination may be performed for the entire surface by deflecting a line beam only in the direction of arrow A.

The material gas that is supplied to the chamber 72 naturally depends on the kind of film to be formed. To form a metal film of Cr, Mo, or W, metal carbonyl Cr(CO)$_6$, Mo(CO)$_6$, or W(CO)$_6$ is used as a material gas. Or Al interconnections can be formed by using Al(CH$_3$)$_3$ as a material gas. As such, this embodiment can be applied to formation of various kinds of films by exploiting its advantages of low-temperature processing and a low degree of damage.

Further, the film thickness can be adjusted by controlling the light intensity of a laser beam. Furthermore, the spatial distribution of optical energy can be controlled by scanning with a laser beam.

Sixth Embodiment

Next, a laser sputtering thin-film forming apparatus according to a sixth embodiment will be described.

Figure 43:
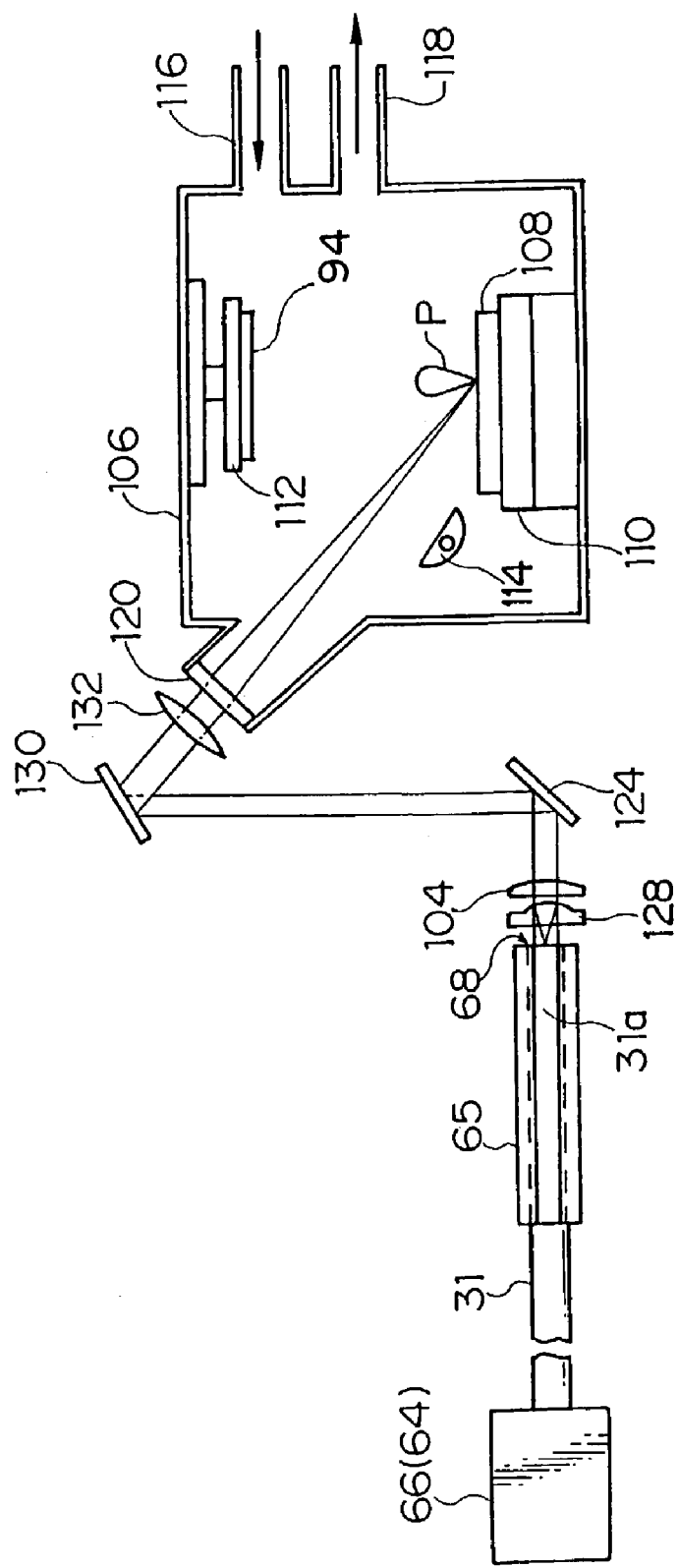
FIG. 43 shows the entire configuration of a laser thin-film forming apparatus according to a sixth embodiment.

As shown in FIG. 43, a target support stage 110 to be mounted with a Si target 108 as a solid material is provided on the bottom of a vacuum tank 106. A holder 112 for holding a substrate 112 hangs down from the ceiling of the vacuum tank 106. The temperature of the substrate 94 is kept at 250° C. by an infrared lamp 114.

A guide pipe 116 for introducing an inert gas such as Ar (argon) is connected to the right side wall of the vacuum tank 106, and an exhaust pipe 118 for discharging an exhaust gas from the vacuum tank 106 is provided under the guide pipe 116. The left side wall of the vacuum tank 106 is formed with an incidence window 120 through which a line beam is input to the vacuum tank 106.

A line beam is reflected by the reflecting mirror 130, is focused by a lens 132, passes through the incidence window 120, and impinges on the Si target 108 to create a plume P (i.e., sputtering particles). In this manner, a high-quality Si film is formed on the surface of the substrate 94 at high speed.

Figure 44:
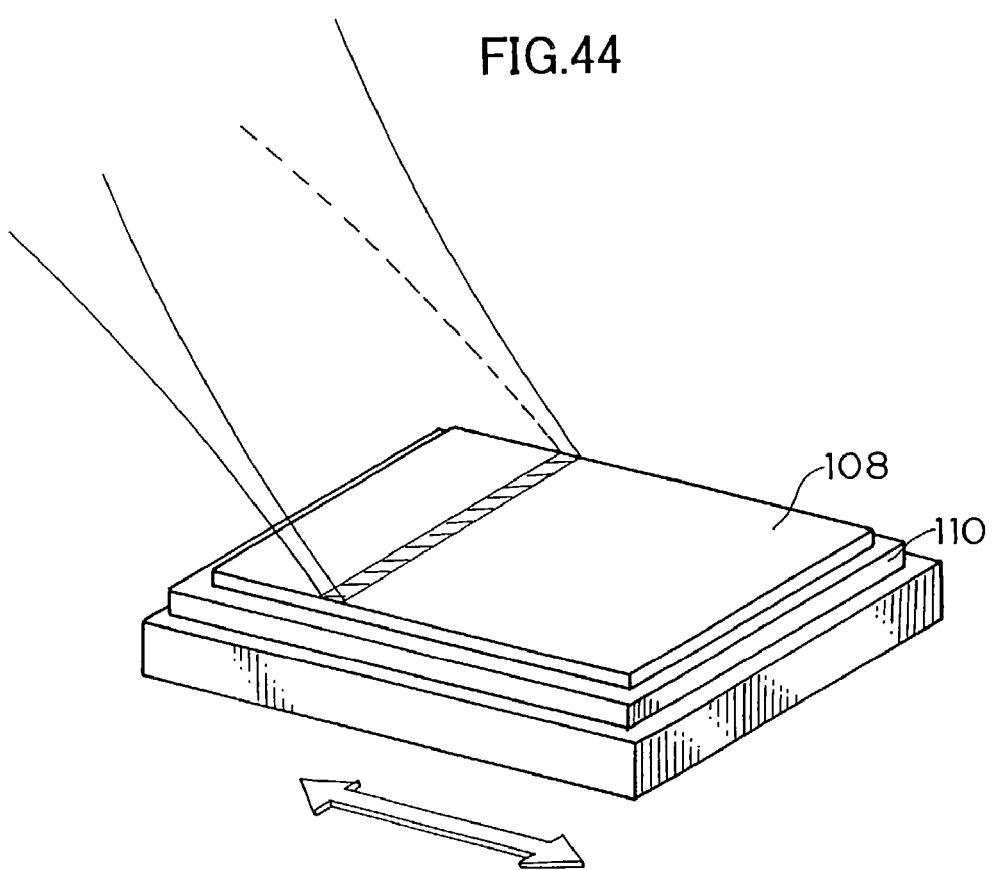
FIG. 44 is a perspective view showing a positional relationship between a line beam and a target in the laser sputtering thin-film forming apparatus according to the sixth embodiment.

As shown in FIG. 44, since a line beam is applied to the Si target 108 so as to cover its entire width, the entire surface of the rectangular Si target 108 can be illuminated with the line beam by moving the target support stage 110 in a direction indicated by an arrow. Therefore, a plume can be created efficiently.

As described above, according to this embodiment, a thin film can be formed uniformly on a rectangular substrate that is opposed to a rectangular target by illuminating the target with a line beam. It is not necessary to deflect light and the optical system is simple hence a thin-film forming apparatus can be realized at a low cost.

Although in the fifth and sixth embodiments the GaN-type semiconductor lasers are used as the semiconductor lasers, group-III-element nitride type semiconductor lasers each having an light-emitting layer containing at least one of Al, Ga, and In may be used.

Using, as the laser source, group-III-element nitride type semiconductor lasers each having an light-emitting layer containing at least one of Al, Ga, and In makes it possible to construct a light source that is lower in cost and longer in life than an ArF excimer laser.

For example, if GaN-type semiconductor lasers that can be driven continuously and superior in output power stability are used as the laser light source, the pulse width and the repetition frequency are made variable and hence the grain diameter of a thin film becomes possible.

Further, the film forming apparatus according to this embodiment is smaller and more reliable, can be maintained more easily, and is higher in energy efficiency than in the case of using an ArF excimer laser. A laser beam having a wavelength of 200 to 450 nm is used. It is not necessary to use an optical system made of a special material hence the cost is low. The repetition frequency is as high as 10 MHz to 1 GHz, the energy storage time is short and the film formation speed is high.

The light sources described below are often used as the laser light source having a plurality of emission points. Among those light sources, the multiplexing laser light source and the fiber array light source and the fiber bundle light source each of which uses a plurality of multiplexing laser light sources are often used. That is, the multiplexing laser light source can attain high luminance and a high film formation speed by increasing the number of laser beams to be multiplexed.

In the laser light source using the exit ends of optical fibers as a laser light exit section, optical fibers are often used whose core diameter is uniform and clad diameter is smaller at the exit end than at the incident end.

In a fiber light source using optical fibers whose clad diameter at the exit end is large, the diameter of the emission points of bundled optical fibers of the laser light exit section becomes large, as a result of which a sufficient depth of focus cannot be obtained. In contrast, where the clad diameter at the exit end is made small, the cores come close to each other and hence the luminance of the light source can be increased. The depth of focus is increased, and the area in which a film can be formed one illumination attempt is increased.

Further, the optical gap of the light-emitting layer can be changed by changing the element mixing ratio, for example, the ratio among X, Y, and Z of $Al_XGa_YIn_Z$.

For example, in the case of GaN whose optical gap is equal to 3.2 to 3.5 eV, the optical gap can be increased to about 6.5 eV by adding Al. The optical gap can be decreased to about 1.9 eV by adding In, in which case the light source accommodates visible range processing. It is noted that the wavelengths of the AlN-type laser and the GaN-type laser are equal to about 200 nm and about 350 nm respectively.

The fifth and sixth embodiments are directed to the case of using the fiber array light source having a plurality of multiplexing laser light sources. The laser source is not limited to the fiber array light source in which multiplexing laser light sources are arrayed. The following light sources (1)–(5) are often used as the laser light source:

(1) A multiplexing laser light source that is equipped with a plurality of semiconductor lasers, a single optical fiber, and a converging optical system for converging laser beams emitted from the respective semiconductor lasers and inputting the converged beams to the incidence end of the optical fiber.

(2) A multiplexing laser light source in which in the multiplexing laser light source of item (1) the semiconductor lasers are multi-cavity lasers each having a plurality of emission points.

(3) A multiplexing laser light source that is equipped with a multi-cavity laser having a plurality of emission points, a single optical fiber, and a converging optical system for converging laser beams emitted from the respective emission points and inputting the converged beams to the incidence end of the optical fiber.

(4) A fiber array light source or a fiber bundle light source that is equipped with a plurality of multiplexing laser light sources as described above and in which the emission points at the exit ends of the optical fibers of the multiplexing laser light sources are arranged in array form or bundle form.

(5) A fiber array light source or a fiber bundle light source that is equipped with a plurality of fiber light sources each of which is composed of a single semiconductor laser, a single optical fiber, and a condensing optical system for condensing a laser beam emitted from the single semiconductor laser and inputting the condensed beam to the incidence end of the optical fiber. The emission points at the exit ends of the optical fibers of the fiber light sources are arranged in array form or bundle form.

Alternative to the light intensity distribution correcting optical systems introduced previously, other optical systems such fly-eye lens or rod integrator type (FIGS. 47A and 47B) can be applied to the present invention.

Among the above light sources, light sources that facilitate increase in output power and luminance, that is, the multiplexing laser light source and the fiber array light source and the fiber bundle light source each of which uses a plurality of multiplexing laser light sources are often used. That is, the multiplexing laser light source can attain high luminance by increasing the number of laser beams to be multiplexed, which makes it possible to improve the crystal characteristics of a polysilicon film and lower its resistivity, which can in turn increase the carrier mobility further. In the fiber array light source and the fiber bundle light source, since the light source is formed by arraying or bundling a plurality of optical fibers, the area that can be laser-illuminated at one time can be increased and hence a thin film can be formed in a large area at high speed. That is, the processing speed can easily be increased further.

As described above, according to the laser thin-film forming apparatuses of the invention, a film can be formed uniformly in a large area and the laser light source is of a low cost and has a long life.

What is claimed is:

1. A laser annealer comprising:
   a laser light source including at least one GaN-type semiconductor laser, the laser light source is configured so as to form a plurality of emission points for emitting laser beams having a wavelength in a range from 350 nm to 450 nm by said at least one GaN-type semiconductor laser; and a scanner for scanning an annealing surface with the laser beams emitted from the laser light source, wherein the laser light source includes one of:
(1) a multiplexing laser light source comprising a plurality of GaN-type semiconductor lasers, a single optical fiber, and a converging optical system for converging laser beams emitted from the respective GaN-type semiconductor lasers and inputting the converged beams to an incidence end of the optical fiber;
(2) a multiplexing laser light source comprising a plurality of GaN-type multi-cavity lasers each having a plurality of emission points, a single optical fiber, and a converging optical system for converging laser beams emitted from the GaN-type multi-cavity lasers and inputting the converged beams to an incidence end of the optical fiber;
(3) a multiplexing laser light source comprising a GaN-type multi-cavity laser having a plurality of emission points, a single optical fiber, and a converging optical system for converging laser beams emitted from the respective emission points and inputting the converged beams to an incidence end of the optical fiber;
(4) one of a fiber array light source and a fiber bundle light source comprising a plurality of multiplexing laser light sources as recited above, wherein emission points at exit ends of the optical fibers of the multiplexing laser light sources are arranged in array form or bundle form; and
(5) one of a fiber array light source and a fiber bundle light source comprising a plurality of fiber light sources each comprising a single GaN-type semiconductor laser, a single optical fiber, and a condensing optical system for condensing a laser beam emitted from the single GaN-type semiconductor laser and inputting the condensed beam to an incidence end of the optical fiber, wherein emission points at exit ends of the optical fibers of the fiber light sources are arranged in array form or bundle form.

2. The laser annealer according to claim 1, wherein the optical fiber or each of the optical fibers is an optical fiber in which a core diameter is uniform and a clad diameter is smaller at an exit end than at an incidence end.

3. The laser annealer according to claim 1, wherein the exit ends of the optical fibers are sealed.

4. A laser annealer comprising:
a laser light source including at least one GaN-type semiconductor laser, the laser light source configured so as to form a plurality of emission points for emitting laser beams having a wavelength in a range from 350 nm to 450 nm by said at least one GaN-type semiconductor laser;
a spatial light modulator for modulating the laser beams emitted from the laser light source, the spatial light modulator being such that a number of pixel portions light modulating states of which are changed in accordance with respective control signals are arranged on a substrate; and
a scanner for scanning an annealing surface with laser beams modulated by the pixel portions,
wherein the laser light source includes one of:
(1) a multiplexing laser light source comprising a plurality of GaN-type semiconductor lasers, a single optical fiber, and a converging optical system for converging laser beams emitted from the respective GaN-type semiconductor lasers and inputting the converged beams to an incidence end of the optical fiber;
(2) a multiplexing laser light source comprising a plurality of GaN-type multi-cavity lasers each having a plurality of emission points, a single optical fiber, and a converging optical system for converging laser beams emitted from the GaN-type multi-cavity lasers and inputting the converged beams to an incidence end of the optical fiber;
(3) a multiplexing laser light source comprising a GaN-type multi-cavity laser having a plurality of emission points, a single optical fiber, and a converging optical system for converging laser beams emitted from the respective emission points and inputting the converged beams to an incidence end of the optical fiber;
(4) one of a fiber array light source and a fiber bundle light source comprising a plurality of multiplexing laser light sources as recited above, wherein emission points at exit ends of the optical fibers of the multiplexing laser light sources are arranged in array form or bundle form; and
(5) one of a fiber array light source and a fiber bundle light source comprising a plurality of fiber light sources each comprising a single GaN-type semiconductor laser, a single optical fiber, and a condensing optical system for condensing a laser beam emitted from the single GaN-type semiconductor laser and inputting the condensed beam to an incidence end of the optical fiber, wherein emission points at exit ends of the optical fibers of the fiber light sources are arranged in array form or bundle form.

5. The laser annealer according to claim 4, further comprising between the laser light source and the spatial light modulator:
a collimator lens for collimating a light flux emitted from the laser light source; and
a light intensity distribution correcting optical system for correcting the collimated light flux so that its light intensity distribution becomes approximately uniform on an illumination surface of the spatial light modulator by changing light flux widths at respective exit positions so that a ratio of a light flux width of a peripheral portion to that of a central portion that is close to an optical axis is smaller on an exit side than on an incidence side.

6. The laser annealer according to claim 4, wherein the exit ends of the optical fibers are sealed.

7. The laser annealer according to claim 4, wherein the optical fiber or each of the optical fibers is an optical fiber in which a core diameter is uniform and a clad diameter is smaller at an exit end than at an incidence end.

8. The laser annealer according to claim 4, further comprising between the laser light source and the spatial light modulator:
a collimator lens for collimating a light flux emitted from the laser light source; and
a light intensity distribution correcting optical system for correcting the collimated light flux so that its light intensity distribution becomes approximately uniform on an illumination surface of the spatial light modulator by changing light flux widths at respective exit positions so that a ratio of a light flux width of a peripheral portion to that of a central portion that is close to an optical axis is smaller on an exit side than on an incidence side.

9. The laser annealer according to claim 4, further comprising a controller for controlling pixel portions that are smaller in number than all the pixel portions arranged on the substrate using respective control signals that are generated on the basis of annealing information.

10. The laser annealer according to claim 6, wherein the spatial light modulator is a micromirror device in which a plurality of micromirrors having respective reflecting surfaces angles of which can be changed in accordance with respective control signals are arranged two-dimensionally on a substrate.

11. The laser annealer according to claim 6, further comprising between the laser light source and the spatial light modulator:
  a collimator lens for collimating a light flux emitted from the laser light source; and
  a light intensity distribution correcting optical system for correcting the collimated light flux so that its light intensity distribution becomes approximately uniform on an illumination surface of the spatial light modulator by changing light flux widths at respective exit positions so that a ratio of a light flux width of a peripheral portion to that of a central portion that is close to an optical axis is smaller on an exit side than on an incidence side.

12. The laser annealer according to claim 7, further comprising a controller for controlling pixel portions that are smaller in number than all the pixel portions arranged on the substrate using respective control signals that are generated on the basis of annealing information.

13. A laser annealer comprising:
  a laser light source including at least one GaN-type semiconductor laser, the laser light source is configured so as to form a plurality of emission points for emitting laser beams having a wavelength in a range from 350 nm to 450 nm by said at least one GaN-type semiconductor laser; and
  a scanner for scanning an annealing surface with the laser beams emitted from the laser light source, wherein the laser light source includes one of:
  (1) a multiplexing laser light source comprising a plurality of GaN-type semiconductor lasers, an optical fiber, and a converging optical system for converging laser beams emitted from the respective GaN-type semiconductor lasers and inputting the converged beams to an incidence end of the optical fiber;
  (2) a multiplexing laser light source comprising a plurality of GaN-type multi-cavity lasers each having a plurality of emission points, an optical fiber, and a converging optical system for converging laser beams emitted from the GaN-type multi-cavity lasers and inputting the converged beams to an incidence end of the optical fiber; and
  (3) a multiplexing laser light source comprising a GaN-type multi-cavity laser having a plurality of emission points, an optical fiber, and a converging optical system for converging laser beams emitted from the respective emission points and inputting the converged beams to an incidence end of the optical fiber.

14. A laser annealer comprising:
  a laser light source including at least one GaN-type semiconductor laser, the laser light source configured so as to form a plurality of emission points for emitting laser beams having a wavelength in a range from 350 nm to 450 nm by said at least one GaN-type semiconductor laser;
  a spatial light modulator for modulating the laser beams emitted from the laser light source, the spatial light modulator being such that a number of pixel portions light modulating states of which are changed in accordance with respective control signals are arranged on a substrate; and
  a scanner for scanning an annealing surface with laser beams modulated by the pixel portions,
  wherein the laser light source includes one of:
  (1) a multiplexing laser light source comprising a plurality of GaN-type semiconductor lasers, an optical fiber, and a converging optical system for converging laser beams emitted from the respective GaN-type semiconductor lasers and inputting the converged beams to an incidence end of the optical fiber;
  (2) a multiplexing laser light source comprising a plurality of GaN-type multi-cavity lasers each having a plurality of emission points, an optical fiber, and a converging optical system for converging laser beams emitted from the GaN-type multi-cavity lasers and inputting the converged beams to an incidence end of the optical fiber; and
  (3) a multiplexing laser light source comprising a GaN-type multi-cavity laser having a plurality of emission points, an optical fiber, and a converging optical system for converging laser beams emitted from the respective emission points and inputting the converged beams to an incidence end of the optical fiber.

* * * * *